(12) United States Patent
Yamazaki et al.

(10) Patent No.: US 9,911,756 B2
(45) Date of Patent: Mar. 6, 2018

(54) SEMICONDUCTOR DEVICE INCLUDING TRANSISTOR AND ELECTRONIC DEVICE SURROUNDED BY LAYER HAVING ASSIGNED BAND GAP TO PREVENT ELECTROSTATIC DISCHARGE DAMAGE

(71) Applicant: Semiconductor Energy Laboratory Co., Ltd., Atsugi-shi, Kanagawa-ken (JP)

(72) Inventors: Shunpei Yamazaki, Tokyo (JP); Kiyoshi Kato, Kanagawa (JP); Yuto Yakubo, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/245,310

(22) Filed: Aug. 24, 2016

(65) Prior Publication Data
US 2017/0062482 A1  Mar. 2, 2017

(30) Foreign Application Priority Data

Aug. 31, 2015 (JP) .................................. 2015-171051
Nov. 2, 2015 (JP) .................................. 2015-215828

(51) Int. Cl.
*H01L 27/12* (2006.01)
*H01L 23/544* (2006.01)
(Continued)

(52) U.S. Cl.
CPC ........ *H01L 27/1225* (2013.01); *H01L 23/544* (2013.01); *H01L 27/1259* (2013.01);
(Continued)

(58) Field of Classification Search
CPC ............. H01L 27/1225; H01L 27/1259; H01L 29/66969; H01L 29/7869
See application file for complete search history.

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Thanh V Pham
(74) *Attorney, Agent, or Firm* — Fish & Richardson P.C.

(57) ABSTRACT

To provide a semiconductor device that is not easily damaged by ESD in a manufacturing process thereof. A layer whose band gap is greater than or equal to 2.5 eV and less than or equal to 4.2 eV, preferably greater than or equal to 2.7 eV and less than or equal to 3.5 eV is provided to overlap with a dicing line. A layer whose band gap is greater than or equal to 2.5 eV and less than or equal to 4.2 eV, preferably greater than or equal to 2.7 eV and less than or equal to 3.5 eV is provided around the semiconductor device such as a transistor. The layer may be in a floating state or may be supplied with a specific potential.

15 Claims, 39 Drawing Sheets

(51) Int. Cl.
*H01L 29/786* (2006.01)
*H01L 29/66* (2006.01)

(52) U.S. Cl.
CPC .... *H01L 29/66969* (2013.01); *H01L 29/7869* (2013.01); *H01L 2223/54453* (2013.01)

(56) References Cited

U.S. PATENT DOCUMENTS

| | | |
|---|---|---|
| 6,294,274 B1 | 9/2001 | Kawazoe et al. |
| 6,320,241 B1 | 11/2001 | Okamoto |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,368,145 B2 | 2/2013 | Fukuoka et al. |
| 8,368,209 B2 | 2/2013 | Tsuji et al. |
| 8,552,498 B2 | 10/2013 | Eguchi et al. |
| 8,941,958 B2 | 1/2015 | Tomatsu |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-058762 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

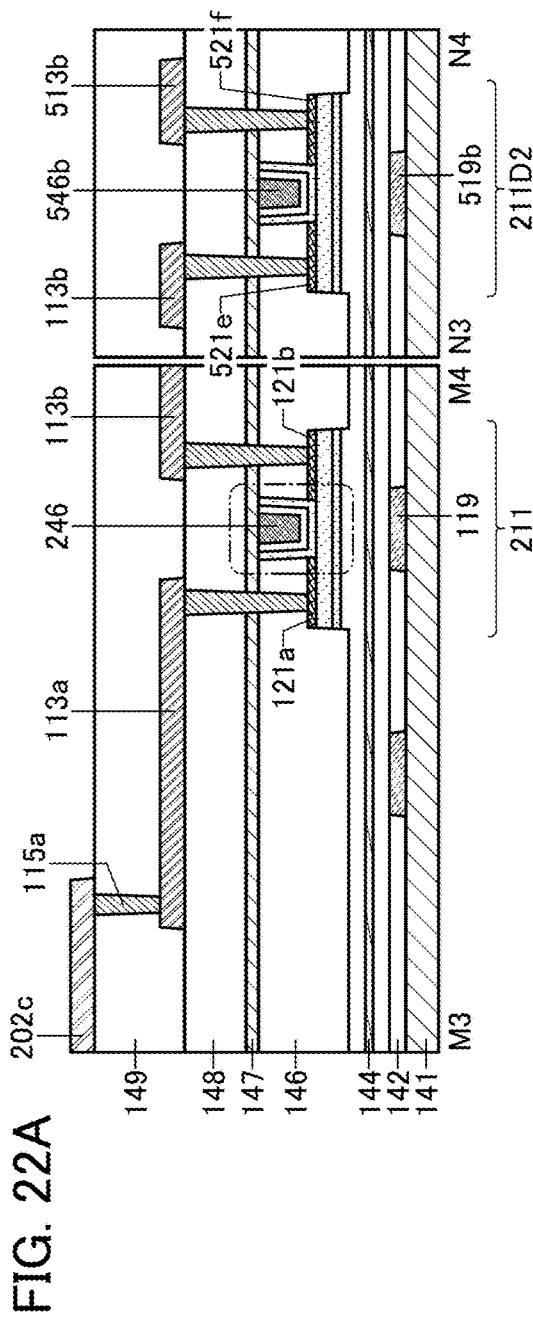
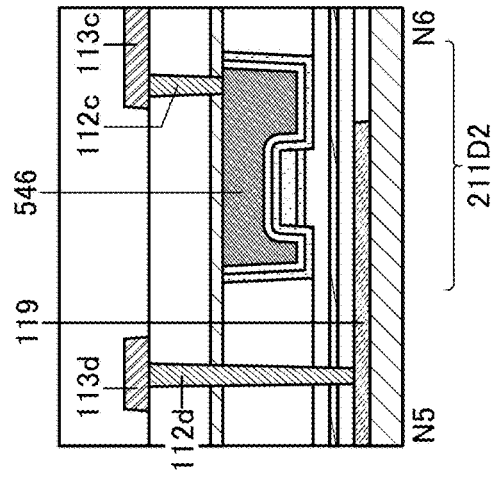
FIG. 22A
FIG. 22B

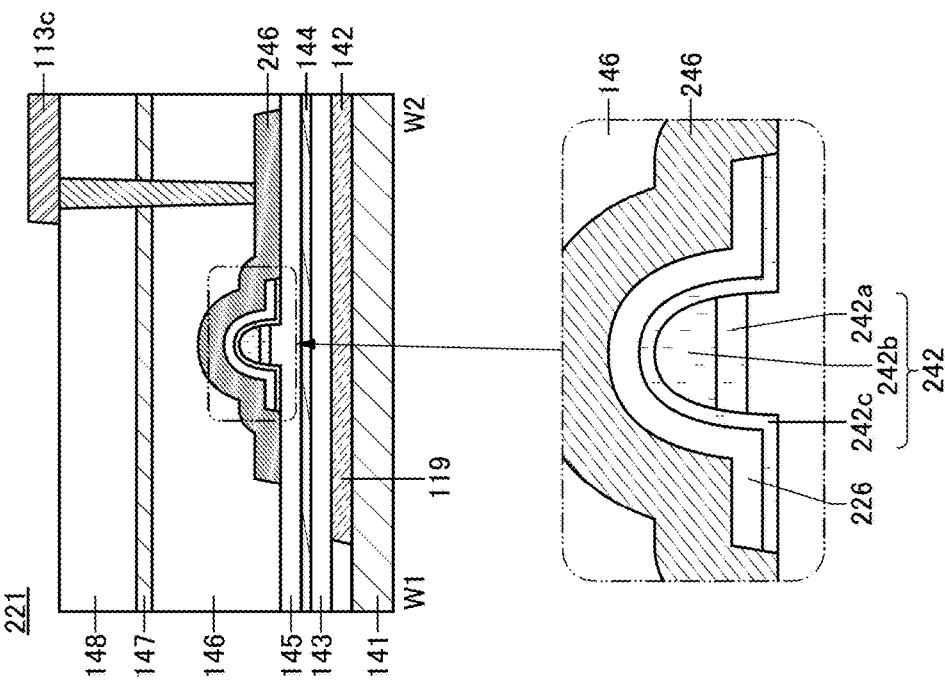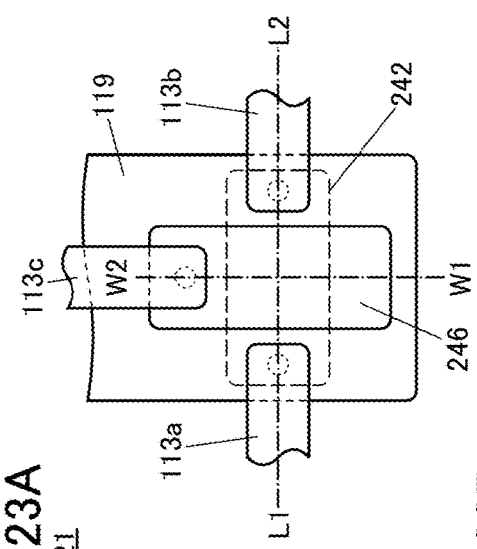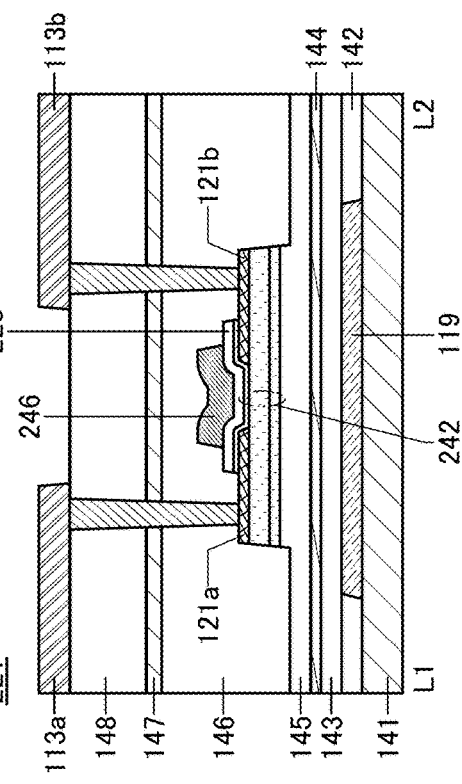

231

231

231

SEMICONDUCTOR DEVICE INCLUDING TRANSISTOR AND ELECTRONIC DEVICE SURROUNDED BY LAYER HAVING ASSIGNED BAND GAP TO PREVENT ELECTROSTATIC DISCHARGE DAMAGE

BACKGROUND OF THE INVENTION

1. Field of the Invention

One embodiment of the invention disclosed in this specification and the like relates to an object, a method, or a manufacturing method. One embodiment of the invention disclosed in this specification and the like also relates to a process, a machine, manufacture, or a composition of matter. In particular, one embodiment of the invention disclosed in this specification and the like relates to a semiconductor device or an electronic device including a semiconductor device.

In this specification and the like, the term "semiconductor device" denotes a device that can function by utilizing semiconductor characteristics. For example, a transistor is included in the category of semiconductor devices. A display device (e.g., a liquid crystal display device and a light-emitting display device), a lighting device, an electro-optical device, a power storage device, a memory device, a semiconductor circuit, an imaging device, an electronic device, and the like may include a semiconductor device.

2. Description of the Related Art

A semiconductor element, an electrode, an insulating layer, or the like might be damaged or broken ("electrostatic breakdown" could occur) by electrostatic discharge (ESD). Electrostatic breakdown is known as a critical problem that reduces reliability and productivity of semiconductor devices from the time of a manufacturing process and inspection of the semiconductor devices to the time of using them as products.

For example, Patent Document 1 discloses a technique in which a protective circuit including a resistor and a diode is connected between a semiconductor circuit and a connection terminal in order to smooth a surge current generated due to ESD and secure a discharge path of the surge current, whereby the inflow of the surge current into the semiconductor circuit is prevented.

REFERENCE

Patent Document

[Patent Document 1] Japanese Published Patent Application No. 2000-58762

SUMMARY OF THE INVENTION

However, in the case where the method described in Patent Document 1 is employed, it is difficult to prevent damage due to ESD that might be caused in a manufacturing process of a semiconductor device. Charge is easily accumulated in a wiring, an electrode, and the like when they are in a floating state (electrically isolated state) and exposed to a plasma atmosphere in a manufacturing process of the semiconductor device. Accumulated charge might cause ESD, damaging a semiconductor element, an electrode, an insulating layer, or the like.

Furthermore, in a dicing step for cutting a substrate provided with a semiconductor device into chips, the semiconductor device might be damaged by ESD.

An object of one embodiment of the present invention is to provide a semiconductor device that is not easily damaged by ESD in a manufacturing process thereof. Another object is to provide a semiconductor device or the like with high productivity. Another object is to provide a semiconductor device or the like with low power consumption. Another object is to provide a highly reliable semiconductor device or the like. Another object is to provide a novel semiconductor device or the like.

Note that the descriptions of these objects do not disturb the existence of other objects. One embodiment of the present invention does not have to achieve all the objects. Other objects will be apparent from and can be derived from the description of the specification, the drawings, the claims, and the like.

A layer whose band gap is greater than or equal to 2.5 eV and less than or equal to 4.2 eV, preferably greater than or equal to 2.7 eV and less than or equal to 3.5 eV is provided to overlap with a separation line (also referred to as a "dicing line"). A layer whose band gap is greater than or equal to 2.5 eV and less than or equal to 4.2 eV, preferably greater than or equal to 2.7 eV and less than or equal to 3.5 eV is provided around a semiconductor device such as a transistor.

One embodiment of the present invention is a semiconductor device including a circuit region and a first layer. The circuit region is surrounded by the first layer. The band gap of the first layer is greater than or equal to 2.5 eV and less than or equal to 4.2 eV.

The first layer preferably comprises an oxide semiconductor. The circuit region includes a first transistor and a second transistor. The first layer may be formed through the same process as a semiconductor layer of the first transistor. Thus, the first layer and the semiconductor layer of the first transistor are located in contact with the same layer in some cases. The band gap of the semiconductor layer of the first transistor may be different from the band gap of a semiconductor layer of the second transistor.

A semiconductor device that is not easily damaged by ESD in a manufacturing process thereof can be provided. Alternatively, a semiconductor device or the like with high productivity can be provided. Alternatively, a semiconductor device or the like with low power consumption can be provided. Alternatively, a semiconductor device or the like with high reliability can be provided. Alternatively, a novel semiconductor device or the like can be provided.

Note that the descriptions of these effects do not disturb the existence of other effects. One embodiment of the present invention does not have to have all the effects listed above. Other effects will be apparent from and can be derived from the descriptions of the specification, the drawings, the claims, and the like.

BRIEF DESCRIPTION OF THE DRAWINGS

FIGS. 22A and 22B are cross-sectional views of a semiconductor device of one embodiment of the present invention.

FIGS. 23A to 23C illustrate a semiconductor device of one embodiment of the present invention.

DETAILED DESCRIPTION OF THE INVENTION

Figure 1A:
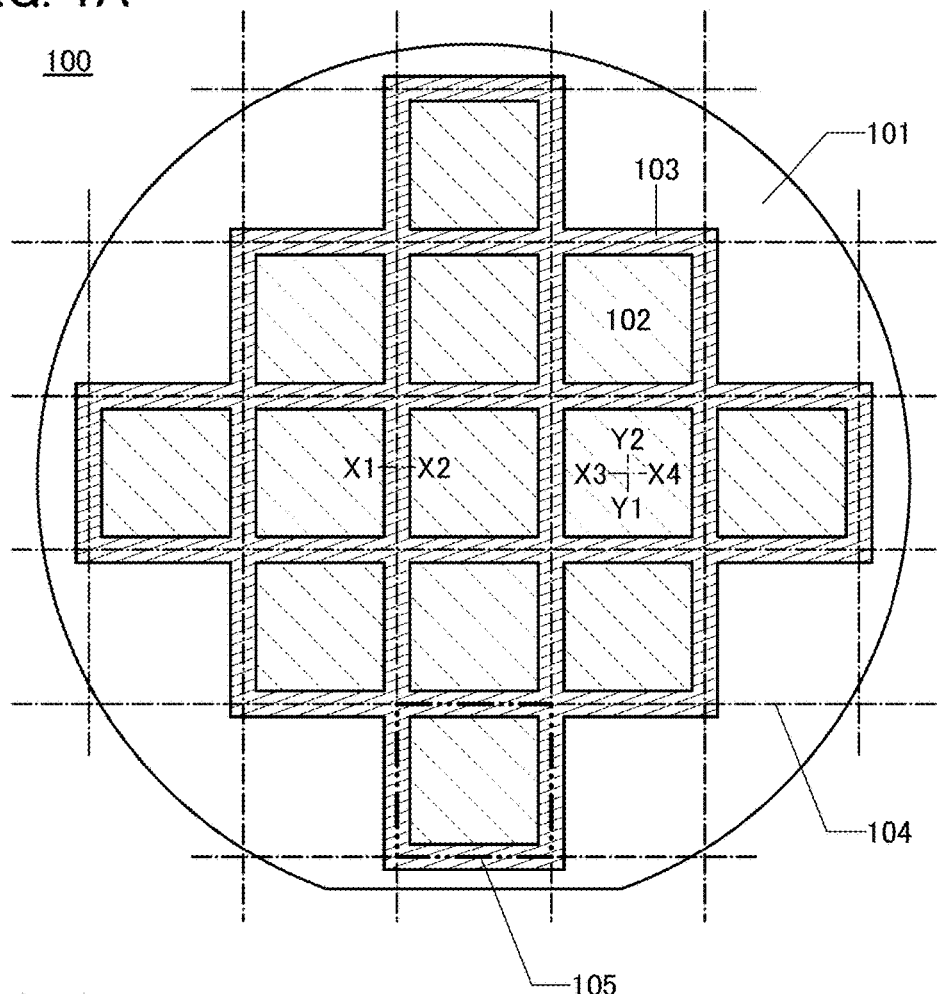
FIGS. 1A and 1B are top views of a semiconductor wafer of one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like.

In the drawings, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in the top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (also referred to as an "effective channel width") is sometimes different from a channel width shown in a top view of a transistor (also referred to as an "apparent channel width"). For example, in a transistor having a gate electrode covering side surfaces of a semiconductor layer, an effective channel width is greater than an apparent channel width, and its influence cannot be ignored in some cases. For example, in a miniaturized transistor having a gate electrode covering a side surface of a semiconductor, the proportion of a channel region formed in the side surface of the semiconductor may be increased. In that case, an effective channel width obtained when a channel is actually formed is greater than an apparent channel width shown in the top view.

In such a case, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Thus, in this specification, an apparent channel width is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

Furthermore, unless otherwise specified, transistors described in this specification and the like are enhancement-type (normally-off) field effect transistors.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes the characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In the specification and the like, the terms "identical", "the same", "equal", "uniform", and the like (including synonyms thereof) used in describing calculation values and actual measurement values allow for a margin of error of ±20% unless otherwise specified.

In this specification and the like, a high power supply potential $V_{DD}$ (hereinafter also simply referred to as $V_{DD}$ or H potential) is a power supply potential higher than a low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground (GND) potential (also referred to as "GND") can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

A voltage usually refers to a potential difference between a given potential and a reference potential (e.g., a ground potential or a source potential). Note that a "potential" is a relative concept, and a potential supplied to wirings or the like may be changed depending on a reference potential. Therefore, the terms "voltage" and "potential" can be used interchangeably in some cases. Note that in this specification and the like, $V_{SS}$ is the reference voltage unless otherwise specified.

Note that the terms "film" and "layer" can be used interchangeably depending on the case or the circumstances. For example, the term "conductive layer" can be changed into the term "conductive film" in some cases. Also, the term "insulating film" can be changed into the term "insulating layer" in some cases.

In this specification, trigonal and rhombohedral crystal systems are included in a hexagonal crystal system.

In the circuit diagrams and the like, "OS" is given beside the circuit symbol of a transistor that preferably uses an oxide semiconductor.

Embodiment 1

<Structural Example of Semiconductor Wafer 100>

A semiconductor wafer 100 of one embodiment of the present invention includes a substrate 101, circuit regions 102, and a guard layer 103. FIG. 1A is a top view illustrating the semiconductor wafer 100 just before dicing treatment.

Figure 1B:
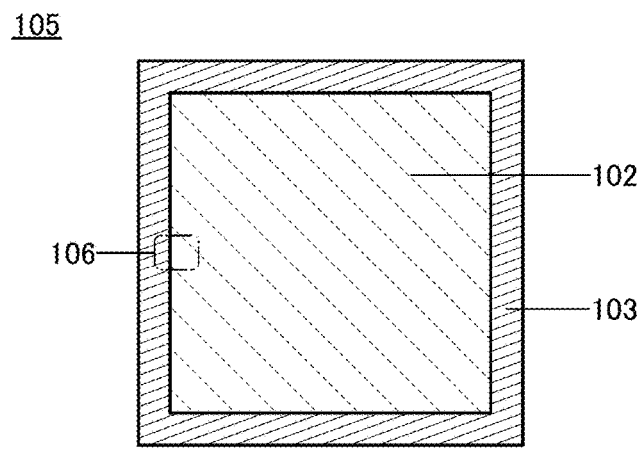

Specifically, the circuit regions 102 are provided on the substrate 101. Semiconductor devices such as a transistor and a diode are provided in each of the circuit regions 102. The substrate 101 can be cut along separation lines (also referred to as "dicing lines") 104 into chips 105 including the circuit regions 102. FIG. 1B is an enlarged view of the chip 105.

The guard layer 103 is provided along the perimeters of the circuit regions 102. The guard layer 103 partly overlaps with the separation lines 104. The guard layer 103 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing the guard layer 103 allows a reduction in the usage of the pure water. Therefore, the cost of manufacturing semiconductor devices can be reduced. Thus, semiconductor devices can be manufactured with improved productivity.

For the guard layer 103, a conductive material such as metal may be used, and a material having a band gap greater than or equal to 2.5 eV and less than or equal to 4.2 eV, preferably greater than or equal to 2.7 eV and less than or equal to 3.5 eV is preferably used. The use of such a material allows accumulated charge to be released slowly; thus, the rapid move of charge due to ESD can be suppressed and electrostatic breakdown is less likely to occur. An example of such a material is an oxide semiconductor.

For example, in the case where a transistor using an oxide semiconductor in a semiconductor layer in which a channel is formed (also referred to as "OS transistor") is used, the guard layer 103 can be provided in the same step as a step for forming the semiconductor layer of the OS transistor.

Figure 2:
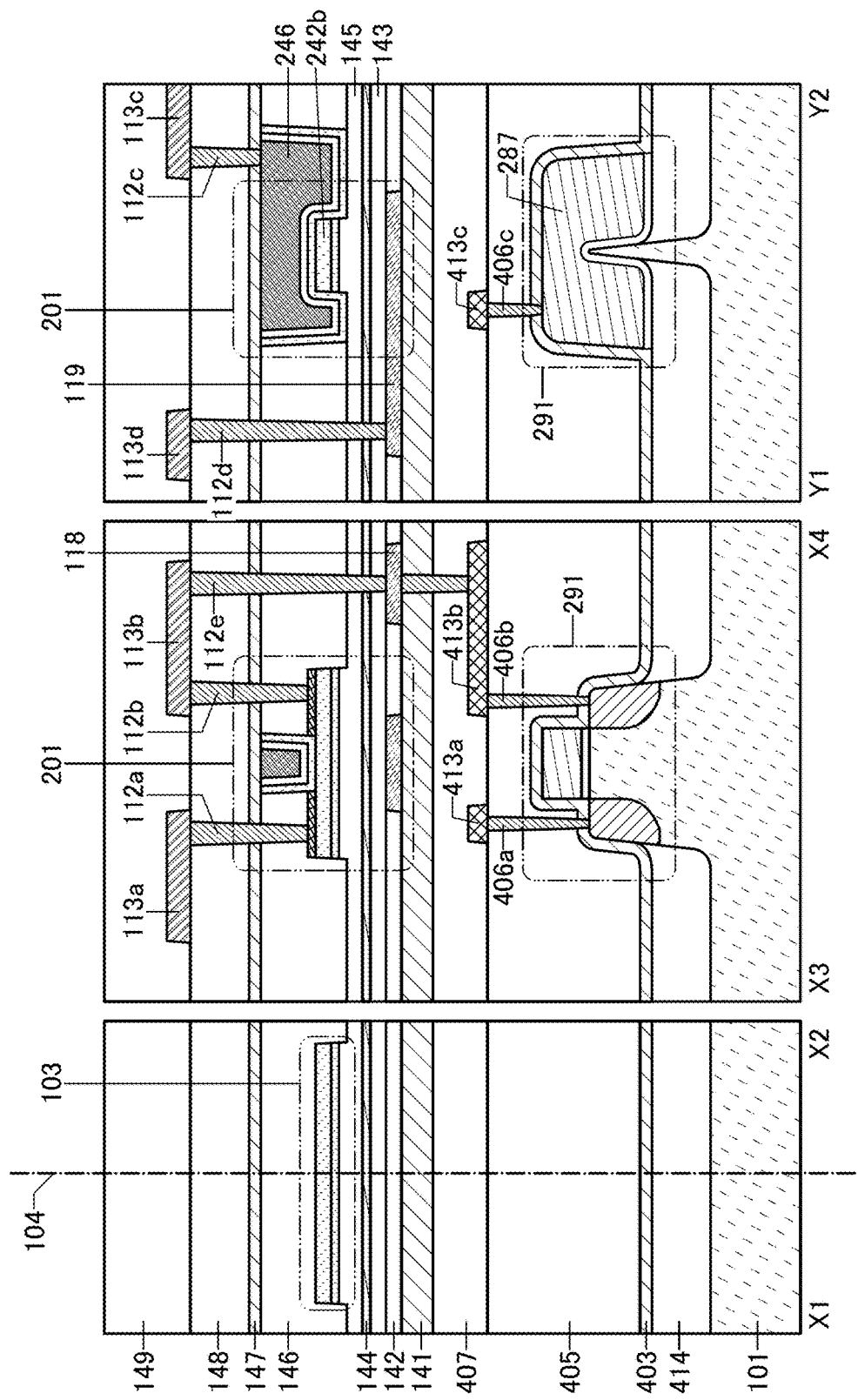
FIG. 2 is a cross-sectional view of a semiconductor wafer of one embodiment of the present invention.

FIG. 2 is a cross-sectional view along the dashed-dotted lines X1-X2, X3-X4, and Y1-Y2 in FIG. 1A. The cross-sectional view along X1-X2 illustrates a region including the guard layer 103. The cross-sectional view along X3-X4 illustrates a transistor 201 and a transistor 291 in the channel length direction provided in the circuit region 102. The cross-sectional view along Y1-Y2 illustrates the transistor 201 and the transistor 291 in the channel width direction provided in the circuit region 102. In the circuit region 102 illustrated in this embodiment, the transistor 201 is provided over the transistor 291.

Figure 3A:
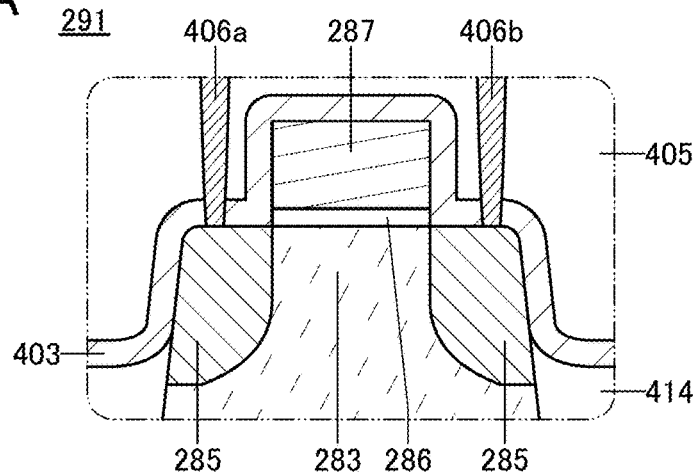
FIGS. 3A to 3C are cross-sectional views of a semiconductor device of one embodiment of the present invention.
Figure 3B:
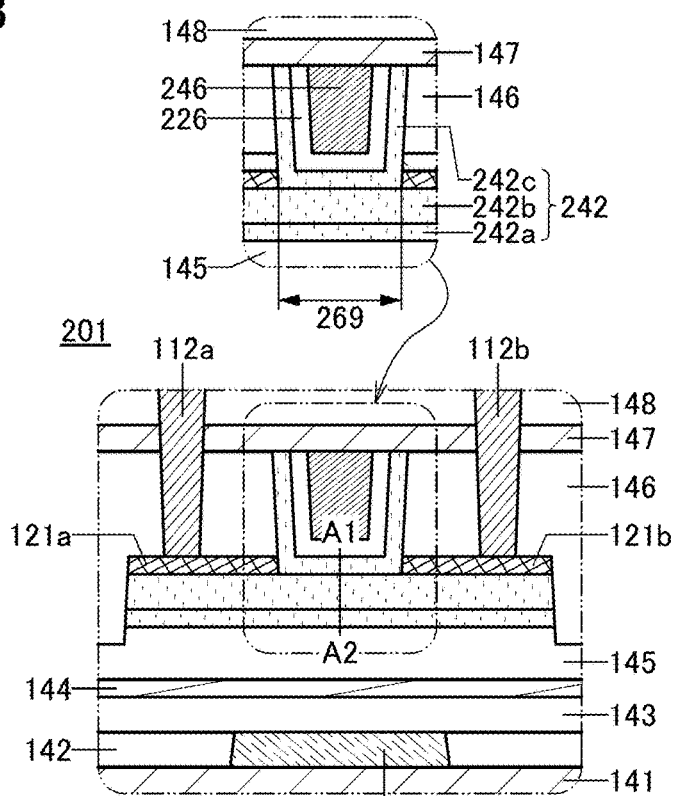
Figure 3C:
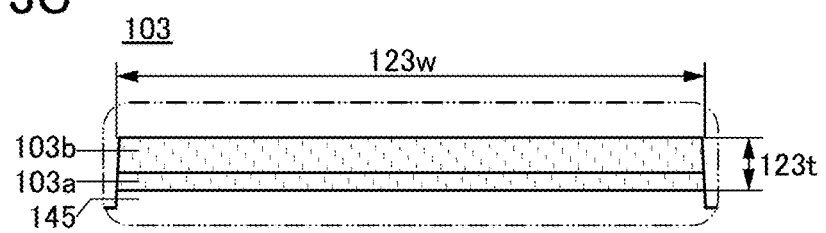

FIG. 3A is an enlarged view of the transistor 291 illustrated in FIG. 2. FIG. 3B is an enlarged view of the transistor 201 illustrated in FIG. 2. FIG. 3C is an enlarged view of the guard layer 103 illustrated in FIG. 2.

Although an n-type single crystal semiconductor substrate is used as the substrate 101 in this embodiment, a material that can be used as the substrate 101 is not limited thereto. For example, a single crystal semiconductor substrate or a polycrystalline semiconductor substrate made of silicon or the like or a compound semiconductor substrate made of silicon germanium or the like may be used as the substrate 101. Alternatively, an SOI substrate or the like may be used. Alternatively, gallium arsenide, aluminum gallium arsenide, indium gallium arsenide, gallium nitride, indium phosphide, silicon germanium, or the like, which can be used for a high-electron-mobility transistor (HEMT), may be used.

Note that a flexible substrate may be used as the substrate 101. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and an acrylic-based resin. In particular, aramid is preferably used for the flexible substrate because of its low coefficient of linear expansion.

Although the semiconductor device including a combination of the transistor 291, in which a channel is formed in part of the substrate 101, and the transistor 201, which is an OS transistor, is described as an example in this embodiment, one embodiment of the present invention is not limited to this example.

[Transistor 291]

The transistor 291 includes a channel formation region 283, high-concentration p-type impurity regions 285, an insulating layer 286, and an electrode 287. The insulating layer 286 can function as a gate insulating layer. The electrode 287 can function as a gate electrode.

The transistor 291 is electrically isolated from other transistors by an element isolation layer 414. The element isolation layer can be formed by a local oxidation of silicon (LOCOS) method, a shallow trench isolation (STI) method, or the like.

The transistor 291 can function as a p-channel transistor. An insulating layer 403 is formed over the transistor 291.

The insulating layer 403 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

Note that the insulating layer 403 is preferably formed using an insulating material that has a function of preventing diffusion of impurities. An example of an insulating material through which impurities do not easily pass is a single layer or a stack using an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities do not easily pass is used for the insulating layer 403, impurity diffusion from the substrate 101 side can be suppressed, and the reliability of the semiconductor device can be improved. There is no particular limitation on a formation method of the insulating layer 403, and any of a variety of formation methods such as an evaporation method, a CVD method, a sputtering method, a spin coating method, and an ALD method can be employed.

The insulating layer 286 may be formed using a material and a method that are similar to those for the insulating layer 403. Alternatively, a layer formed by oxidizing the surface of a sample by a thermal oxidation method may be used as the insulating layer 286.

Furthermore, an insulating layer 405 having a flat surface is provided over the insulating layer 403. The insulating layer 405 can be formed using a material and a method which are similar to those for the insulating layer 403. The surface of the insulating layer 405 may be subjected to chemical mechanical polishing (CMP) treatment (hereinafter also referred to as "CMP treatment"). By the CMP treatment, unevenness of the sample surface can be reduced, and coverage with an insulating layer or a conductive layer formed later can be increased.

A heat-resistant organic material such as polyimide, an acrylic-based resin, a benzocyclobutene-based resin, polyamide, or an epoxy-based resin may be used to form the insulating layer 405. Other than the above organic materials, a low-dielectric constant material (low-k material), a siloxane-based resin, phosphosilicate glass (PSG), borophosphosilicate glass (BPSG), or the like can be used. Note that the insulating layer 405 may be formed by stacking a plurality of insulating layers formed using any of these materials.

Note that the siloxane-based resin corresponds to a resin including an Si—O—Si bond formed using a siloxane-based material as a starting material. The siloxane-based resin may contain as a substituent an organic group (e.g., an alkyl group or an aryl group) or a fluoro group. The organic group may contain a fluoro group.

There is no particular limitation on the method for forming the insulating layer 405, and any of the following methods which depend on a material thereof can be used: a sputtering method; an SOG method; spin coating; dipping; spray coating; a droplet discharging method (e.g., an ink-jet method); a printing method (e.g., screen printing, or offset printing); or the like. When the baking step of the insulating layer 405 also serves as heat treatment for another layer, the transistor can be manufactured efficiently.

An electrode 413a, an electrode 413b, and an electrode 413c are formed over the insulating layer 405. The electrode 413a, the electrode 413b, and the electrode 413c can be formed using a material and a method which are similar to those for the electrode 287.

As a conductive material for forming the electrodes 287, 413a, 413b, and 413c, a material containing one or more metal elements selected from aluminum, chromium, iron, copper, silver, gold, platinum, tantalum, nickel, cobalt, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or a silicide such as nickel silicide may be used. A plurality of stacked conductive layers formed with any of these materials may be used as each of the electrodes 287, 413a, 413b, and 413c.

The electrodes 287, 413a, 413b, and 413c may be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added, or a conductive material containing nitrogen, such as titanium nitride or tantalum nitride. It is also possible to use a layered structure formed using a material containing the above metal element and the above conductive material containing oxygen. It is also possible to use a layered structure formed using a material containing the above metal element and the above conductive material containing nitrogen. It is also possible to use a layered structure formed using a material containing the above metal element, the above conductive material containing oxygen, and the above conductive material containing nitrogen.

There is no particular limitation on a formation method of the conductive layer, and any of a variety of formation methods such as an evaporation method, a CVD method, a sputtering method, a spin coating method, and an ALD method can be employed.

The electrode 413a is electrically connected to one of the high-concentration p-type impurity regions 285 through a contact plug 406a. The electrode 413b is electrically connected to the other of the high-concentration p-type impurity regions 285 through a contact plug 406b. The electrode 413c is electrically connected to the electrode 287 through a contact plug 406c. The contact plug 406a, the contact plug 406b, and the contact plug 406c are provided in openings formed by removing parts of the insulating layers 405 and 403.

For the contact plugs 406a to 406c, a conductive material with high embeddability such as tungsten or polysilicon can be used. Although not illustrated, a side surface and a bottom surface of the material may be covered with a barrier layer (a diffusion prevention layer) of a titanium layer, a titanium nitride layer, or a stack of these layers. In this case, the barrier layer may be regarded as part of the contact plug.

An insulating layer 407 is formed over the electrodes 413a, 413b, and 413c. The insulating layer 407 can be formed using a material and a method that are similar to those for the insulating layer 405. The insulating layer 407 may be subjected to CMP treatment.

The insulating layer 141 is formed over the insulating layer 407. The insulating layer 141 can be formed using a material and a method that are similar to those for the insulating layer 403. Furthermore, the insulating layer 141 is preferably formed using an insulating material through which impurities do not easily pass. The use of an insulating material through which impurities do not easily pass for the insulating layer 141 enables inhibition of impurity diffusion from the insulating layer 407 side to the transistor 201 side and impurity diffusion from the insulating layer 142 side to the transistor 291 side. Accordingly, the reliability of the semiconductor device can be improved.

[Transistor 201]

The transistor 201 includes a semiconductor layer 242 (a semiconductor layer 242a, a semiconductor layer 242b, and a semiconductor layer 242c), an insulating layer 226, an electrode 246, an electrode 119, an electrode 121a, and an electrode 121b. The insulating layer 226 can function as a gate insulating layer. The electrode 246 can function as a gate electrode. The electrode 119 can function as a back gate electrode. The electrode 121a can function as one of a source electrode and a drain electrode. The electrode 121b can function as the other of the source electrode and the drain electrode.

In general, the back gate electrode is formed using a conductive layer and positioned so that the channel formation region of the semiconductor layer is sandwiched between the gate electrode and the back gate electrode. Thus, the back gate electrode can function in a manner similar to that of the gate electrode. The potential of the back gate electrode may be equal to that of the gate electrode or may be a ground potential (GND potential) or a predetermined potential. By changing the potential of the back gate electrode independently of the potential of the gate electrode, the threshold voltage of the transistor can be changed.

The electrode 246 and the electrode 119 can each function as a gate electrode. Thus, the insulating layer 226, the insulating layer 145, the insulating layer 144, and the insulating layer 143 can each function as a gate insulating layer.

In the case where one of the electrode 246 and the electrode 119 is referred to as a "gate electrode", the other is referred to as a "back gate electrode". For example, in the transistor 201, in the case where the electrode 246 is referred to as a "gate electrode", the electrode 119 is referred to as a "back gate electrode". In the case where the electrode 119 is used as a "gate electrode", the transistor 201 is a form of bottom-gate transistor. Alternatively, one of the electrode 246 and the electrode 119 may be referred to as a "first gate electrode", and the other may be referred to as a "second gate electrode".

By providing the electrode 246 and the electrode 119 so that the semiconductor layer 242 is located therebetween, and by setting the potentials of the electrode 246 and the electrode 119 to be equal to each other, a region of the semiconductor layer 242 through which carriers flow is enlarged in the film thickness direction; thus, the number of transferred carriers is increased. As a result, the on-state current and the field-effect mobility of the transistor 201 are increased.

Therefore, the transistor 201 has a large on-state current for its area. That is, the area occupied by the transistor 201 can be small for a required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 119 each have a function of blocking an electric field from the outside, charges of charged particles and the like generated over the electrode 246 and under the electrode 119 do not influence the channel formation region of the semiconductor layer 242. Thus, degradation due to a stress test (e.g., a negative gate bias temperature (−GBT) stress test in which negative charge is applied to a gate) can be reduced. In addition, the electrode 246 and the electrode 119 can block an electric field generated from the drain electrode so as not to affect the semiconductor layer. Thus, changes in the rising voltage of on-state current due to changes in drain voltage can be suppressed. Note that this effect is significant when a potential is applied to the electrode 246 and the electrode 119.

The BT stress test is one kind of accelerated test and can evaluate, in a short time, change in characteristics (a change over time) of transistors, which is caused by long-term use. In particular, the amount of change in threshold voltage of a transistor in the BT stress test is an important indicator when examining the reliability of the transistor. If the amount of change in the threshold voltage in the BT stress test is small, the transistor has high reliability.

By providing the electrode 246 and the electrode 119 and setting the potentials of the electrode 246 and the electrode 119 to be equal to each other, the amount of change in the threshold voltage is reduced. Accordingly, variation in electrical characteristics among a plurality of transistors is also reduced.

The transistor including the back gate electrode has a smaller amount of change in threshold voltage in a +GBT stress test, in which positive charge is applied to a gate, than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

The insulating layer 145 has a projection. Over the projection, the semiconductor layer 242a and the semiconductor layer 242b each having an island shape are provided. The electrode 121a and the electrode 121b are provided over the semiconductor layer 242b. A region of the semiconductor layer 242b which overlaps with the electrode 121a can function as one of a source and a drain of the transistor 201. A region of the semiconductor layer 242b which overlaps with the electrode 121b can function as the other of the source and the drain of the transistor 201. Thus, a region 269 of the semiconductor layer 242b which is located between the electrode 121a and the electrode 121b can function as a channel formation region.

As illustrated in FIG. 2, in the transistor 201 in the channel width direction, the electrode 246 covers the semiconductor layer 242b. By the existence of the projection of the insulating layer 145, the side surfaces of the semiconductor layer 242b can be covered with the electrode 246. That is, the transistor 201 has a structure in which the semiconductor layer 242b can be electrically surrounded by an electric field of the electrode 246 (a structure of a transistor in which a semiconductor is electrically surrounded by an electric field of a conductive film is referred to as a surrounded channel (s-channel) structure). Therefore, a channel can be formed in the entire semiconductor layer 242b (bulk). In the s-channel structure, the drain current of the transistor is increased, so that a larger amount of on-state current (a current which flows between the source and the drain when the transistor is on) can be obtained. Furthermore, the entire channel formation region of the semiconductor layer 242b can be depleted by the electric field of the electrode 246. Accordingly, the off-state current (a current which flows between the source and the drain when the transistor is off) of the transistor with an s-channel structure can be further reduced. When the channel width is shortened, the effects of the s-channel structure to increase the on-state current and reduce the off-state current can be enhanced.

[Semiconductor Layer 242]

In this embodiment, an oxide semiconductor is used for the semiconductor layer 242. The band gap of an oxide semiconductor is greater than or equal to 2 eV; thus, when the oxide semiconductor is used for the semiconductor layer 242, a transistor with an extremely low off-state current can be provided. An OS transistor has a high withstand voltage between its source and drain. Thus, a transistor or the like with high reliability can be provided. Furthermore, a semiconductor device or the like with high reliability can be provided.

The semiconductor layer 242 is a stack of the semiconductor layer 242a, the semiconductor layer 242b, and the semiconductor layer 242c.

The semiconductor layer 242b is an oxide containing, for example, indium (In). The semiconductor layer 242b has a high carrier mobility (electron mobility) when containing, for example, indium. In addition, the semiconductor layer 242b preferably contains an element M.

The element M is preferably aluminum, gallium, yttrium, tin, or the like. Other elements which can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M. The element M is an element having a high bonding energy with oxygen, for example. The element M is an element that can increase the band gap of the oxide, for example. Furthermore, an oxide semiconductor preferably contains zinc. When the oxide semiconductor contains zinc, the oxide semiconductor is easily crystallized in some cases.

Note that the semiconductor layer 242b is not limited to the oxide containing indium. The semiconductor layer 242b may be, for example, an oxide which does not contain indium and contains zinc, an oxide which does not contain indium and contains gallium, or an oxide which does not contain indium and contains tin, e.g., zinc tin oxide, gallium tin oxide, or gallium oxide.

For the semiconductor layer 242b, an oxide with a wide band gap may be used. For example, the band gap of the semiconductor layer 242b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor layer 242 can be formed by a sputtering method, a chemical vapor deposition (CVD) method (including but not limited to a metal organic chemical vapor deposition (MOCVD) method, an atomic layer deposition (ALD) method, a thermal CVD method, or a plasma enhanced chemical vapor deposition (PECVD) method), a molecular beam epitaxy (MBE) method, or a pulsed laser deposition (PLD) method. By using a PECVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited.

For example, in the case where an oxide semiconductor film containing In, Ga, and Zn is formed as the semiconductor layer 242 by a thermal CVD method, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an oxide semiconductor film containing In, Ga, and Zn is formed as the semiconductor layer 242 by the ALD method, an $In(CH_3)_3$ gas and an $O_3$ gas are sequentially introduced a plurality of times to form an $InO_2$ layer, a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed using these gases. Note that although an $H_2O$ gas which is obtained by bubbling water with an inert gas such as Ar may be used instead of an $O_3$ gas, it is preferable to use an $O_3$ gas, which does not contain H. Instead of an $In(CH_3)_3$ gas, an $In(C_2H_5)_3$ gas or tris(acetylacetonato)indium may be used. Note that tris(acetylacetonato)indium is also referred to as $In(acac)_3$. Instead of a $Ga(CH_3)_3$ gas, a $Ga(C_2H_5)_3$ gas or tris(acetylacetonato)gallium may be used. Note that tris(acetylacetonato)gallium is also referred to as $Ga(acac)_3$. Furthermore, a $Zn(CH_3)_2$ gas or zinc acetate may be used. However, the deposition gas is not limited to these.

In the case where the semiconductor layer 242 is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the semiconductor layer 242 is formed by a sputtering method, the atomic ratio of In to M and Zn contained in the target may be 3:1:1, 3:1:2, 3:1:4, 1:1:0.5, 1:1:1, 1:1:2, 1:4:4, 4:2:4.1, or 5:1:6, for example.

In the cases where the semiconductor layer 242 is formed by a sputtering method, a film having an atomic ratio different from the atomic ratio of the target may be formed. Especially for zinc, the proportion of zinc atoms of a formed film is smaller than that of zinc atoms of the target in some cases. Specifically, the proportion of zinc atoms of the film may be approximately 40% to 90% of the proportion of zinc atoms of the target.

The semiconductor layer 242a and the semiconductor layer 242c are preferably formed using a material including one or more kinds of metal elements, other than oxygen, included in the semiconductor layer 242b. With the use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Furthermore, variation in threshold voltage (hereinafter also referred to as "Vth") of the transistor can be reduced. Thus, a semiconductor device having favorable electrical characteristics can be obtained.

The thicknesses of the semiconductor layer 242a and the semiconductor layer 242c are each greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

When the semiconductor layer 242b is an In-M-Zn oxide containing In, the element M, and Zn at an atomic ratio of $x_2:y_2:z_2$ and each of the semiconductor layer 242a and the semiconductor layer 242c is an In-M-Zn oxide containing In, M, and Zn at an atomic ratio of $x_1:y_1:z_1$, $y_1/x_1$ needs to be larger than $y_2/x_2$. Preferably, the semiconductor layer 242a, the semiconductor layer 242c, and the semiconductor layer 242b in which $y_1/x_1$ is 1.5 or more times as large as $y_2/x_2$ are selected. Still more preferably, the semiconductor layer 242a, the semiconductor layer 242c, and the semiconductor layer 242b in which $y_1/x_1$ is 2 or more times as large as $y_2/x_2$ are selected. Still more preferably, the semiconductor layer 242a, the semiconductor layer 242c, and the semiconductor layer 242b in which $y_1/x_1$ is 3 or more times as large as $y_2/x_2$ are selected. In the semiconductor layer 242b of this case, $y_1$ is preferably larger than or equal to $x_1$ because the transistor can have stable electrical characteristics. However, when $y_1$ is three or more times as large as $x_1$, the field-effect mobility of the transistor is reduced; accordingly, $y_1$ is preferably smaller than three times $x_1$. When the oxide semiconductor layers 242a and 242c each have the above structure, each of the oxide semiconductor layers 242a and 242c can be a layer in which oxygen vacancy is less likely to occur than in the semiconductor layer 242b.

In the case of using an In-M-Zn oxide as the semiconductor layer 242a, when the summation of In and M is assumed to be 100 atomic %, the proportions of In and M are preferably set to be less than 50 atomic % and greater than or equal to 50 atomic %, respectively, more preferably less than 25 atomic % and greater than or equal to 75 atomic %, respectively. In the case of using an In-M-Zn oxide as the semiconductor layer 242b, when the summation of In and M is assumed to be 100 atomic %, the proportions of In and M are preferably set to be greater than or equal to 25 atomic % and less than 75 atomic %, respectively, more preferably greater than or equal to 34 atomic % and less than 66 atomic %, respectively. In the case of using an In-M-Zn oxide as the semiconductor layer 242c, when the summation of In and M is assumed to be 100 atomic %, the proportions of In and M are preferably set to be less than 50 atomic % and greater than or equal to 50 atomic %, respectively, more preferably less than 25 atomic % and greater than or equal to 75 atomic %, respectively. Note that the semiconductor layer 242c and the semiconductor layer 242a may be formed using the same type of oxide.

For example, an In—Ga—Zn oxide which is formed using a target having an atomic ratio of In:Ga:Zn=1:3:2, 1:3:4, 1:3:6, 1:6:4, or 1:9:6 or an atomic ratio close to these ratios or an In—Ga oxide which is formed using a target having an atomic ratio of In:Ga=1:9 or 7:93 or an atomic ratio close to these ratios can be used for each of the oxide semiconductor layers 242a and 242c containing In or Ga. Furthermore, an In—Ga—Zn oxide which is formed using a target having an atomic ratio of In:Ga:Zn=1:1:1, 3:1:2, 4:2:4, or 4:2:4.1 or an atomic ratio close to these ratios can be used for the semiconductor layer 242b. Note that the atomic ratio of each of the oxide semiconductor layers 242a, 242b, and 242c may vary within a margin of ±20% of the corresponding atomic ratio.

For the semiconductor layer 242b, an oxide having an electron affinity higher than that of each of the semiconductor layer 242a and the semiconductor layer 242c is used. For example, for the semiconductor layer 242b, an oxide having an electron affinity higher than that of each of the semiconductor layer 242a and the semiconductor layer 242c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor layer 242c preferably includes an indium gallium oxide. The gallium atomic ratio [Ga/(In+Ga)] is, for example, higher than or equal to 70%, preferably higher than or equal to 80%, more preferably higher than or equal to 90%.

Note that the semiconductor layer 242a and/or the semiconductor layer 242c may be gallium oxide. For example, when gallium oxide is used for the semiconductor layer 242c, a leakage current generated between the electrode 109 and the electrode 121a or 121b can be reduced. In other words, the off-state current of the transistor 201 can be reduced.

At this time, when a gate voltage is applied, a channel is formed in the semiconductor layer 242b having the highest electron affinity among the oxide semiconductor layers 242a to 242c.

In order to give stable electrical characteristics to the transistor including the oxide semiconductor layer, it is preferable that impurities and oxygen vacancies in the oxide semiconductor layer be reduced to highly purify the oxide semiconductor layer so that at least the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic semiconductor layer.

[Energy Band Structure of Semiconductor Layer 242]

Figure 25A:
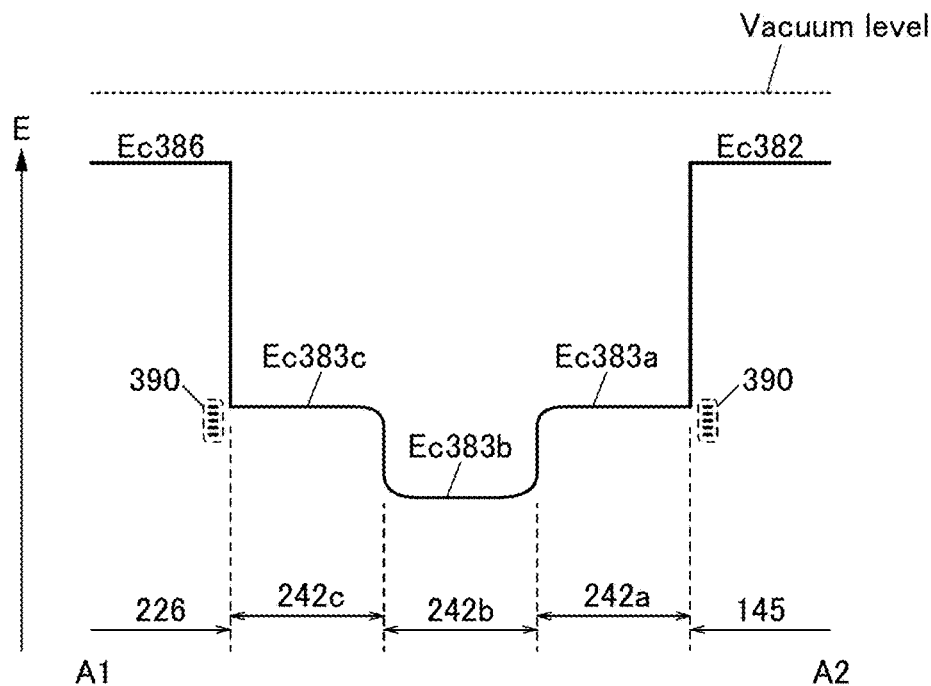
FIGS. 25A and 25B show energy band structures.

A function and an effect of the semiconductor layer 242 consisting of the oxide semiconductor layers 242a, 242b, and 242c will be described using an energy band structure diagrams of FIGS. 25A and 25B. FIG. 25A illustrates the energy band structure of a portion along the dashed dotted line A1-A2 in FIG. 3B. In other words, FIG. 25A illustrates the energy band structure of a channel formation region of the transistor 201.

Figure 25B:
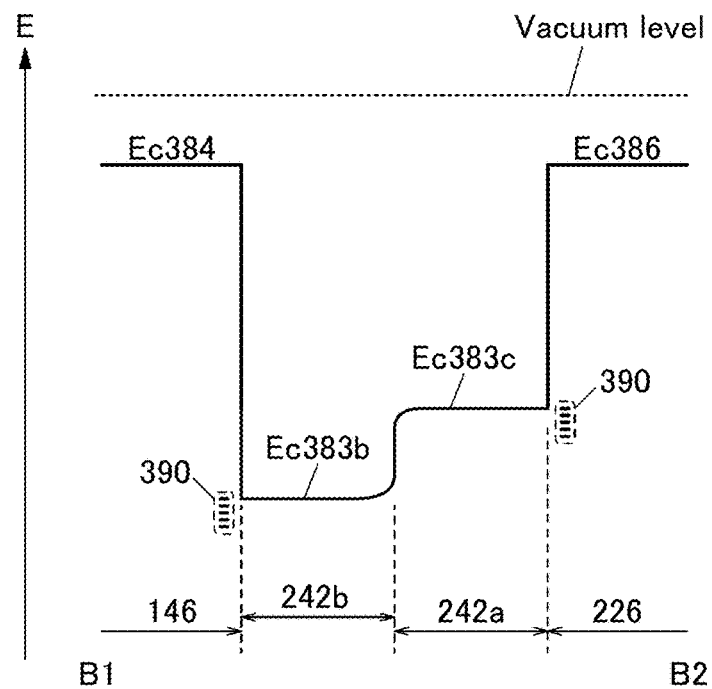

In FIGS. 25A and 25B, Ec382, Ec383a, Ec383b, Ec383c, and Ec386 indicate the energy of the conduction band minimum of the insulating layer 145, the semiconductor layer 242a, the semiconductor layer 242b, the semiconductor layer 242c, and the insulating layer 226, respectively.

Here, an electron affinity corresponds to a value obtained by subtracting a band gap from a difference in energy between the vacuum level and the valence band maximum (the difference is also referred to as "ionization potential"). The band gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has a band gap of approximately 3.5 eV and an electron affinity of approximately 4.5 eV. An In—Ga—Zn oxide formed using a target with an atomic ratio of In:Ga:Zn=1:3:4 has a band gap of approximately 3.4 eV and an electron affinity of approximately 4.5 eV. An In—Ga—Zn oxide formed using a target with an atomic ratio of In:Ga:Zn=1:3:6 has a band gap of approximately 3.3 eV and an electron affinity of approximately 4.5 eV. An In—Ga—Zn oxide formed using a target with an atomic ratio of In:Ga:Zn=1:6:2 has a band gap of approximately 3.9 eV and an electron affinity of approximately 4.3 eV. An In—Ga—Zn oxide formed using a target with an atomic ratio of In:Ga:Zn=1:6:8 has a band gap of approximately 3.5 eV and an electron affinity of approximately 4.4 eV. An In—Ga—Zn oxide which is formed using a target having an atomic ratio of In:Ga:Zn=1:6:10 has a band gap of approximately 3.5 eV and an electron affinity of approximately 4.5 eV. An In—Ga—Zn oxide formed using a target with an atomic ratio of In:Ga:Zn=1:1:1 has a band gap of approximately 3.2 eV and an electron affinity of approximately 4.7 eV. An In—Ga—Zn oxide formed using a target with an atomic ratio of In:Ga:Zn=3:1:2 has a band gap of approximately 2.8 eV and an electron affinity of approximately 5.0 eV.

Since the insulating layer 145 and the insulating layer 226 are insulators, Ec382 and Ec386 are closer to the vacuum level than Ec383a, Ec383b, and Ec383c (i.e., the insulating layer 145 and the insulating layer 226 have a smaller electron affinity than the semiconductor layer 242a, the semiconductor layer 242b, and the semiconductor layer 242c).

Ec383a is closer to the vacuum level than Ec383b. Specifically, Ec383a is preferably located closer to the vacuum level than Ec383b by greater than or equal to 0.07 eV and less than or equal to 1.3 eV, more preferably greater than or equal to 0.1 eV and less than or equal to 0.7 eV, more preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, more preferably greater than or equal to 0.1 eV and less than or equal to 0.7 eV, more preferably greater than or equal to 0.15 eV and less than or equal to 0.4 eV.

Here, a mixed region of the semiconductor layer 242a and the semiconductor layer 242b might exist between the semiconductor layer 242a and the semiconductor layer 242b. A mixed region of the semiconductor layer 242b and the semiconductor layer 242c might exist between the semiconductor layer 242b and the semiconductor layer 242c. The mixed region has a low density of interface states. For that reason, the stack including the oxide semiconductor layers 242a, 242b, and 242c has a band structure where energy at each interface and in the vicinity of the interface is changed continuously (continuous junction).

At this time, electrons move mainly in the semiconductor layer 242b, not in the semiconductor layer 242a and the semiconductor layer 242c. Thus, when the interface state density at the interface between the semiconductor layer 242a and the semiconductor layer 242b and the interface state density at the interface between the semiconductor layer 242b and the semiconductor layer 242c are decreased, electron movement in the semiconductor layer 242b is less likely to be inhibited and the on-sate current of the transistor 201 can be increased.

Although trap states 390 due to impurities or defects might be formed at or near the interface between the semiconductor layer 242a and the insulating layer 145 and at or near the interface between the semiconductor layer 242c and the insulating layer 226, the semiconductor layer 242b can be separated from the trap states owing to the existence of the semiconductor layer 242a and the semiconductor layer 242c.

In the case where the transistor 201 has an s-channel structure, a channel is formed in the whole of the semiconductor layer 242b. Therefore, as the semiconductor layer 242b has a larger thickness, a channel region becomes larger. In other words, the thicker the semiconductor layer 242b is, the larger the on-state current of the transistor 201 is. For example, the semiconductor layer 242b has a region with a thickness of greater than or equal to 20 nm, preferably greater than or equal to 40 nm, more preferably greater than or equal to 60 nm, still more preferably greater than or equal to 100 nm. Note that the semiconductor layer 242b has a region with a thickness of, for example, less than or equal to 300 nm, preferably less than or equal to 200 nm, more preferably less than or equal to 150 nm, otherwise the productivity of a semiconductor device including the transistor 201 might be decreased.

Moreover, the thickness of the semiconductor layer 242c is preferably as small as possible to increase the on-state current of the transistor 201. For example, the semiconductor layer 242c has a region with a thickness of less than 10 nm, preferably less than or equal to 5 nm, more preferably less than or equal to 3 nm. Meanwhile, the semiconductor layer 242c has a function of blocking entry of elements other than oxygen (such as hydrogen and silicon) included in the adjacent insulator into the semiconductor layer 242b where a channel is formed. For this reason, it is preferable that the semiconductor layer 242c have a certain thickness. For example, the semiconductor layer 242c may have a region with a thickness of greater than or equal to 0.3 nm, preferably greater than or equal to 1 nm, more preferably greater than or equal to 2 nm. The semiconductor layer 242c preferably has an oxygen blocking property to suppress outward diffusion of oxygen released from the insulating layer 145 and the like.

To improve reliability, preferably, the thickness of the semiconductor layer 242a is large and the thickness of the semiconductor layer 242c is small. For example, the semiconductor layer 242a has a region with a thickness of greater than or equal to 10 nm, preferably greater than or equal to 20 nm, more preferably greater than or equal to 40 nm, still more preferably greater than or equal to 60 nm. When the thickness of the semiconductor layer 242a is made large, the distance from an interface between the adjacent insulator and the semiconductor layer 242a to the semiconductor layer 242b in which a channel is formed can be large. However, to prevent the productivity of the semiconductor device including the transistor 201 from being decreased, the semiconductor layer 242a has a region with a thickness of, for example, less than or equal to 200 nm, preferably less than or equal to 120 nm, more preferably less than or equal to 80 nm.

Note that silicon contained in the oxide semiconductor might serve as a carrier trap or a carrier generation source. Therefore, the silicon concentration of the semiconductor layer 242b is preferably as low as possible. For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by secondary ion mass spectrometry (SIMS) is provided between the semiconductor layer 242b and the semiconductor layer 242a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor layer 242b and the semiconductor layer 242c.

It is preferable to reduce the concentration of hydrogen in the semiconductor layer 242a and the semiconductor layer 242c in order to reduce the concentration of hydrogen in the semiconductor layer 242b. The semiconductor layer 242a and the semiconductor layer 242c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor layer 242a and the semiconductor layer 242c in order to reduce the concentration of nitrogen in the semiconductor layer 242b. The semiconductor layer 242a and the semiconductor layer 242c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when copper enters the oxide semiconductor, an electron trap might be generated. The electron trap might shift the threshold voltage of the transistor in the positive direction. Therefore, the copper concentration at the surface of or in the semiconductor layer 242b is preferably as low as possible. For example, the semiconductor layer 242b preferably has a region in which the copper concentration is lower than or equal to $1\times10^{19}$ atoms/cm$^3$, lower than or equal to $5\times10^{18}$ atoms/cm$^3$, or lower than $1\times10^{18}$ atoms/cm$^3$.

The above three-layer structure is an example. For example, a two-layer structure without the semiconductor layer 242a or the semiconductor layer 242c may be employed. A four-layer structure in which any one of the semiconductors described as examples of the semiconductor layer 242a, the semiconductor layer 242b, and the semiconductor layer 242c is provided over or under the semiconductor layer 242a or over or under the semiconductor layer 242c may be employed. An n-layer structure (n is an integer of 5 or more) may be employed in which any one of the semiconductors described as examples of the semiconductor layer 242a, the semiconductor layer 242b, and the semiconductor layer 242c is provided at two or more of the following positions: over the semiconductor layer 242a, under the semiconductor layer 242a, over the semiconductor layer 242c, and under the semiconductor layer 242c.

In the transistor 201 described in this embodiment, in the channel width direction, the top surface and side surfaces of the semiconductor layer 242b are in contact with the semiconductor layer 242c, and the bottom surface of the semiconductor layer 242b is in contact with the semiconductor layer 242a (see the cross-sectional view along Y1-Y2 in FIG. 2). Surrounding the semiconductor layer 242b with the semiconductor layer 242a and the semiconductor layer 242c in this manner can further reduce the influence of the trap states.

The band gap of each of the semiconductor layer 242a and the semiconductor layer 242c is preferably wider than that of the semiconductor layer 242b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely low off-state current. Specifically, the off-state current per micrometer in channel width at room temperature (25° C.) and at a source-drain voltage of 3.5 V can be lower than $1\times10^{-20}$ A, lower than $1\times10^{-22}$ A, or lower than $1\times10^{-24}$ A. That is, the on/off ratio of the transistor can be greater than or equal to 20 digits and less than or equal to 150 digits. Note that an oxide semiconductor will be described in detail in another embodiment.

With one embodiment of the present invention, a transistor with low power consumption can be provided. Accordingly, a semiconductor device with low power consumption can be provided.

To return to the description of the transistor 201, an opening is formed in a region of the insulating layer 146 that overlaps with the region 269, and the semiconductor layer 242c is provided along the side and bottom surfaces of the opening. In the opening, the insulating layer 226 is provided along the side and bottom surfaces of the opening with the semiconductor layer 242c located therebetween. In the opening, the electrode 246 is also provided along the side and bottom surfaces of the opening with the semiconductor layer 242c and the insulating layer 226 located therebetween.

Note that the opening is wider than the semiconductor layer 242a and the semiconductor layer 242b in the cross section in the channel width direction. Accordingly, the side surfaces of the semiconductor layer 242a and the semiconductor layer 242b in the region 269 are covered with the semiconductor layer 242c.

The insulating layer 142, an electrode 118, and the electrode 119 are formed over the insulating layer 141. The insulating layer 142 can be formed using a material and a method that are similar to those for the insulating layer 403. The electrodes 118 and 119 can be formed using a material and a method that are similar to those for the electrode 287.

The insulating layer 144 is formed over the insulating layer 142, the electrode 118, and the electrode 119, and the insulating layer 145 is formed over the insulating layer 144. The insulating layer 144 and the insulating layer 145 can be formed using a material and a method that are similar to those for the insulating layer 403.

Note that when the insulating layer 144 is formed using hafnium oxide, aluminum oxide, tantalum oxide, aluminum silicate, or the like, the insulating layer 144 can function as a charge trap layer. The threshold voltage of the transistor can be changed by injecting electrons into the insulating layer 144. For example, the injection of electrons into the insulating layer 144 can be performed with the use of the tunnel effect. By applying a positive voltage to the electrode 119, tunnel electrons can be injected into the insulating layer 144.

The insulating layer 146 can be formed using a material and a method that are similar to those for the insulating layer 405. An insulating layer 147 can be formed over the insulating layer 405 and the electrode 246 using a material and a method that are similar to those for the insulating layer 141. The insulating layer 147 is preferably formed using an insulating material through which impurities do not easily pass. The use of such a material for the insulating layer 147 enables inhibition of impurity diffusion from the insulating layer 148 side to the transistor 201 side.

The insulating layer 148 is formed over the insulating layer 147, and an electrode 113a, an electrode 113b, an electrode 113c, and an electrode 113d are formed over the insulating layer 148. The insulating layer 148 can be formed using a material and a method that are similar to those for the insulating layer 405. The electrode 113a, the electrode 113b, the electrode 113c, and the electrode 113d can be formed using a material and a method that are similar to those for the electrode 287.

The electrode 113a is electrically connected to the electrode 121a through the contact plug 112a. The electrode 113b is electrically connected to the electrode 121b through the contact plug 112b. The electrode 113c is electrically connected to the electrode 246 through the contact plug 112c. The electrode 113d is electrically connected to the electrode 119 through the contact plug 112d. The electrode 113b is electrically connected to the electrode 118 through a contact plug 112e.

The contact plug 112a and the contact plug 112b are provided in openings formed by removing parts of the insulating layers 148, 147, and 146. The contact plug 112c is provided in an opening formed by removing parts of the insulating layers 148 and 147. The contact plug 112d and the contact plug 112e are provided in openings formed by removing parts of the insulating layers 148, 147, 146, 145, 144, and 143.

An insulating layer 149 is formed over the insulating layer 148. The insulating layer 149 can be formed using a material and a method that are similar to those for the insulating layer 405.

When an oxide semiconductor is used for the semiconductor layer 242, the hydrogen concentration and the nitrogen concentration in the insulating layers that are adjacent to the semiconductor layer 242 are preferably lowered in order to prevent an increase in the hydrogen concentration and the nitrogen concentration in the oxide semiconductor. Specifically, the hydrogen concentration in the insulating layers 145, 146, and 226, which is measured by SIMS, is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Furthermore, the nitrogen concentration in the insulating layers 145, 146, and 226, which is measured by SIMS, is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

When an oxide semiconductor is used for the semiconductor layer 242, the insulating layer 145, the insulating layer 146, and the insulating layer 226 are preferably formed with insulating layers from which oxygen is released by heating. Specifically, the insulating layers are each preferably an insulating layer of which the amount of released oxygen converted into oxygen atoms is greater than or equal to $1.0\times10^{18}$ atoms/cm$^3$, preferably greater than or equal to $1.0\times10^{19}$ atoms/cm$^3$, more preferably greater than or equal to $1.0\times10^{20}$ atoms/cm$^3$ in terminal desorption spectroscopy (TDS) in which heat treatment is performed such that the surface temperature of the insulating layer is higher than or equal to 100° C. and lower than or equal to 700° C., preferably higher than or equal to 100° C. and lower than or equal to 500° C. In this specification and the like, oxygen released by heating is also referred to as "excess oxygen". In addition, an insulating layer from which oxygen is released by heating is also referred to as an "insulating layer containing excess oxygen".

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

[Guard Layer 103]

The guard layer 103 described in this embodiment has a structure in which a layer 103b is stacked over a layer 103a. The layer 103a can be formed with a material and a method that are similar to those for the semiconductor layer 242a at the same time as the semiconductor layer 242a. The layer 103b can be formed with a material and a method that are similar to those for the semiconductor layer 242b at the same time as the semiconductor layer 242b. Thus, the guard layer 103 described in this embodiment is formed over the projection of the insulating layer 145. Note that one of the layers 103a and 103b may be omitted.

AS described above, for the guard layer 103, a conductive material such as metal may be used, and a material having a band gap greater than or equal to 2.5 eV and less than or equal to 4.2 eV, preferably greater than or equal to 2.7 eV and less than or equal to 3.5 eV is preferably used. The use of such a material allows accumulated charge to be released slowly; thus, the rapid move of charge due to ESD can be suppressed and electrostatic breakdown is less likely to occur. An example of such a material is an oxide semiconductor.

An impurity may be introduced into the guard layer 103 to reduce the resistance of the guard layer 103. The introduction of an impurity can be performed with an ion implantation apparatus, an ion doping apparatus, or a plasma treatment apparatus. Alternatively, the guard layer 103 may be exposed to a plasma atmosphere of an inert gas or a nitrogen gas to reduce the resistance of the guard layer 103.

The guard layer 103 may be in a floating state or may be supplied with a specific potential such as $V_{SS}$, GND, or a common potential. The guard layer 103 may be at a potential equal to that of the substrate 101. The guard layer 103 may be electrically connected to the substrate 101. A thickness 123t of the guard layer 103 may be larger than or equal to 2 nm and smaller than or equal to 20 nm. A width 123w of the guard layer 103 is preferably as large as possible. The width 123w of the guard layer 103 is acceptable as long as it is twice or more, preferably five times or more, more preferably ten times or more the cutting width (the width of the separation line 104) (see FIG. 3C).

As described above, the guard layer 103 provided over the separation line 104 relieves ESD that might be caused in a dicing step, preventing a decrease in the yield of the dicing step. Furthermore, the amount of pure water with a small specific resistance used in the dicing step can be reduced. Therefore, the cost for manufacturing semiconductor devices can be reduced. Thus, semiconductor devices can be manufactured with improved productivity.

The guard layer 103 preferably remains along the end portion of the chip 105 even after the chip 105 is formed through the dicing step. In that case, damage to a semiconductor device or the like due to ESD after the formation of the chip 105 can be prevented or reduced.

Modification Example 1

Figure 4:
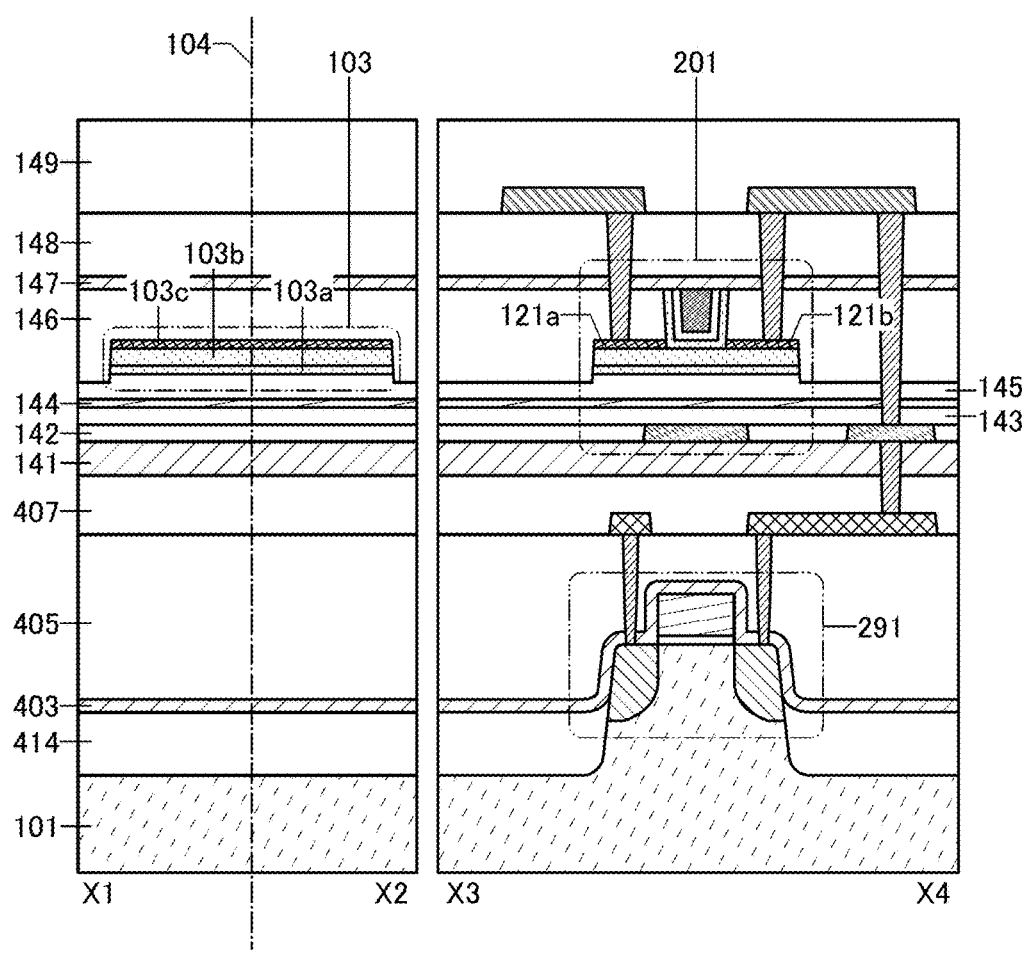
FIG. 4 is a cross-sectional view of a semiconductor device of one embodiment of the present invention.

As illustrated in the cross-sectional view of FIG. 4, the guard layer 103 may have a layered structure of the layer 103a, the layer 103b, and a layer 103c. The layer 103c can be formed using a material and a method that are similar to those for the electrode 121a and the electrode 121b at the same time as the electrode 121a and the electrode 121b.

Modification Example 2

Figure 5:
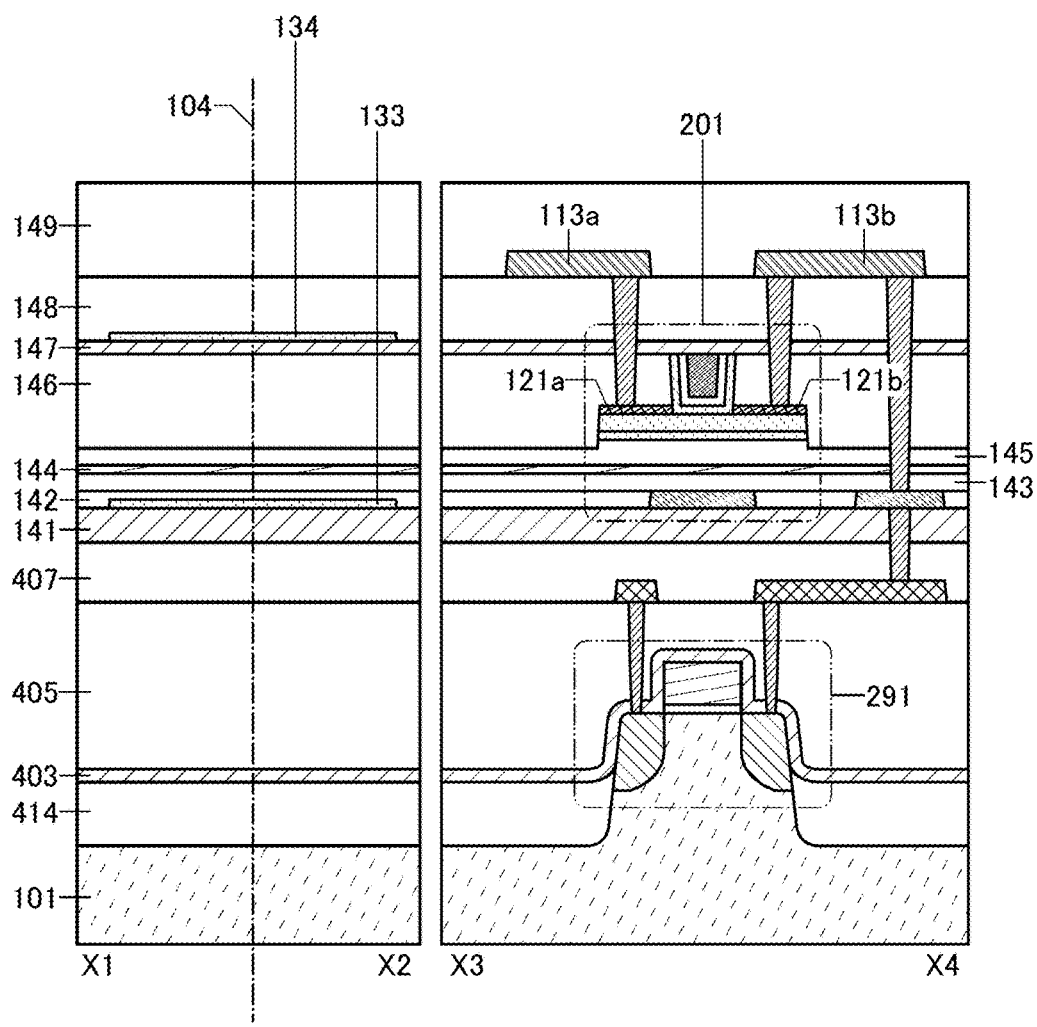
FIG. 5 is a cross-sectional view of a semiconductor device of one embodiment of the present invention.

As illustrated in the cross-sectional view of FIG. 5, guard layers may be provided in a region overlapping with the separation line 104 before and after formation of the transistor 201. FIG. 5 illustrates an example where a guard layer 133 is formed over the insulating layer 141 and a guard layer 134 is formed over the insulating layer 147.

The guard layer 133 and the guard layer 134 can be formed using a material and a method that are similar to those for the guard layer 103. Note that in the structure illustrated in Modification example 2, the guard layer does not need to be formed at the same time as the semiconductor layer of the transistor 201. Thus, different materials can be used for the guard layer and the semiconductor layer of the transistor 201. For example, the guard layer 133 and the guard layer 134 can be formed using an oxide semiconductor, and the semiconductor layer of the transistor 201 can be formed using a semiconductor such as silicon or germanium. Alternatively, the semiconductor layer of the transistor 201 can be formed using a compound semiconductor such as silicon germanium, silicon carbide, gallium arsenide, an oxide semiconductor, or a nitride semiconductor, an organic semiconductor, or the like.

In the case of using an organic semiconductor for the semiconductor layer of the transistor 201, a low molecular organic material having an aromatic ring, a π-electron conjugated conductive high molecular compound, or the like can be used. For example, rubrene, tetracene, pentacene, perylenediimide, tetracyanoquinodimethane, polythiophene, polyacetylene, or polyparaphenylene vinylene can be used.

According to one embodiment of the present invention, the design flexibility of a semiconductor device can be improved.

Modification Example 3

Figure 6:
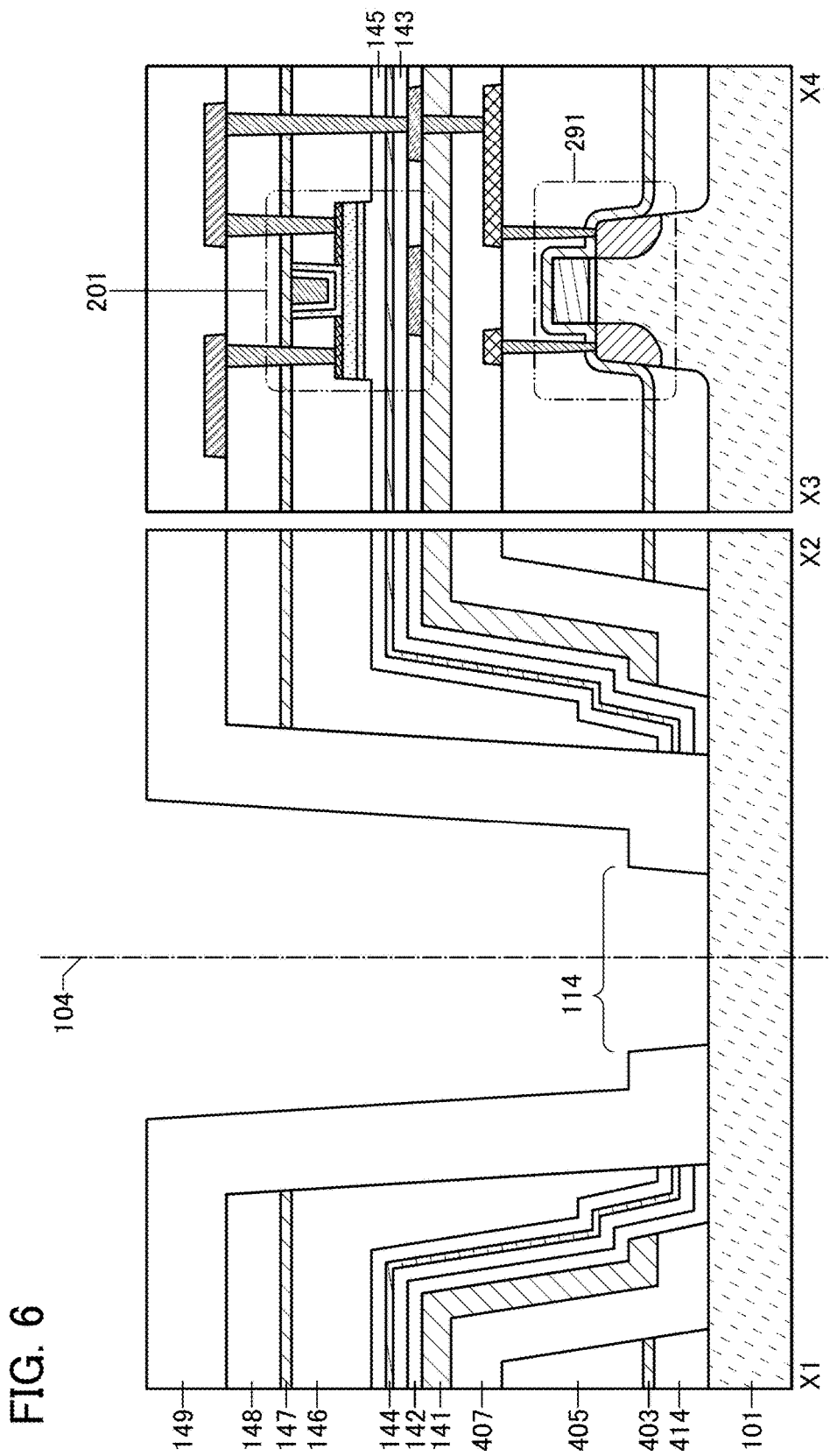
FIG. 6 is a cross-sectional view of a semiconductor wafer of one embodiment of the present invention.

The structure illustrated in the cross-sectional view of FIG. 6 may be employed in which the guard layer 103 is not provided and the substrate 101 is partly exposed in a region 114 overlapping with the separation line 104. Exposing the substrate 101 can release ESD caused at the time of dicing treatment to the substrate 101 side. The region 114 corresponds to the region in which the guard layer 103 is provided in FIG. 1A.

Furthermore, the substrate 101 is preferably exposed by removing part of the insulating layer overlapping with the region 114 to form an opening in a manufacturing process of the transistor 291 and the transistor 201. Providing the region in which the substrate 101 is exposed in a manufacturing process of a semiconductor device can prevent or reduce damage to the semiconductor device due to ESD that might be caused in the manufacturing process of a semiconductor device.

This embodiment can be implemented in combination with any of the structures described in the other embodiments, as appropriate.

Embodiment 2

<Structural Example of Circuit Region 102>

Providing a guard layer 203 in the circuit region 102 can prevent or reduce damage to a semiconductor device due to ESD that might be caused in a manufacturing process of a semiconductor device.

The guard layer 203 can be formed using a material and a method that are similar to those for the guard layer 103 described in Embodiment 1. In this embodiment, a structure of a transistor 211 to which pads 202a to 202d are connected and the guard layer 203 for protecting the transistor 211 from electrostatic breakdown will be described with reference to drawings.

[Example of Planar Structure]

Figure 7A:
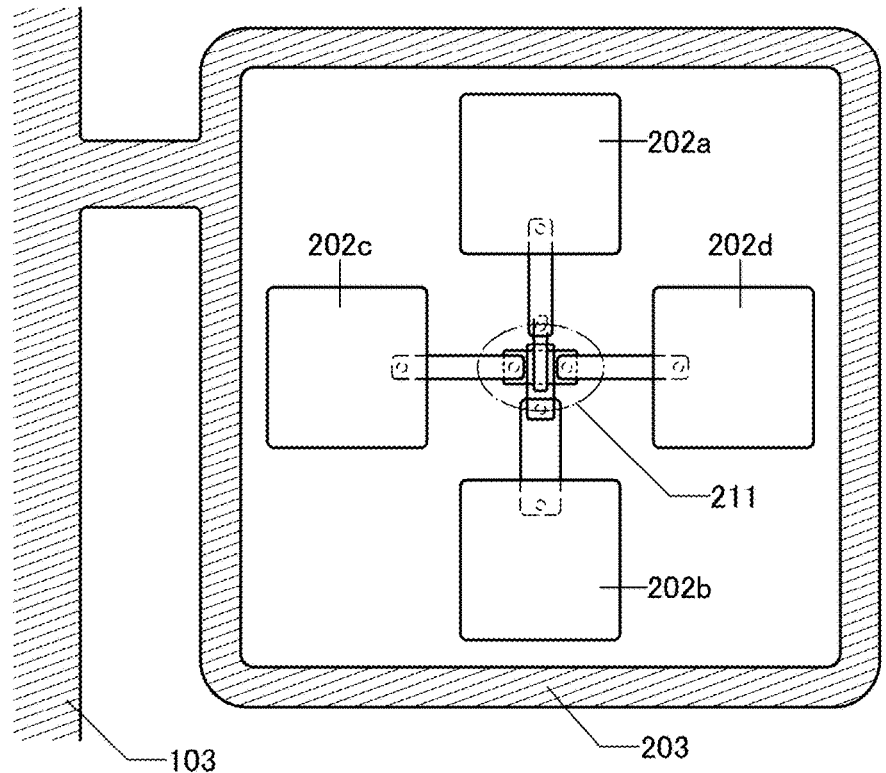
FIGS. 7A and 7B are each a top view of a semiconductor device of one embodiment of the present invention.

FIGS. 7A and 7B and FIGS. 8A and 8B are each an enlarged view of a portion 106 in FIG. 1B. FIG. 7A illustrates an example in which the guard layer 203 is provided outside the transistor 211 and the pads 202a to 202d.

Note that the pad 202a is electrically connected to a gate electrode of the transistor 211. The pad 202b is electrically connected to a back gate electrode of the transistor 211. The pad 202c is electrically connected to one of a source electrode and a drain electrode of the transistor 211. The pad 202d is electrically connected to the other of the source electrode and the drain electrode of the transistor 211.

Potentials are supplied to the electrodes of the transistor 211 through the pads 202a to 202d and a current flowing through the transistor 211 is measured, whereby the electrical characteristics of the transistor 211 can be evaluated.

Figure 7B:
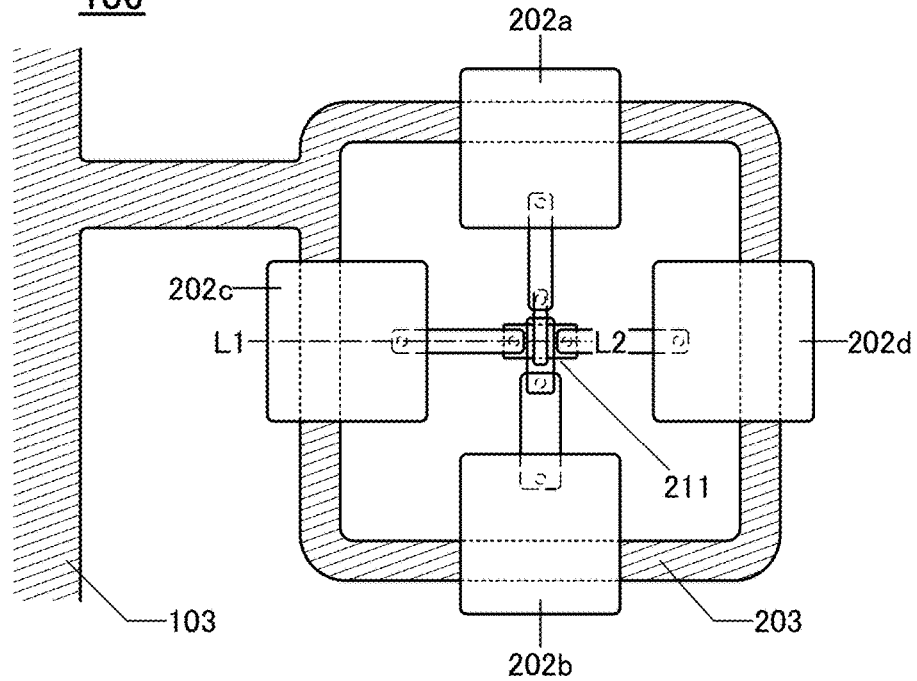

In FIG. 7B, at least part of the guard layer 203 provided outside transistor 211 is positioned so as to overlap with at least parts of the pads 202a to 202d.

Figure 8A:
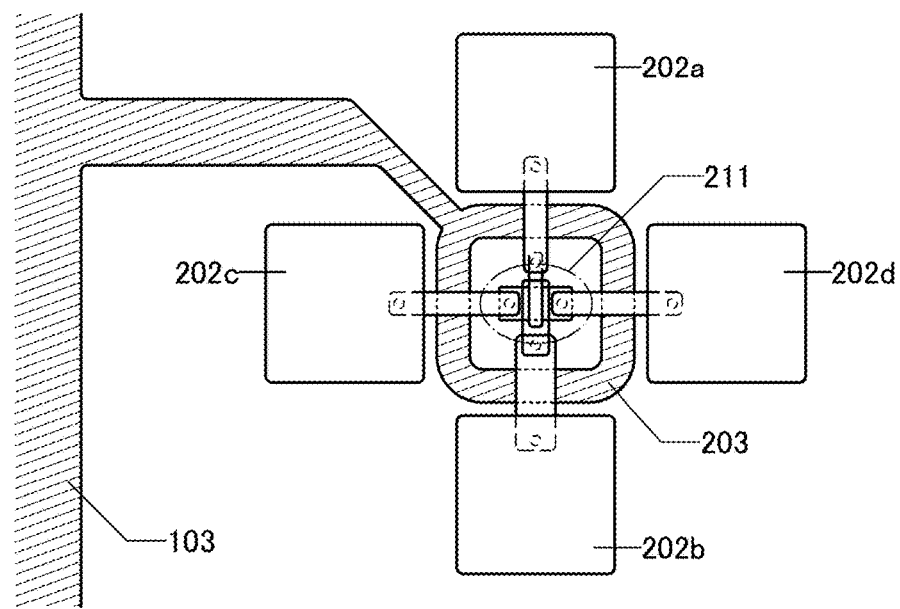
FIGS. 8A and 8B are each a top view of a semiconductor device of one embodiment of the present invention.

In FIG. 8A, the guard layer 203 is provided between the transistor 211 and each of the pads 202a to 202d.

Figure 8B:
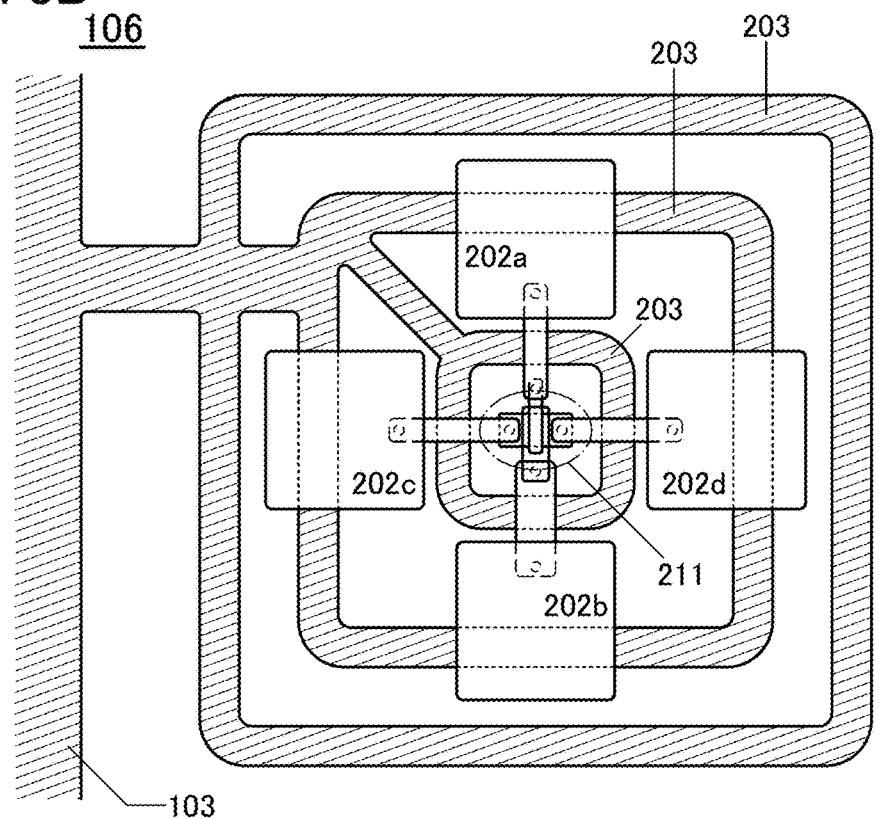
Figure 9A:
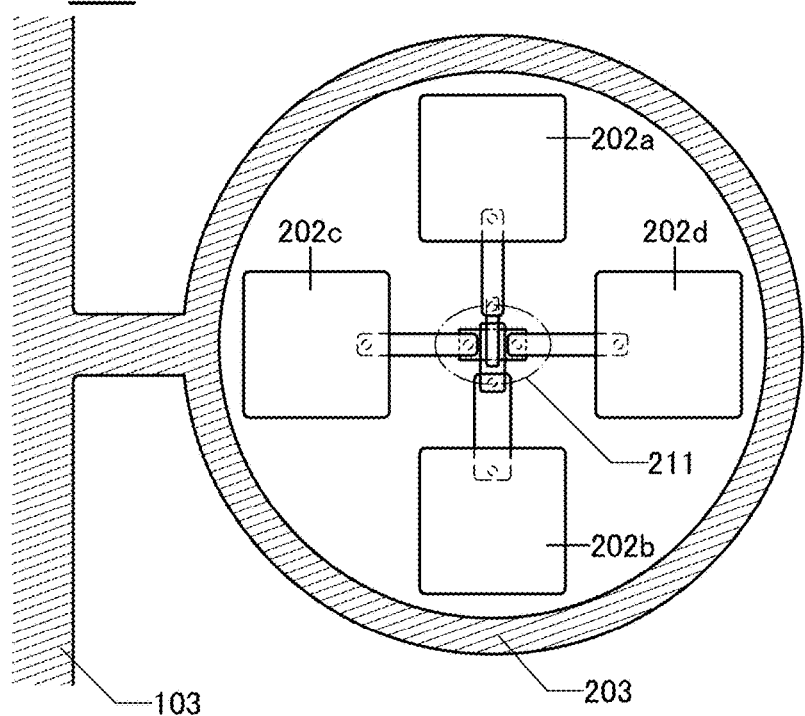
FIGS. 9A and 9B are each a top view of a semiconductor device of one embodiment of the present invention.
Figure 9B:
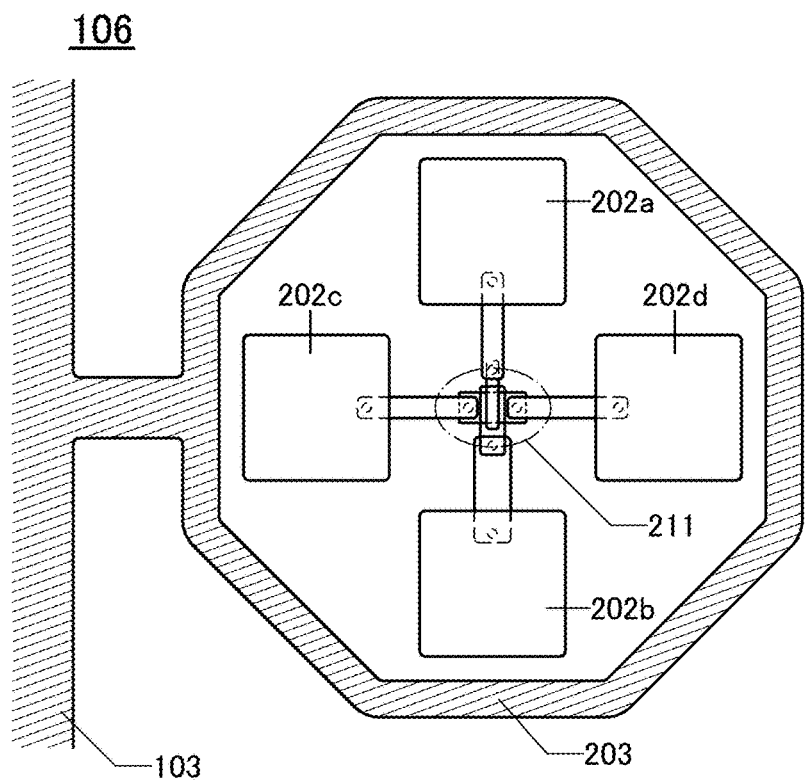
Figure 10A:
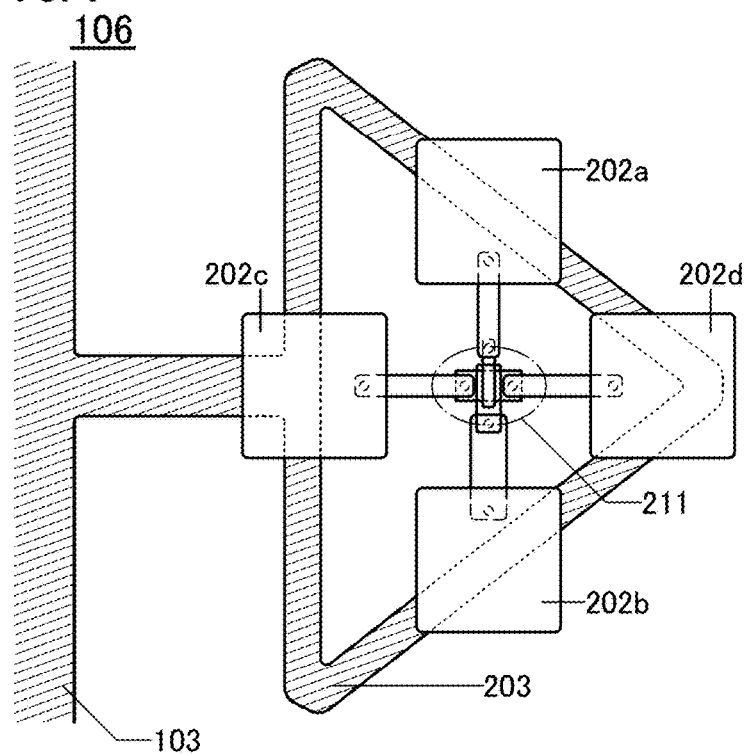
FIGS. 10A and 10B are each a top view of a semiconductor device of one embodiment of the present invention.
Figure 10B:
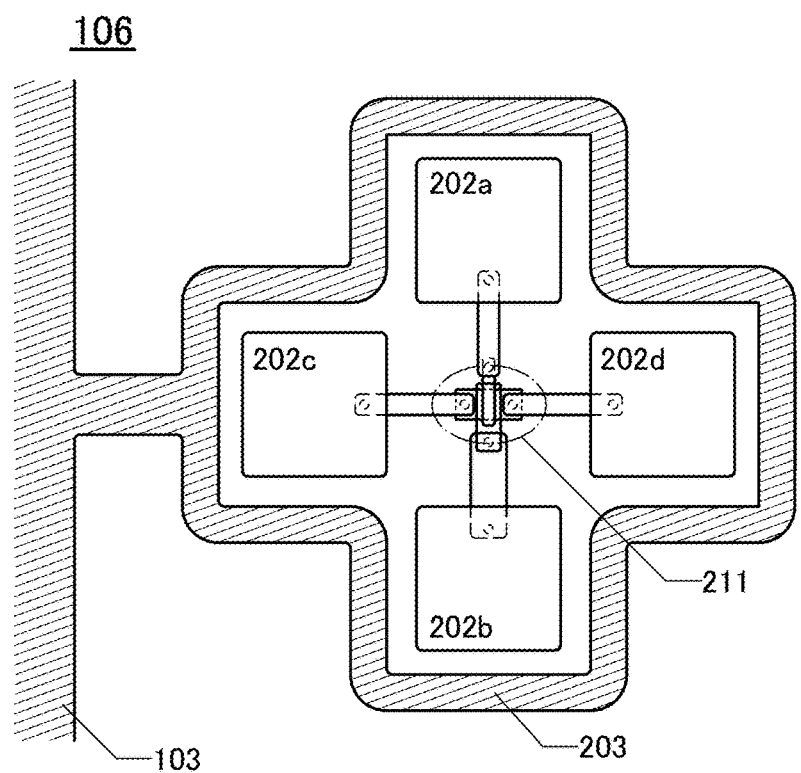

A plurality of guard layers 203 may be used in combination as appropriate (see FIG. 8B). The planar shape of the guard layer 203 may be circular as in FIG. 9A, polygonal as in FIG. 9B, triangular as in FIG. 10A, or polygonal as in FIG. 10B.

The guard layer 203 may be electrically connected to the guard layer 103.

[Example of Cross-Sectional Structure]

Figure 11A:
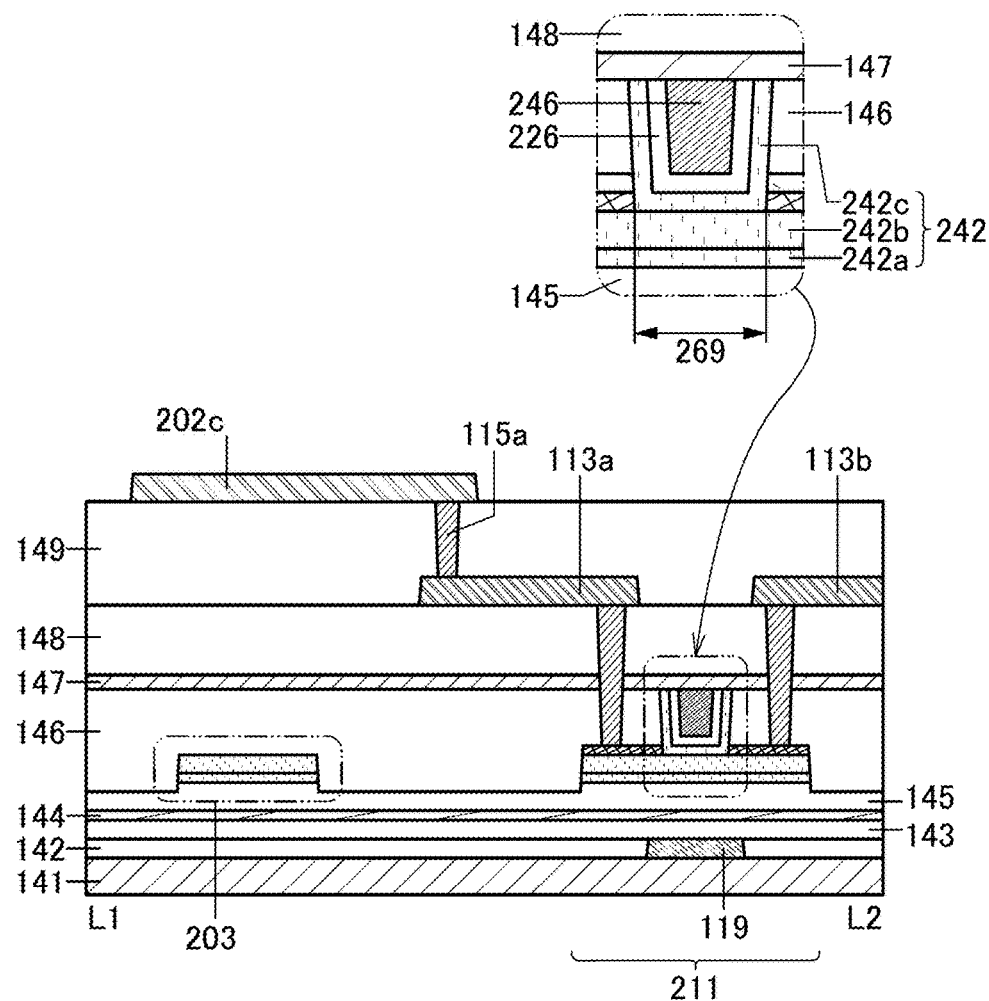
FIGS. 11A and 11B are cross-sectional views of a semiconductor device of one embodiment of the present invention.

FIG. 11A is a cross-sectional view along the dashed-dotted line L1-L2 in FIG. 7B as an example of a cross-sectional structure of the circuit region 102. Note that the description of any of the other embodiments is referred to for portions that are not described in this embodiment, in order to reduce repeated descriptions. In FIG. 11A, layers under the insulating layer 141 are not illustrated.

[Transistor 211]

The transistor 211 has a structure similar to that of the transistor 201. In FIG. 11A, the insulating layer 149 is formed over the electrode 113a and the electrode 113b. The insulating layer 149 can be formed using a material and a method that are similar to those for the insulating layer 405. The pad 202c is formed over the insulating layer 149. The pad 202c is electrically connected to the electrode 113a through a contact plug 115a in an opening formed by removing part of the insulating layer 149. The pad 202c can be formed using a material and a method that are similar to those for the electrode 287.

[Guard Layer 203]

Figure 11B:
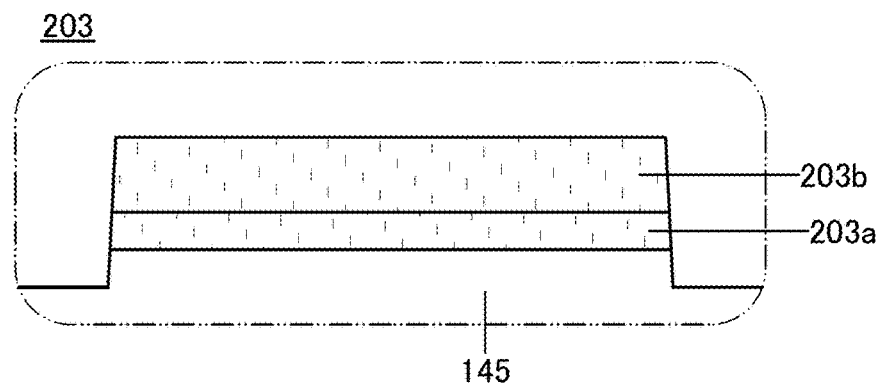

FIG. 11B is an enlarged view of the guard layer 203 illustrated in FIG. 11A. The guard layer 203 has a structure in which a layer 203b is stacked over a layer 203a. Like the guard layer 103, the layer 203a can be formed with a material and a method that are similar to those for the semiconductor layer 242a at the same time as the semiconductor layer 242a. The layer 203b can be formed with a material and a method that are similar to those for the semiconductor layer 242b at the same time as the semiconductor layer 242b. Thus, the guard layer 203 described in this embodiment is formed over the projection of the insulating layer 145. Note that one of the layers 203a and 203b may be omitted.

An impurity may be introduced into the guard layer 203 to reduce the resistance of the guard layer 203. The introduction of an impurity can be performed with an ion implantation apparatus, an ion doping apparatus, or a plasma treatment apparatus. Alternatively, the guard layer 203 may be exposed to a plasma atmosphere of an inert gas or a nitrogen gas to reduce the resistance of the guard layer 203.

The guard layer 203 may be in a floating state or may be supplied with a specific potential such as $V_{SS}$, GND, or a common potential. The guard layer 203 may be at a potential equal to that of the substrate 101. The guard layer 203 may be electrically connected to the substrate 101. The guard layer 203 may be electrically connected to the source of the transistor. The thickness of the guard layer 203 may be larger than or equal to 2 nm and smaller than or equal to 20 nm.

Modification Example 1

Figure 12A:
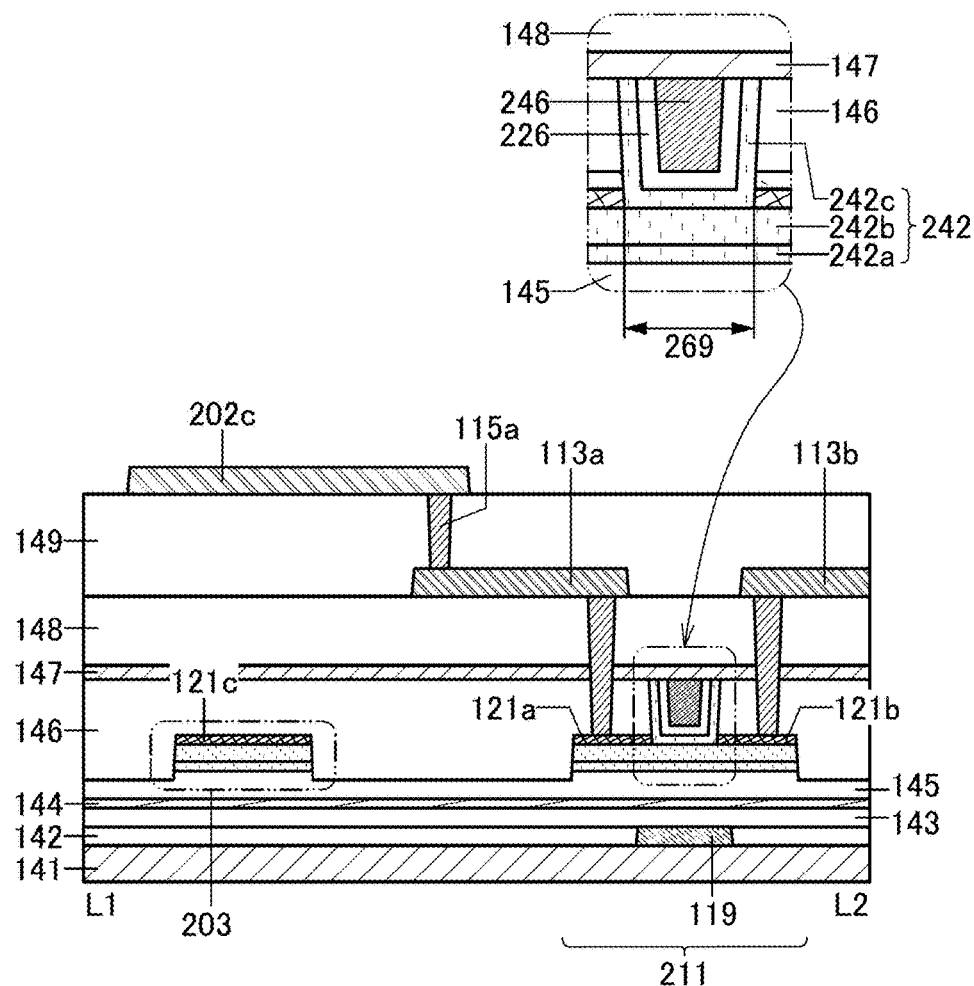
FIGS. 12A and 12B are cross-sectional views of a semiconductor device of one embodiment of the present invention.
Figure 12B:
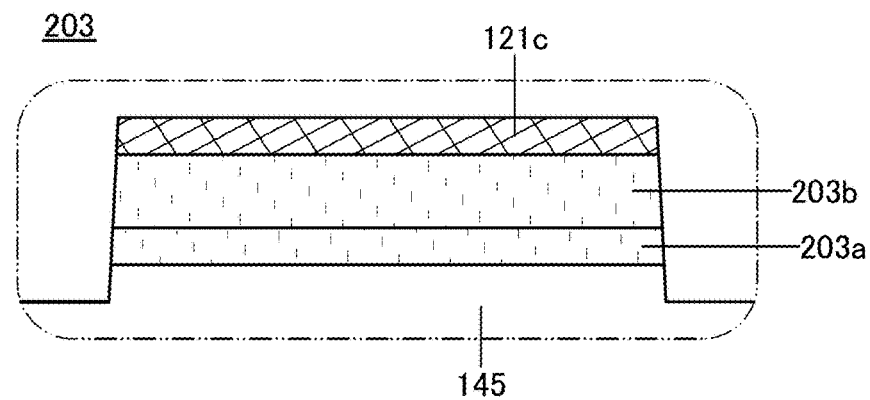

As illustrated in the cross-sectional views of FIGS. 12A and 12B, the guard layer 203 may have a layered structure of the layer 203a, the layer 203b, and a conductive layer 121c. The conductive layer 121c can be formed using a material and a method that are similar to those for the electrode 121a and the electrode 121b at the same time as the electrode 121a and the electrode 121b.

The resistivity of the conductive layer 121c is preferably lower than the resistivities/resistivity of the layer 203b and/or the layer 203a. Providing the conductive layer 121c facilitates introduction of charge generated in the manufacturing process of a semiconductor device into the layer 203b and/or the layer 203a. Thus, occurrence of ESD can be prevented or reduced in the manufacturing process of a semiconductor device.

Modification Example 2

Figure 13:
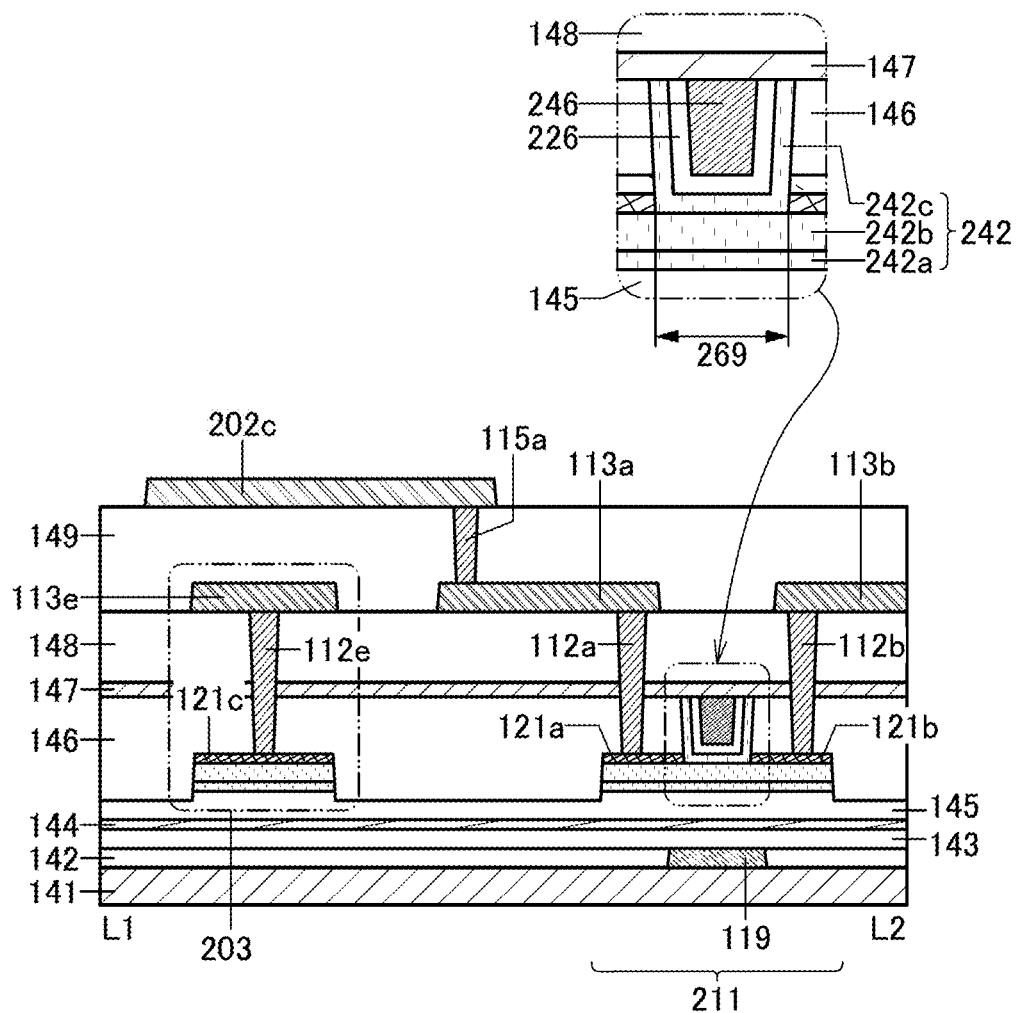
FIG. 13 is a cross-sectional view of a semiconductor device of one embodiment of the present invention.

As illustrated in FIG. 13, an electrode 113e formed over the insulating layer 148 may be electrically connected to the conductive layer 121c through the contact plug 112e. The electrode 113e can be formed using a material and a method that are similar to those for the electrode 113a and the electrode 113b at the same time as the electrode 113a and the electrode 113b. The contact plug 112e can be formed using a material and a method that are similar to those for the contact plug 112a and the contact plug 112b at the same time as the contact plug 112a and the contact plug 112b.

An electrode is individually formed in a layer where conductive materials such as a wiring and an electrode and electrically connected to the layer 203b and/or the layer 203a, whereby the guard layer 203 can be three-dimensionally formed. Forming the guard layer 203 three-dimensionally further facilitates introduction of charge generated in the manufacturing process of a semiconductor device into the layer 203b and/or the layer 203a. Thus, occurrence of ESD can be more effectively prevented or reduced in the manufacturing process of a semiconductor device.

<Example of Manufacturing Method>

An example of a method for manufacturing the guard layer 203 and the transistor 211, which is a semiconductor device included in the circuit region 102, will be described with reference to drawings. FIGS. 14A to 14D to FIGS. 18A to 18C are cross-sectional views along the dashed-dotted line L1-L2 in FIG. 7B. In this embodiment, manufacturing steps after formation of the insulating layer 141 will be described as an example.

First, the insulating layer 141 is formed using an insulating material through which impurities do not easily pass. In this embodiment, aluminum oxide is used. Then, a conductive layer is formed over the insulating layer 141, and a resist mask is formed over the conductive layer (not illustrated). The resist mask can be formed by a photolithography method, a printing method, an inkjet method, or the like as appropriate. The resist mask may be formed by a printing method, an inkjet method, or the like, in which case manufacturing costs can be reduced because a photomask is not used.

The formation of the resist mask by a photolithography method is performed in such a manner that a photosensitive resist is irradiated with light through a photomask and a portion of the resist which has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam.

With the use of the resist mask as a mask, part of the conductive layer is selectively removed. The removal (etching) of the part of the conductive layer can be performed by a dry etching method, a wet etching method, or both of them. After that, the resist mask is removed, so that the electrode 119 is formed (see FIG. 14A).

Note that a dry etching method such as ashing or a wet etching method using a dedicated stripper or the like can be employed for removal of the resist mask. Both a dry etching method and a wet etching method may be used.

Then, the insulating layer 142 is formed to cover the electrode 119. In this embodiment, silicon oxynitride is used for the insulating layer 142. Next, CMP treatment is performed to reduce unevenness of a surface of the insulating layer 142. The CMP treatment may be performed until a surface of the electrode 119 is exposed (see FIG. 14B).

Next, the insulating layer 143 is formed, the insulating layer 144 is formed over the insulating layer 143, and the insulating layer 145 is formed over the insulating layer 144. In this embodiment, silicon oxynitride is used for the insulating layer 143. Silicon oxynitride containing excess oxygen is used for the insulating layer 145. Hafnium oxide is used for the insulating layer 144 (see FIG. 14C).

Figure 14A:
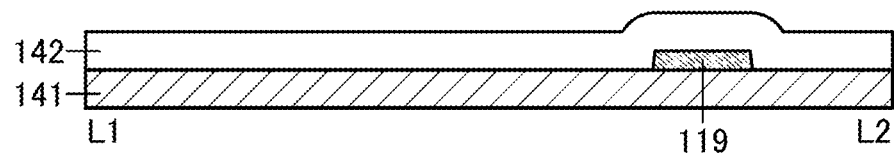
FIGS. 14A to 14D illustrate a manufacturing process of a semiconductor device of one embodiment of the present invention.
Figure 14B:
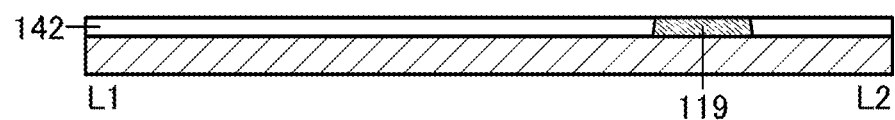
Figure 14C:
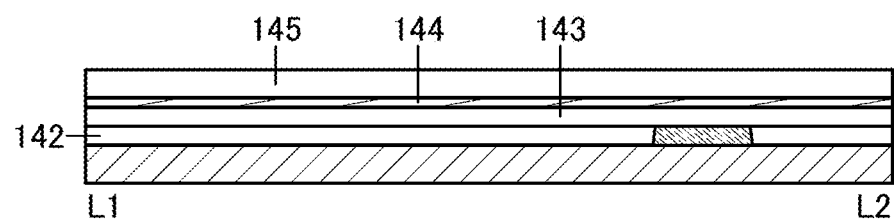
Figure 14D:
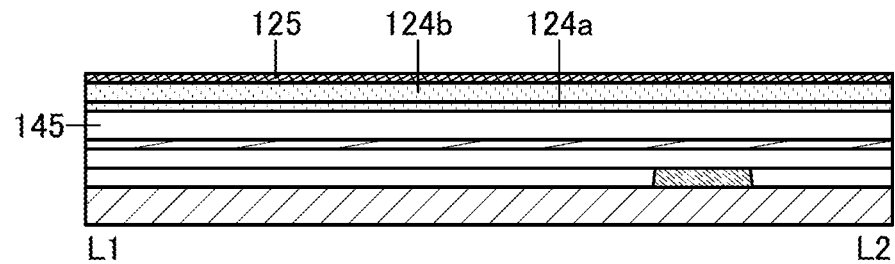

Then, a semiconductor layer 124a is formed over the insulating layer 145, a semiconductor layer 124b is formed over the semiconductor layer 124a, and a conductive layer 125 is formed over the semiconductor layer 124b (see FIG. 14D).

In this embodiment, as the semiconductor layer 124a, an oxide semiconductor containing In, Ga, and Zn is formed by a sputtering method using a target with an atomic ratio of In:Ga:Zn=1:3:4. As the semiconductor layer 124b, an oxide semiconductor containing In, Ga, and Zn is formed using a target with an atomic ratio of In:Ga:Zn=1:1:1. Note that after the semiconductor layer 124a is formed, oxygen doping treatment may be performed. After the semiconductor layer 124b is formed, oxygen doping treatment may be performed.

Next, heat treatment is preferably performed to reduce impurities such as moisture and hydrogen contained in the semiconductor layer 124a and the semiconductor layer 124b and to highly purify the semiconductor layer 124a and the semiconductor layer 124b.

For example, the semiconductor layer 124a and the semiconductor layer 124b are subjected to heat treatment in a reduced-pressure atmosphere, an inert gas atmosphere of nitrogen, a rare gas, or the like, an oxidizing gas atmosphere, or an ultra-dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert gas atmosphere refers to an atmosphere which contains the oxidizing gas at lower than 10 ppm and is filled with nitrogen or a rare gas.

By the heat treatment, at the same time that the impurities are released, oxygen contained in the insulating layer 145 is diffused to the semiconductor layer 124a and the semiconductor layer 124b and oxygen vacancies in the semiconductor layer 124a and the semiconductor layer 124b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The heat treatment may be performed at any time after the semiconductor layer 124a and the semiconductor layer 124b are formed. For example, the heat treatment may be performed after the formation of the oxide semiconductor layer 242a and the oxide semiconductor layer 242b.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

In this embodiment, the conductive layer 125 is formed of tungsten by a sputtering method.

Next, a resist mask is formed over the conductive layer 125 (not illustrated). The resist mask can be formed by a photolithography method, a printing method, an inkjet method, or the like as appropriate. The resist mask may be formed by a printing method, an inkjet method, or the like, in which case manufacturing costs can be reduced because a photomask is not used.

Figure 15A:
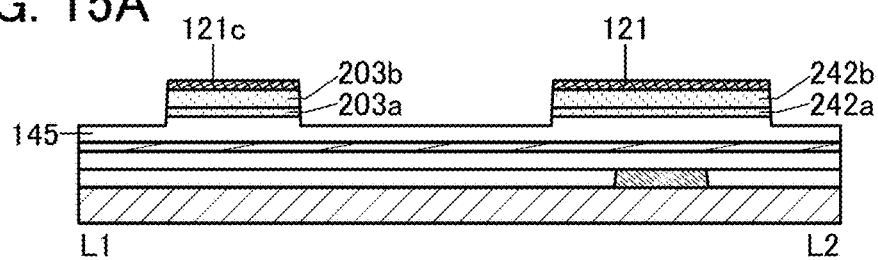
FIGS. 15A to 15D illustrate a manufacturing process of a semiconductor device of one embodiment of the present invention.

With the use of the resist mask as a mask, part of the conductive layer 125 is selectively removed to form the conductive layer 121 and the conductive layer 121c. In addition, with the use of the conductive layer 121 and the conductive layer 121c as masks, part of the semiconductor layer 124b and part of the semiconductor layer 124a are selectively removed. At this time, the insulating layer 145 might be partly removed, thereby having a projection. Note that the removal (etching) of the parts of the conductive layer 125, the semiconductor layer 124b, and the semiconductor layer 124a can be performed by a dry etching method, a wet etching method, or both of them. In this manner, the semiconductor layer 242a, the semiconductor layer 242b, the layer 203a, the layer 203b, the conductive layer 121, and the conductive layer 121c are formed (see FIG. 15A).

Figure 15B:
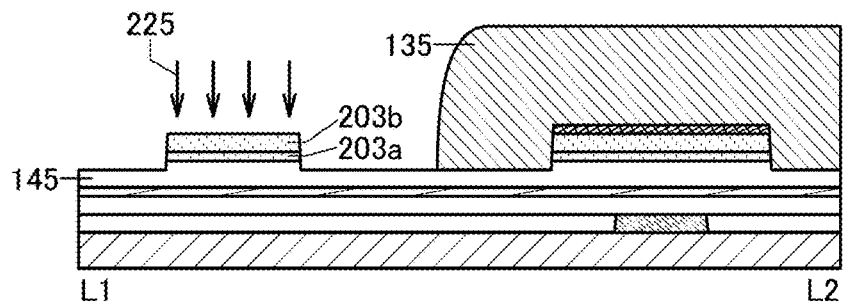

Next, a resist mask 135 is formed to cover the conductive layer 121, and the conductive layer 121c is removed (see FIG. 15B). Then, an impurity 225 may be introduced into the layer 203a and/or the layer 203b with the resist mask 135 left, to reduce the resistivities/resistivity of the layer 203a and/or the layer 203b. The introduction of the impurity 225 can be performed with an ion implantation apparatus, an ion doping apparatus, or a plasma treatment apparatus. The layer 203a and/or the layer 203b may be exposed to a plasma atmosphere of an inert gas or a nitrogen gas to reduce the resistivities/resistivity of the layer 203a and/or the layer 203b. After that, the resist mask is removed.

Next, the insulating layer 127 is formed. In this embodiment, silicon oxynitride is deposited by a plasma CVD method as the insulating layer 127. After the insulating layer 127 is formed, heat treatment may be performed to further reduce impurities such as moisture and hydrogen contained in the insulating layer 127. Note that the insulating layer 127 may contain excess oxygen. The insulating layer 127 may be subjected to oxygen doping treatment.

Figure 15C:
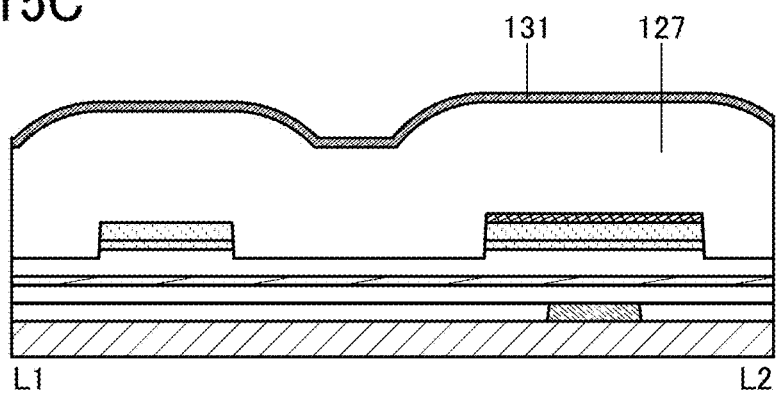
Figure 15D:
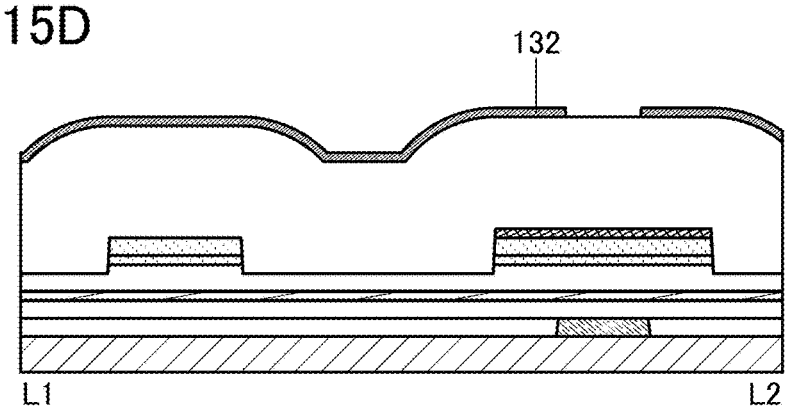

Next, tungsten is formed as a layer 131 over the insulating layer 127 (see FIG. 15C). Part of the layer 131 is selectively removed using a photolithography process, an etching process, and/or the like to form a hard mask 132 (see FIG. 15D).

Figure 16A:
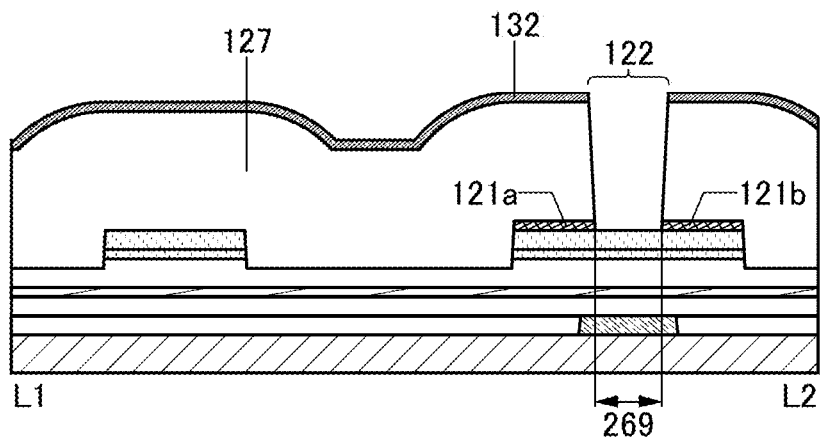
FIGS. 16A to 16C illustrate a manufacturing process of a semiconductor device of one embodiment of the present invention.

Then, with the use of the hard mask 132 as a mask, part of the insulating layer 127 is selectively removed to form an opening 122 (see FIG. 16A). The opening 122 is preferably formed by an anisotropic dry etching method so as to have a high aspect ratio (here, the ratio of the depth of the opening 122 to the width of the opening 122).

When the opening 122 is formed, a region of the conductive layer 121 which overlaps with the opening 122 is removed to form the electrode 121a and the electrode 121b. As described above, the region 269 of the semiconductor layer 242b that is sandwiched between the electrode 121a and the electrode 121b can function as a channel formation region. Thus, the region 269 overlaps with the opening 122. Furthermore, in the region 269, the top and side surfaces of the semiconductor layer 242b and the side surfaces of the semiconductor layer 242a are exposed. Depending on etching conditions, these exposed portions might be etched.

In the case where the opening 122 is formed by a dry etching method, an impurity element such as a residual component of the etching gas might be attached to the exposed top surface of the oxide semiconductor layer 242b and the exposed side surfaces of the oxide semiconductor layers 242a and 242b. For example, when a chlorine-based gas is used as the etching gas, chlorine or the like might be attached. When a hydrocarbon-based gas is used as the etching gas, carbon, hydrogen, or the like might be attached.

Therefore, the impurity element attached to the exposed top and side surfaces of the semiconductor layers is preferably reduced after the opening 122 is formed. The impurity may be reduced by, for example, cleaning treatment using a dilute hydrofluoric acid or the like, cleaning treatment using ozone or the like, or cleaning treatment using ultraviolet light or the like. Note that a plurality of types of cleaning treatment may be used in combination.

Figure 16B:
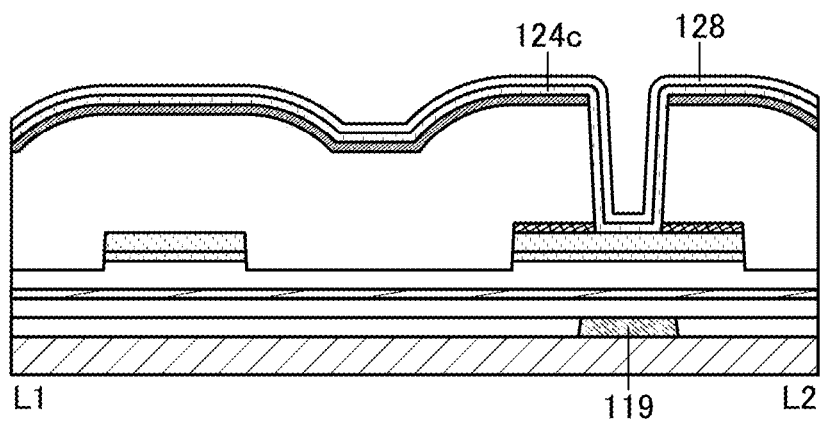

Next, a semiconductor layer 124c is formed over the oxide semiconductor layer 242b and the hard mask 132, and an insulating layer 128 is formed over the semiconductor layer 124c. In this embodiment, an oxide semiconductor containing In, Ga, and Zn is used for the semiconductor layer 124c as used for the oxide semiconductor layer 242a. Silicon oxynitride is deposited as the insulating layer 128 by a plasma CVD method (see FIG. 16B). The semiconductor layer 124c may be subjected to oxygen doping treatment. Note that the insulating layer 128 may contain excess oxygen. The insulating layer 128 may be subjected to oxygen doping treatment.

The semiconductor layer 124c is formed along the bottom and side surfaces of the opening 122. The top and side surfaces of the semiconductor layer 242b and the side surfaces of the semiconductor layer 242a are covered with the semiconductor layer 124c.

Covering the side surfaces of the semiconductor layer 242a and the semiconductor layer 242b with the semiconductor layer 124c can reduce diffusion of impurity elements generated in formation of the insulating layer 128 into the semiconductor layer 242a and the semiconductor layer 242b.

Figure 16C:
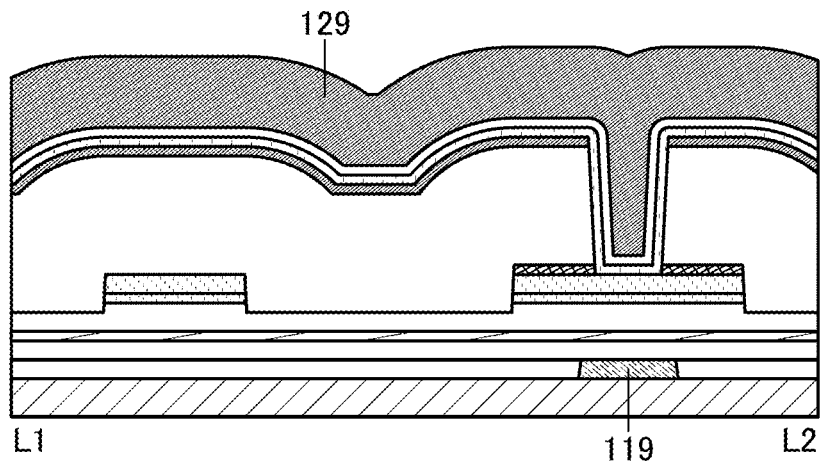

Next, a conductive layer 129 for forming the electrode 246 is provided over the insulating layer 128 (see FIG. 16C). In this embodiment, a stack of titanium nitride and tungsten is used as the conductive layer 129. Specifically, titanium nitride is deposited over the insulating layer 128, and then, tungsten is deposited over titanium nitride. The conductive layer 129 is preferably formed by, for example, an MOCVD method or the like. By using an MOCVD method or the like to form a conductor on a formation surface, the conductor can fill a depressed portion of the formation surface which has a high aspect ratio.

Figure 17A:
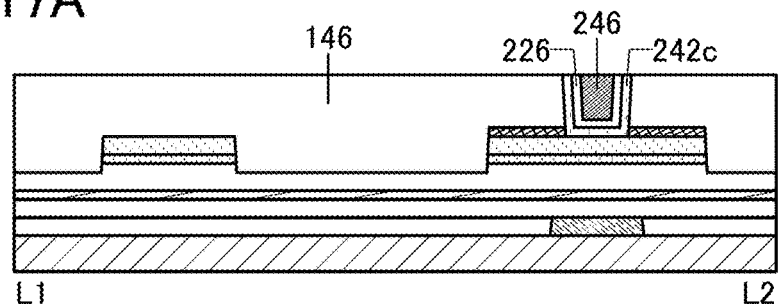
FIGS. 17A to 17D illustrate a manufacturing process of a semiconductor device of one embodiment of the present invention.

Next, a sample surface is subjected to chemical mechanical polishing (CMP) treatment (see FIG. 17A). By the CMP treatment, parts of the conductive layer 129, the insulating layer 128, the semiconductor layer 124c, and the insulating layer 127 are removed to form the electrode 246, the insulating layer 226, the semiconductor layer 242c, and the insulating layer 146. In this manner, the electrode 246 can be formed using a damascene process.

Figure 17B:
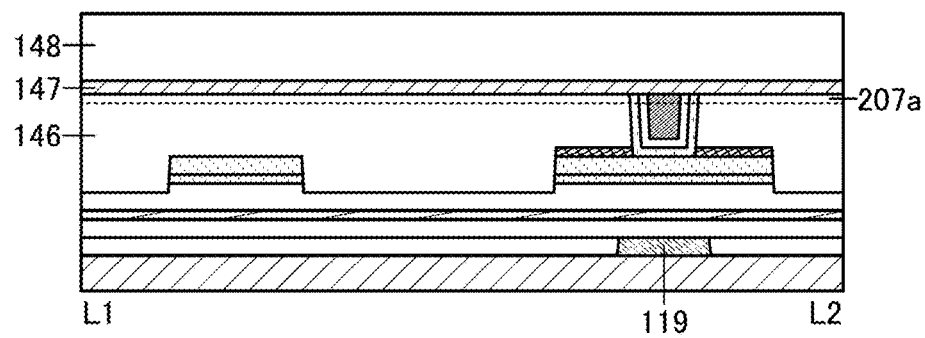

Next, the insulating layer 147 is formed over the electrode 246, the insulating layer 226, the semiconductor layer 242c, and the insulating layer 146 (see FIG. 17B). In this embodiment, aluminum oxide is deposited as the insulating layer 147 by a sputtering method. At that time, part of oxygen used as a sputtering gas is introduced into the insulating layer 146, whereby a region 207a containing excess oxygen is formed.

By performing heat treatment after forming the insulating layer 147, part of oxygen (excess oxygen) contained in the region 207a can be introduced into the oxide semiconductor layer. Note that in the case where an insulating layer containing excess oxygen is formed as the insulating layer 146, part of oxygen contained in the insulating layer 146 can be introduced into the oxide semiconductor layer by performing heat treatment after forming the insulating layer 147.

When insulating layers which are formed using aluminum oxide or the like and through which impurities do not easily pass are provided over and under the transistor 211, impurity diffusion into the transistor 211 from the outside can be prevented, the operation of the transistor 211 can be stabilized, and the reliability thereof can be improved. In addition, when the insulating layers of aluminum oxide or the like through which oxygen does not easily pass are provided over and under the transistor 211, oxygen release can be prevented. Thus, the operation of the transistor 211 can be stabilized, and the reliability thereof can be improved. In addition, the electrical characteristics of the transistor can be improved.

Next, the insulating layer 148 is formed over the insulating layer 147. In this embodiment, silicon oxynitride is deposited as the insulating layer 148 by a plasma CVD method (see FIG. 17B).

Figure 17C:
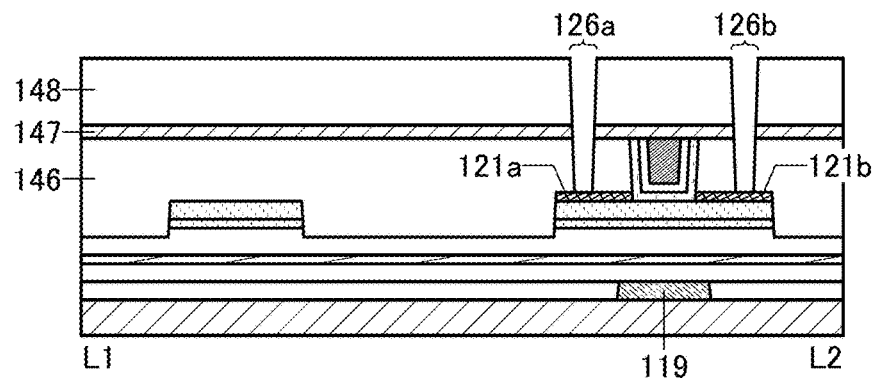

Next, parts of the insulating layer 148, the insulating layer 147, and the insulating layer 146 are selectively removed using a photolithography process, an etching process, and/or the like to form an opening 126a and an opening 126b (see FIG. 17C). The opening 126a overlaps with part of the electrode 121a. The opening 126b overlaps with part of the electrode 121b.

Figure 17D:
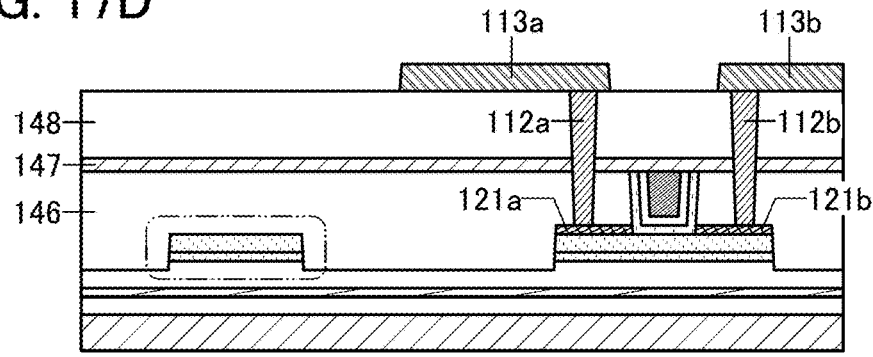

Then, the contact plug 112a and the contact plug 112b are formed in the opening 126a and the opening 126b, respectively (see FIG. 17D). The contact plug 112a and the contact plug 112b can be formed in a manner similar to that of the electrode 246.

A conductive layer is formed over the insulating layer 148, and part of the conductive layer is selectively removed using a photolithography process, an etching process, and/or the like to form the electrode 113a and the electrode 113b. The electrode 113a is electrically connected to the electrode 121a through the contact plug 112a. The electrode 113b is electrically connected to the electrode 121b through the contact plug 112b (see FIG. 17D).

Figure 18A:
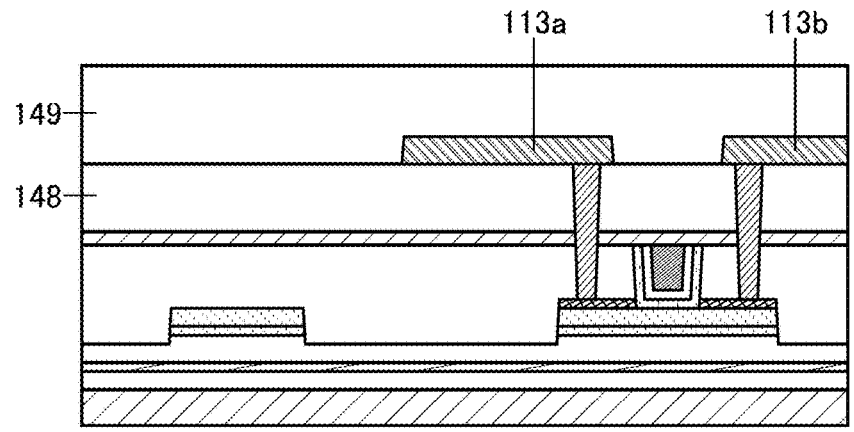
FIGS. 18A to 18C illustrate a manufacturing process of a semiconductor device of one embodiment of the present invention.

Then, the insulating layer 149 is formed over the insulating layer 148, the electrode 113a, and the electrode 113b (see FIG. 18A).

Figure 18B:
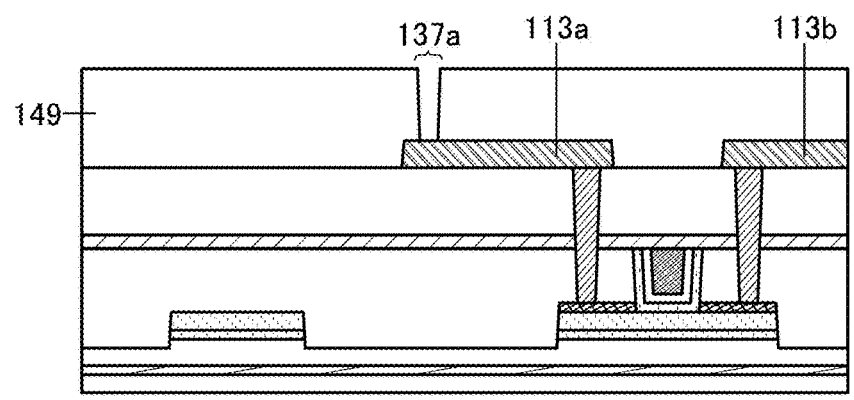

Next, part of the insulating layer 149 is selectively removed using a photolithography process, an etching process, and/or the like to form an opening 137a (see FIG. 18B). The opening 137a overlaps with part of the electrode 113a.

Figure 18C:
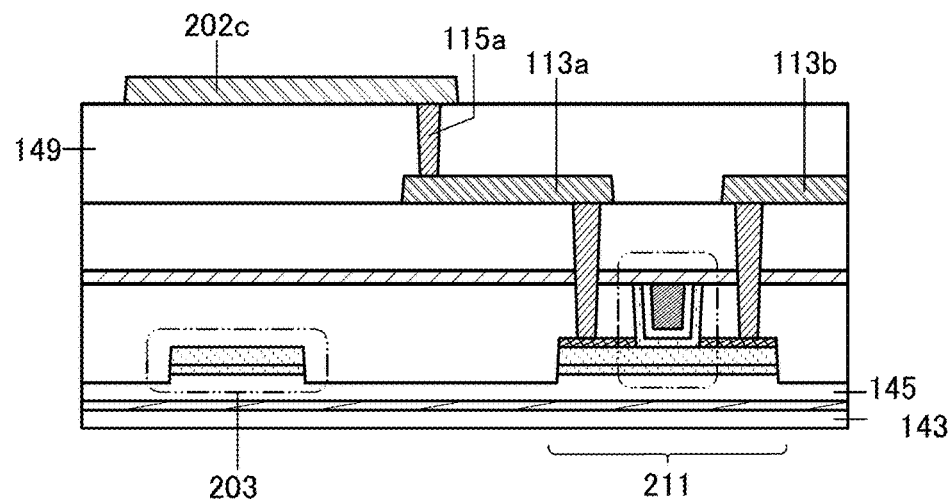

Then, the contact plug 115a is formed in the opening 137a (see FIG. 18C). The contact plug 136a can be formed in a manner similar to that of the electrode 246.

Next, a conductive layer is formed over the insulating layer 149, and part of the conductive layer is selectively removed using a photolithography process, an etching process, and/or the like to form the pad 202c. The pad 202c is electrically connected to the electrode 113a through the contact plug 115a (see FIG. 18C).

In this manner, the transistor 211 and the guard layer 203 can be manufactured. By the manufacturing method described in this embodiment, the positions of the electrodes 121a and 121b and the opening 122 are determined in a self-aligned manner. The electrode 246 is formed in the opening 122. In other words, the locations of the electrode 246 functioning as a gate electrode, the electrode 121a functioning as one of a source and a drain, and the electrode 121b functioning as the other of the source and the drain are determined in a self-aligned manner. Thus, the transistor manufactured by the manufacturing method described in this embodiment can also be referred to as a self-aligned (SA) s-channel FET, a trench-gate s-channel FET, or a trench-gate self-aligned (TGSA) FET.

This embodiment can be implemented in combination with any of the structures described in the other embodiments, as appropriate.

Embodiment 3

In the case where the transistor 211 illustrated in the plan views of FIGS. 7A and 7B to FIGS. 10A and 10B is fabricated as a test element group (TEG) and the electric characteristics thereof are measured, the transistor 211 is fabricated first, and then the pads 202a to 202d are fabricated.

The measurement of the electric characteristics is performed with a measurement probe or the like connected to the pads 202a to 202d. The pads 202a to 202d are provided for respective terminals of the transistor 211 (a gate terminal (G), a source terminal (S), a drain terminal (D), and a back gate terminal (B)). The pads 202a to 202d are preferably as large as possible for easy connection between the measurement probe or the like and each of the pads 202a to 202d.

When the pads 202a to 202d are large, however, charge is easily accumulated in the pads 202a to 202d in the fabrication process thereof. Excessive charge accumulation in any of the pads 202a to 202d results in application of an excessive voltage between the terminals of the transistor 211; thus, the transistor 211 is easily damaged by ESD. Furthermore, depending on the level of electric damage due to ESD, the transistor 211 might be completely broken.

Figure 19A:
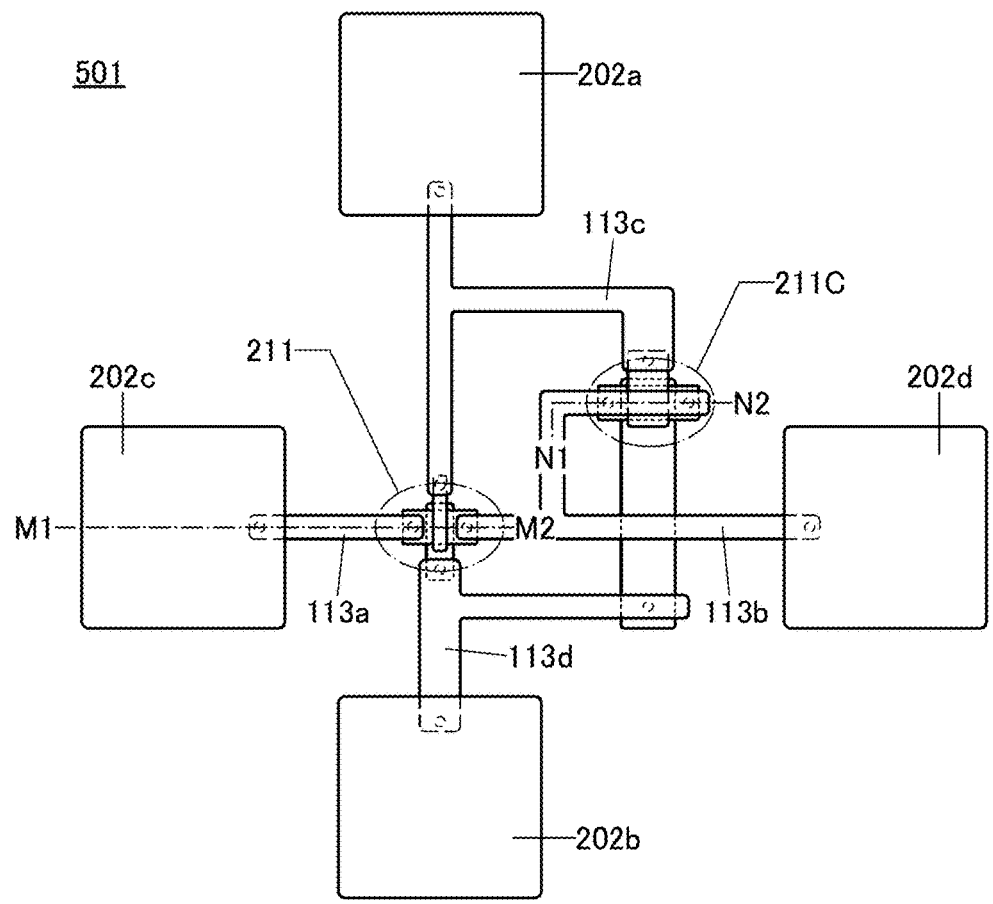
FIGS. 19A and 19B are a top view and an equivalent circuit diagram of a semiconductor device of one embodiment of the present invention.

In particular, the sizes of the pads 202a to 202d are larger than that of the transistor 211 as illustrated in FIG. 19A, the transistor 211 is easily damaged and broken. For this reason, in the case where electric characteristics are measured using a TEG having a pad with a size larger than that of a transistor, a protective circuit for protecting the transistor 211 from electric damage is preferably provided.

An example of an effective structure of the protective circuit can be obtained by additionally providing a capacitor between the gate terminal and the back gate terminal of the transistor 211. Even when charge excessively accumulates in the pad connected to the gate terminal, for example, the capacitor can suppress an increase in voltage, reducing electric damage to the transistor 211. Accordingly, the transistor 211 is less likely to be broken.

Another example of an effective structure of the protective circuit can be obtained by additionally providing diodes between the gate terminal and the back gate terminal of the transistor 211 and between the source terminal and the back gate terminal thereof. Even when charge excessively accumulates in the pad connected to the gate terminal, for example, the diodes can release charge, thereby suppressing an increase in voltage. Accordingly, the transistor 211 is less likely to be broken.

In this embodiment, a configuration example in which the protective circuit is connected to the transistor 211 so that breakage of or damage to the transistor 211 due to ESD is prevented or reduced will be described with reference to drawings. It is important to connect the protective circuit to the transistor 211 before the fabrication of the pads 202a to 202d.

<Configuration Example 1 of Protective Circuit>

Figure 19B:
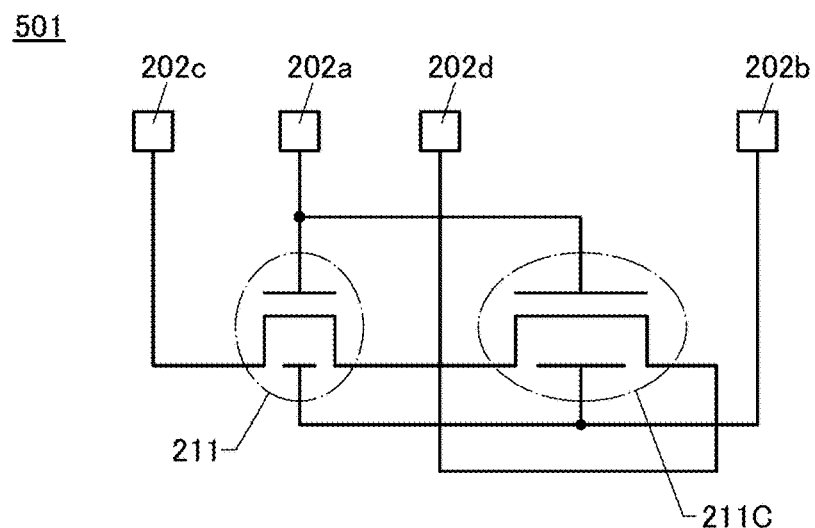
Figure 20:
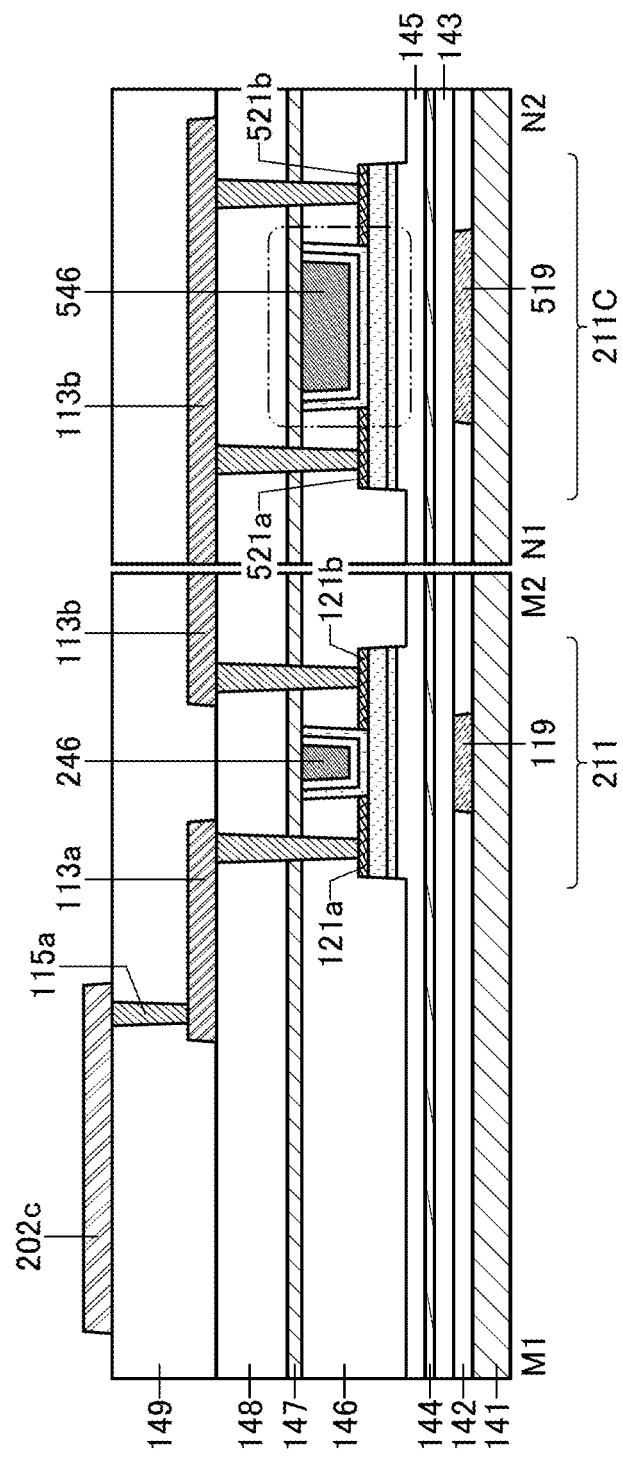
FIG. 20 is a cross-sectional view of a semiconductor device of one embodiment of the present invention.

First, an example of using a capacitor as the protective circuit will be described. In this embodiment, for example, gate capacitance of a transistor is used as a capacitor. FIG. 19A is a top view illustrating a connection example of the transistor 211, the pads 202a to 202d, and the capacitor. FIG. 19B is an equivalent circuit diagram of FIG. 19A. FIG. 20 is a cross-sectional view along the dashed-dotted lines M1-M2 and N1-N2 in FIG. 19A.

The electrode 246 (gate electrode) of the transistor 211 is electrically connected to the pad 202a through the electrode 113c. The electrode 119 (back gate electrode) of the transistor 211 is electrically connected to the pad 202b through the electrode 113d. The electrode 121a (one of a source electrode and a drain electrode) of the transistor 211 is electrically connected to the pad 202c through the electrode 113a. The electrode 121b (the other of the source electrode and the drain electrode) is electrically connected to the pad 202d through the electrode 113b.

An electrode 546 (gate electrode) of a transistor 211C is electrically connected to the electrode 246 of the transistor 211 through the electrode 113c. An electrode 519 (back gate electrode) of the transistor 211C is electrically connected to the electrode 119 of the transistor 211 through the electrode 113d. An electrode 521a (one of a source electrode and a drain electrode) and an electrode 521b (the other of the source electrode and the drain electrode) of the transistor 211C are electrically connected to the pad 202d through the electrode 113b. The electrode 546 can be formed using a material and a method that are similar to those for the electrode 246. The electrode 521a and the electrode 521b can be formed using a material and a method that are similar to those for the electrode 121a.

The transistor 211C can be formed using a material and a method that are similar to those for the transistor 211 through the same process as the transistor 211. Thus, the pads 202a to 202d are formed after the transistor 211C serving as a capacitor is electrically connected to the transistor 211 (see FIG. 20).

Note that providing the capacitor for the transistor 211 can prevent or reduce breakage of or damage to the transistor 211 due to ESD even after completion of the fabrication of the pads 202a to 202d as well as in the fabrication thereof.

<Configuration Example 2 of Protective Circuit>

Figure 21A:
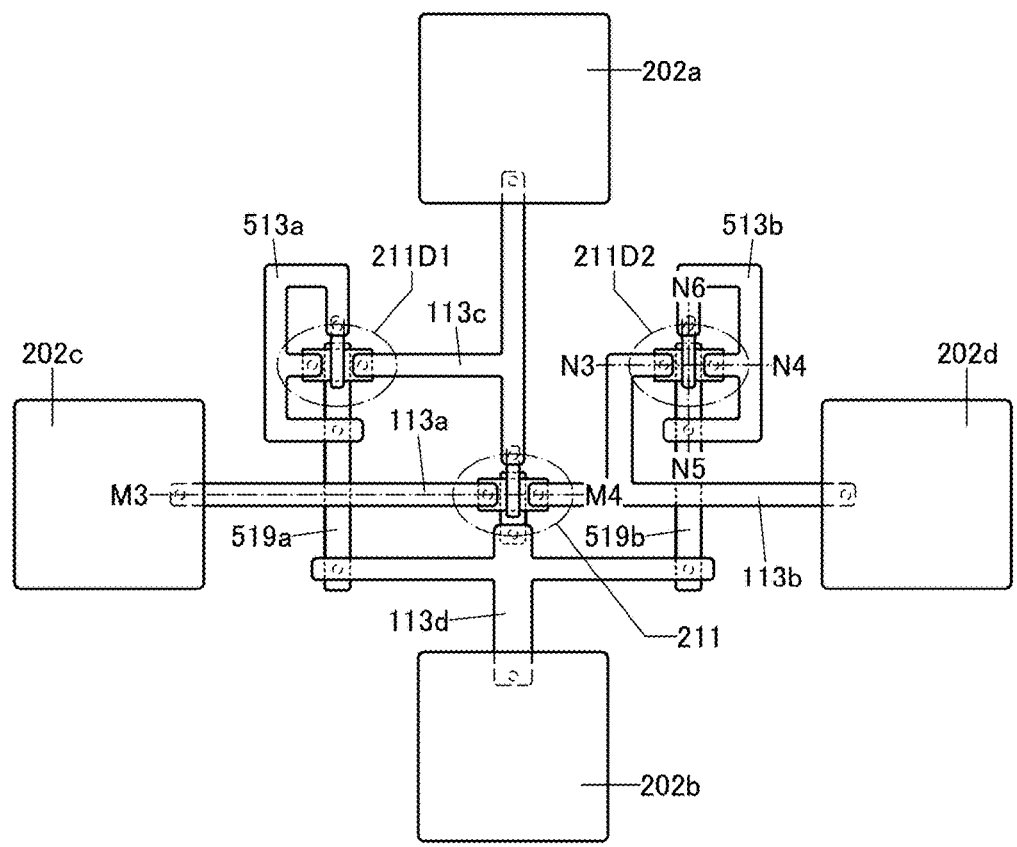
FIGS. 21A and 21B are a top view and an equivalent circuit diagram of a semiconductor device of one embodiment of the present invention.
Figure 21B:
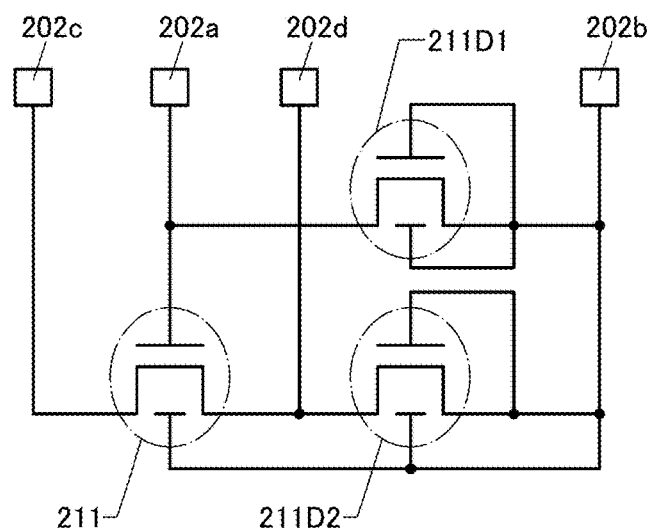

Next, an example of using diodes as the protective circuit will be described. In this embodiment, for example, diode-connected transistors are used as diodes. FIG. 21A is a top view illustrating a connection example of the transistor 211, the pads 202a to 202d, and the diodes. FIG. 21B is an equivalent circuit diagram of FIG. 21A. FIGS. 22A and 22B are cross-sectional views along the dashed-dotted lines M3-M4, N3-N4, and N5-N6 in FIG. 21A.

The electrode 246 (gate electrode) of the transistor 211 is electrically connected to the pad 202a through the electrode 113c. The electrode 119 (back gate electrode) of the transistor 211 is electrically connected to the pad 202b through the electrode 113d. The electrode 121a (one of a source electrode and a drain electrode) of the transistor 211 is electrically connected to the pad 202c through the electrode 113a. The electrode 121b (the other of the source electrode and the drain electrode) is electrically connected to the pad 202d through the electrode 113b.

An electrode 546a (gate electrode whose reference numeral is not shown) of a transistor 211D1 is electrically connected to an electrode 519a (back gate electrode) of the transistor 211D1 through an electrode 513a. The electrode 519a of the transistor 211D1 is electrically connected to the electrode 119 of the transistor 211 through the electrode 113d. An electrode 521c (one of a source electrode and a drain electrode whose reference numeral is not shown) of the transistor 211D1 is electrically connected to the electrode 513a. An electrode 521d (the other of the source electrode and the drain electrode whose reference numeral is not shown) of the transistor 211D1 is electrically connected to the electrode 113c.

An electrode 546b (gate electrode) of a transistor 211D2 is electrically connected to an electrode 519b (back gate electrode) of the transistor 211 D2 through the electrode 513b. The electrode 519b of the transistor 211D2 is electrically connected to the electrode 119 of the transistor 211 through the electrode 113d. An electrode 521e (one of a source electrode and a drain electrode) of the transistor 211D2 is electrically connected to the electrode 121b through the electrode 113b. An electrode 521f (the other of the source electrode and the drain electrode) of the transistor 211D2 is electrically connected to the electrode 519b (back gate electrode) of the transistor 211D2 through the electrode 513b. The electrode 546a and the electrode 546b can be formed using a material and a method that are similar to those for the electrode 246. The electrodes 521c to 521f can be formed using a material and a method that are similar to those for the electrode 121a.

The transistors 211D1 and 211D2 can be formed using a material and a method that are similar to those for the transistor 211 through the same process as the transistor 211. Thus, the pads 202a to 202d are formed after the transistors 211D1 and 211D2 serving as diodes are electrically connected to the transistor 211 (see FIG. 22A).

Note that providing the diodes for the transistor 211 can prevent or reduce breakage of or damage to the transistor 211 due to ESD even after completion of the fabrication of the pads 202a to 202d as well as in the fabrication thereof.

This embodiment can be implemented in combination with any of the structures described in the other embodiments, as appropriate.

Embodiment 4

<Structural Example of Transistor>

This embodiment describes a structural example of a transistor that can be used for the transistors 201 and 211 described in the above embodiments. A transistor with any of various structures, such as a bottom-gate transistor or a top-gate transistor, can be used as the transistor.

To understand a portion that is not explained in this embodiment, the other embodiments can be referred to.

FIG. 23A is a top view of the transistor 221. FIG. 23B is a cross-sectional view (in the channel length direction) along the dashed-dotted line L1-L2 in FIG. 23A. FIG. 23C is a cross-sectional view (in the channel width direction) along the dashed-dotted line W1-W2 in FIG. 23A.

In the transistor 221, the semiconductor layer 242b is formed over the semiconductor layer 242a, and the semiconductor layer 242c covers the semiconductor layer 242a and the semiconductor layer 242b. The transistor 221 includes the electrode 246 capable of functioning as a gate electrode and the electrode 119 capable of functioning as a back gate electrode.

In the transistor 221, a stack of the semiconductor layer 242a and the insulating layer 226 are processed to have an island shape after formation of the electrode 121a and the electrode 121b. The electrode 246 is formed over the insulating layer 226, and the insulating layer 146 is formed to cover the electrode 246. The transistor 221 is an s-channel transistor.

Figure 24A:
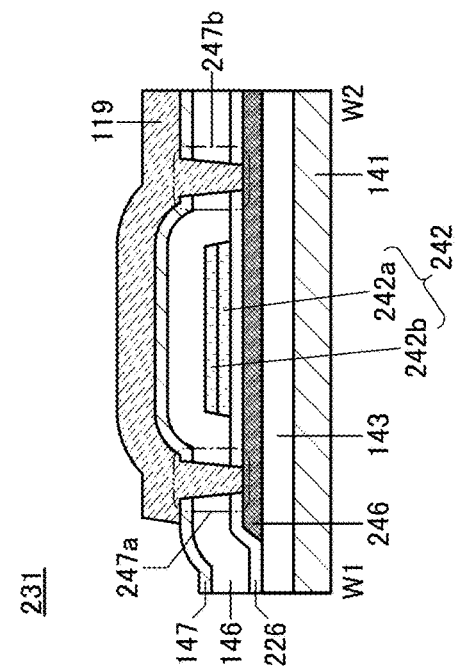
FIGS. 24A to 24C illustrate a semiconductor device of one embodiment of the present invention.
Figure 24B:
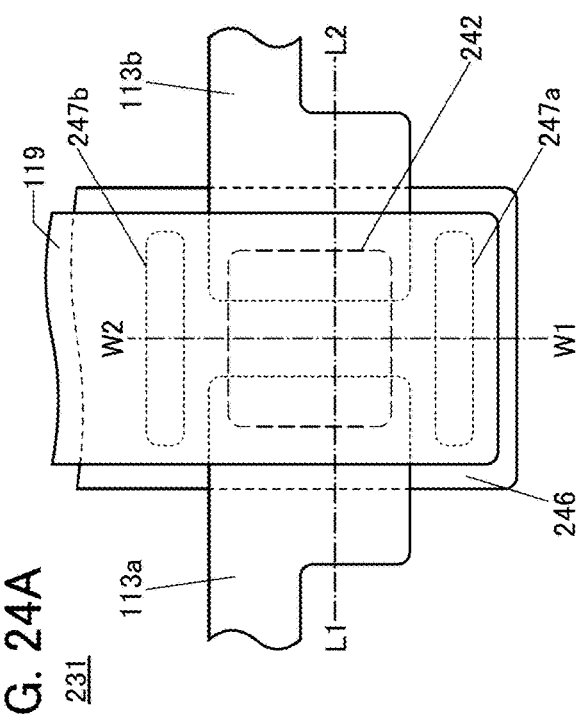
Figure 24C:
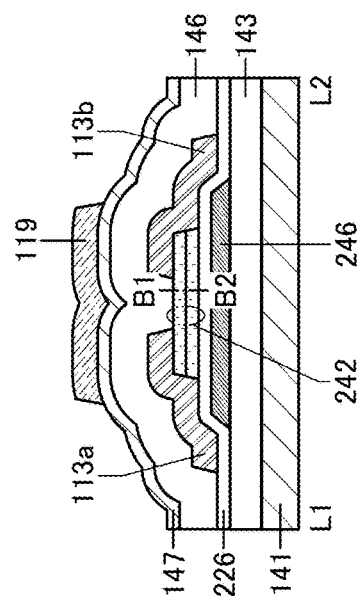

FIG. 24A is a top view of the transistor 231. FIG. 24B is a cross-sectional view (in the channel length direction) along the dashed-dotted line L1-L2 in FIG. 24A. FIG. 24C is a cross-sectional view (in the channel width direction) along the dashed-dotted line W1-W2 in FIG. 24A.

The transistor 231 is a kind of bottom-gate transistor including a back gate electrode. In the transistor 231, the electrode 246 is formed over the insulating layer 143, and the insulating layer 226 is provided to cover the electrode 246. The semiconductor layer 242 is formed in a region that is over the insulating layer 226 and overlaps with the electrode 246. In the semiconductor layer 242 included in the transistor 231, the semiconductor layer 242a and the semiconductor layer 242b are stacked.

The electrode 113a and the electrode 113b are formed over the insulating layer 226 so as to be in contact with part of the semiconductor layer 242. The insulating layer 146 is formed over the electrode 113a and the electrode 113b so as to be in contact with part of the semiconductor layer 242. The insulating layer 147 is formed over the insulating layer 146. The electrode 119 is formed in a region that is over the insulating layer 147 and overlaps with the semiconductor layer 242.

The electrode 119 provided over the insulating layer 147 is electrically connected to the electrode 246 in an opening 247a and an opening 247b formed in the insulating layer 226, the insulating layer 146, and the insulating layer 147. Thus, the electrode 119 and the electrode 246 are supplied with an equal potential. Either or both of the openings 247a and 247b may be omitted. In the case where neither the opening 247a nor the opening 247b is provided, different potentials can be supplied to the electrodes 119 and 246.

[Energy Band Structure of Semiconductor Layer 242]

FIG. 25B illustrates the energy band structure of a portion along the dashed dotted line B1-B2 in FIG. 24B. In other words, FIG. 25B illustrates the energy band structure of a channel formation region of the transistor 231.

In FIG. 25B, Ec384 indicates the energy of the conduction band minimum of the insulating layer 146. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

One embodiment of the present invention can provide a transistor with favorable electrical characteristics. Another embodiment of the present invention can provide a semiconductor device having a high degree of integration.

This embodiment can be implemented in combination with any of the structures described in the other embodiments, as appropriate.

Embodiment 5

In this embodiment, an example of a semiconductor circuit that can be provided in the circuit region 102 will be described. Note that the transistor 291 described in the above embodiment, or the like can be used as a p-channel transistor in this embodiment. Alternatively, the transistor 201 described in the above embodiment, or the like can be used as a p-channel transistor.

<Configuration Example of Semiconductor Circuit>

Figure 26A:
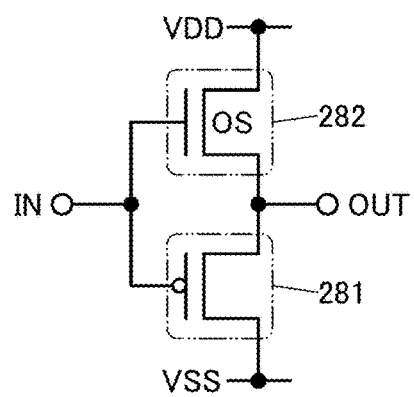
FIGS. 26A to 26C are circuit diagrams each illustrating a semiconductor device of one embodiment of the present invention.
Figure 26B:
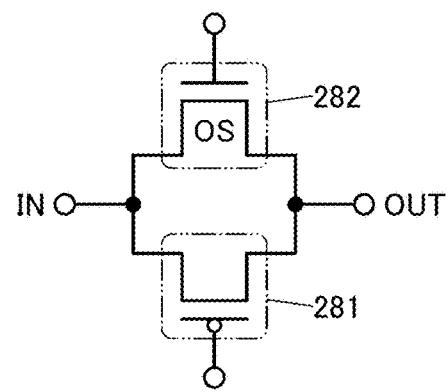
Figure 26C:
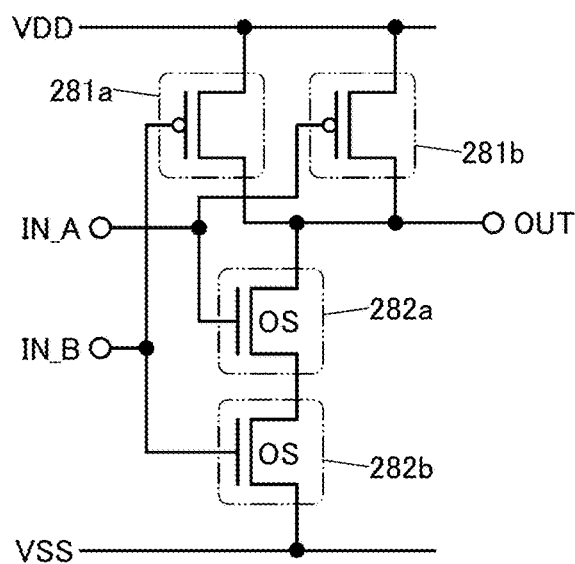

Any of a variety of semiconductor circuits, e.g., logic circuits such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integration circuit, a differentiation circuit, and a memory element can be provided in the circuit region 102. Note that these semiconductor circuits are included in the category of semiconductor devices. FIGS. 26A to 26C illustrate examples of semiconductor circuits.

The CMOS circuit illustrated in FIG. 26A has a configuration of an inverter circuit in which the p-channel transistor 281 and the n-channel transistor 282 are connected to each other in series and in which gates of the transistors are connected to each other.

The CMOS circuit illustrated in FIG. 26B has a configuration of an analog switch circuit in which the p-channel transistor 281 and the n-channel transistor 282 are connected to each other in parallel.

The CMOS circuit illustrated in FIG. 26C has a configuration of a NAND circuit including a transistor 281*a*, a transistor 281*b*, a transistor 282*a*, and a transistor 282*b*. A potential output from the NAND circuit depends on the combination of potentials input to an input terminal IN_A and an input terminal IN_B.

[Memory Device]

Figure 27A:
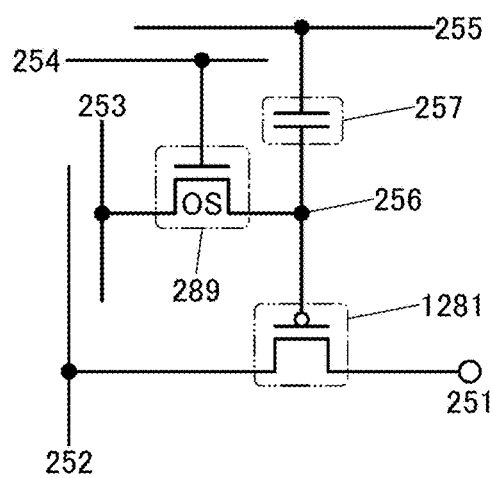
FIGS. 27A and 27B are each a circuit diagram of a semiconductor device of one embodiment of the present invention.
Figure 27B:
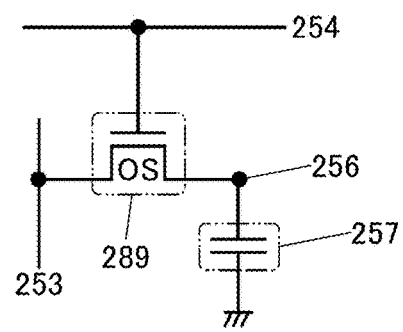

A memory device may be provided in the circuit region 102. FIGS. 27A and 27B each illustrate an example of a circuit that can be used for the memory device. The circuit illustrated in FIG. 27A has a configuration of a memory device in which one of a source and a drain of a transistor 289 is connected to a gate of a transistor 1281 and one electrode of a capacitor 257. The circuit illustrated in FIG. 27B has a configuration of a memory device in which one of the source and the drain of the transistor 289 is connected to one electrode of the capacitor 257.

In each of the circuits illustrated in FIGS. 27A and 27B, charge injected from the other of the source and the drain of the transistor 289 can be stored at a node 256. The transistor 289 is a transistor including an oxide semiconductor, which enables charge to be stored at the node 256 for a long period.

Although the transistor 1281 is a p-channel transistor in FIG. 27A, the transistor 1281 may be an n-channel transistor. For example, the transistor 281 or the transistor 282 may be used as the transistor 1281. A transistor including an oxide semiconductor in a semiconductor layer in which a channel is formed may also be used as the transistor 1281.

The semiconductor devices (memory devices) illustrated in FIGS. 27A and 27B will be described in detail here.

The semiconductor device illustrated in FIG. 27A includes the transistor 1281 using a first semiconductor, the transistor 289 using a second semiconductor, and the capacitor 257.

The transistor 289 is one of the transistors which include an oxide semiconductor and are disclosed in the above embodiment. Since the off-state current of the transistor 289 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 27A, a wiring 251 is electrically connected to one of a source and a drain of the transistor 1281, and a wiring 252 is electrically connected to the other of the source and the drain of the transistor 1281. A wiring 253 is electrically connected to one of the source and the drain of the transistor 289. A wiring 254 is electrically connected to a gate of the transistor 289. The gate of the transistor 1281, the other of the source and the drain of the transistor 289, and the one electrode of the capacitor 257 are electrically connected to the node 256. A wiring 255 is electrically connected to the other electrode of the capacitor 257.

The semiconductor device in FIG. 27A has a feature that the charge supplied to the node 256 can be retained, and thus enables writing, retaining, and reading of data as follows.

[Writing and Retaining Operations]

Writing and retaining of data will be described. First, the potential of the wiring 254 is set to a potential at which the transistor 289 is on. Accordingly, the potential of the wiring 253 is supplied to the node 256. That is, a predetermined charge is supplied to the node 256 (writing). Here, one of two kinds of charges providing different potential levels (hereinafter referred to as a "low-level charge" and a "high-level charge") is supplied. After that, the potential of the wiring 254 is set to a potential at which the transistor 289 is off. Thus, the charge is retained at the node 256.

Note that the high-level charge is a charge that supplies a higher potential to the node 256 than the low-level charge. In the case where the transistor 1281 is a p-channel transistor, each of the high-level and low-level charges is a charge that supplies a potential higher than the threshold voltage of the transistor. In the case where the transistor 1281 is an n-channel transistor, each of the high-level and low-level charges is a charge that supplies a potential lower than the threshold voltage of the transistor. In other words, each of the high-level and low-level charges is a charge that supplies a potential at which the transistor is off.

Since the off-state current of the transistor 289 is extremely low, the charge of the node 256 is retained for a long time.

[Reading Operation]

Next, reading of data will be described. A reading potential $V_R$ is supplied to the wiring 255 while a predetermined potential (a constant potential) different from the potential of the wiring 252 is supplied to the wiring 251, whereby data retained at the node 256 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 255 in a period during which data is not read is set to a potential higher than $V_H$ in the case where the transistor 1281 is a p-channel transistor, and is set to a potential lower than $V_L$ in the case where the transistor 1281 is an n-channel transistor.

For example, in the case where the transistor 1281 is a p-channel transistor, $V_R$ is −2 V when $V_{th}$ of the transistor 1281 is −2 V, $V_H$ is 1 V, and $V_L$ is −1 V. When the potential written to the node 256 is $V_H$ and $V_R$ is applied to the wiring 255, $V_R+V_H$, i.e., −1 V, is applied to the gate of the transistor 1281. Since −1 V is higher than $V_{th}$, the transistor 1281 is not turned on. Thus, the potential of the wiring 252 is not changed. When the potential written to the node 256 is $V_L$ and $V_R$ is applied to the wiring 255, $V_R+V_L$, i.e., −3 V, is applied to the gate of the transistor 1281. Since −3 V is lower than $V_{th}$, the transistor 1281 is turned on. Thus, the potential of the wiring 252 is changed.

In the case where the transistor 1281 is an n-channel transistor, $V_R$ is 2 V when $V_{th}$ of the transistor 1281 is 2 V, $V_H$ is 1 V, and $V_L$ is −1 V. When the potential written to the node 256 is $V_H$ and $V_R$ is applied to the wiring 255, $V_R+V_H$, i.e., 3 V, is applied to the gate of the transistor 1281. Since 3 V is higher than $V_{th}$, the transistor 1281 is turned on. Thus, the potential of the wiring 252 is changed. When the potential written to the node 256 is $V_L$ and $V_R$ is applied to the wiring 255, $V_R+V_L$, i.e., 1 V, is applied to the gate of the transistor 1281. Since 1 V is lower than $V_{th}$, the transistor 1281 is not turned on. Thus, the potential of the wiring 252 is not changed.

By determining the potential of the wiring 252, data retained at the node 256 can be read.

The semiconductor device in FIG. 27B is different from the semiconductor device in FIG. 27A in that the transistor 1281 is not provided. Also in this case, data can be written and retained in a manner similar to that of the semiconductor device in FIG. 27A.

Reading of data in the semiconductor device in FIG. 27B will be described. When a potential at which the transistor 289 is turned on is supplied to the wiring 254, the wiring 253 which is in a floating state and the capacitor 257 are brought into conduction, and the charge is redistributed between the wiring 253 and the capacitor 257. As a result, the potential of the wiring 253 is changed. The amount of change in the potential of the wiring 253 depends on the potential of the node 256 (or the charge accumulated in the node 256).

For example, the potential of the wiring 253 after the charge redistribution is $(C_B \times V_{B0}+C \times V)/(C_B+C)$, where V is the potential of the node 256, C is the capacitance of the capacitor 257, $C_B$ is the capacitance component of the wiring 253, and $V_{B0}$ is the potential of the wiring 253 before the charge redistribution. Thus, it can be found that, assuming that the memory cell is in either of two states in which the potential of the node 256 is $V_1$ and $V_0$ ($V_1>V_0$), the potential of the wiring 253 in the case of retaining the potential $V_1$ ($=(C_B \times V_{B0}+C \times V_1)/(C_B+C)$) is higher than the potential of the wiring 253 in the case of retaining the potential $V_0$ ($=(C_B \times V_{B0}+C \times V_0)/(C_B+C)$).

Then, by comparing the potential of the wiring 253 with a predetermined potential, data can be read.

When including a transistor using an oxide semiconductor and having an extremely low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, a high voltage is not needed for data writing and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

[CPU]

Figure 28:
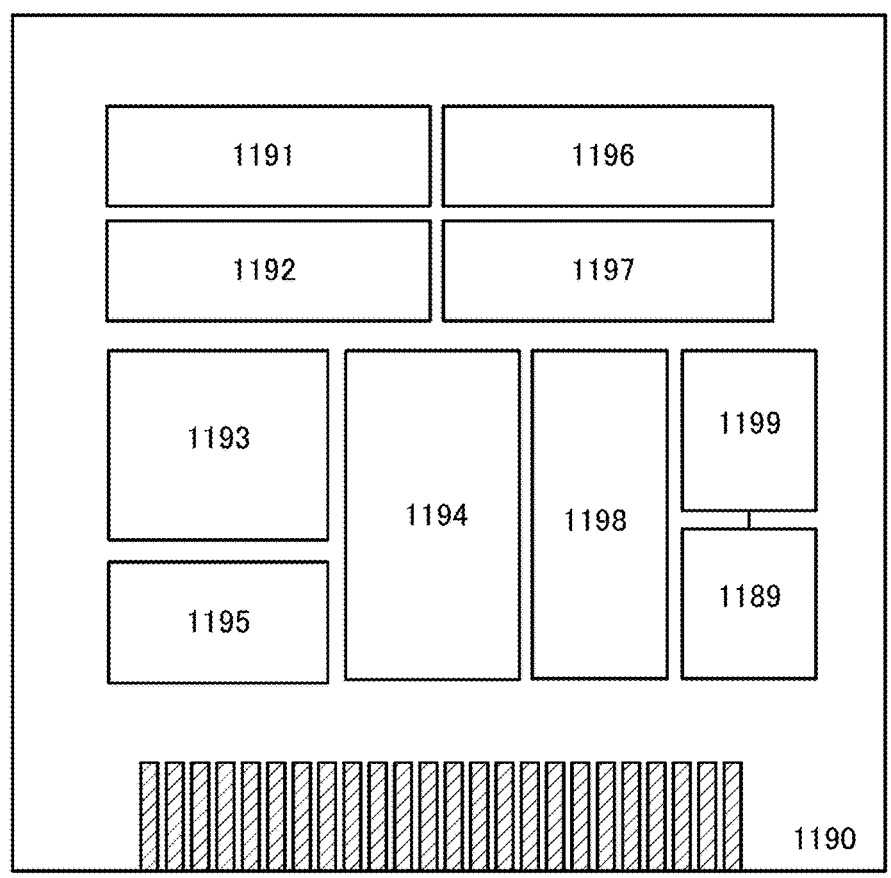
FIG. 28 is a block diagram illustrating a CPU configuration example.

A CPU may be provided in the circuit region 102. FIG. 28 is a block diagram illustrating a configuration example of the CPU.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration is simplified, and an actual CPU may have a variety of configurations depending on the application. For example, the CPU may have the following configuration: a structure including the CPU illustrated in FIG. 28 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 28, a memory cell is provided in the register 1196. For the memory cell of the register 1196, any of the above-described transistors, the above-described memory device, or the like can be used.

In the CPU illustrated in FIG. 28, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to a memory element in the register 1196. When data retaining by the capacitor is selected, the data is rewritten in the capacitor, and supply of the power supply voltage to the memory cell in the register 1196 can be stopped.

Figure 29:
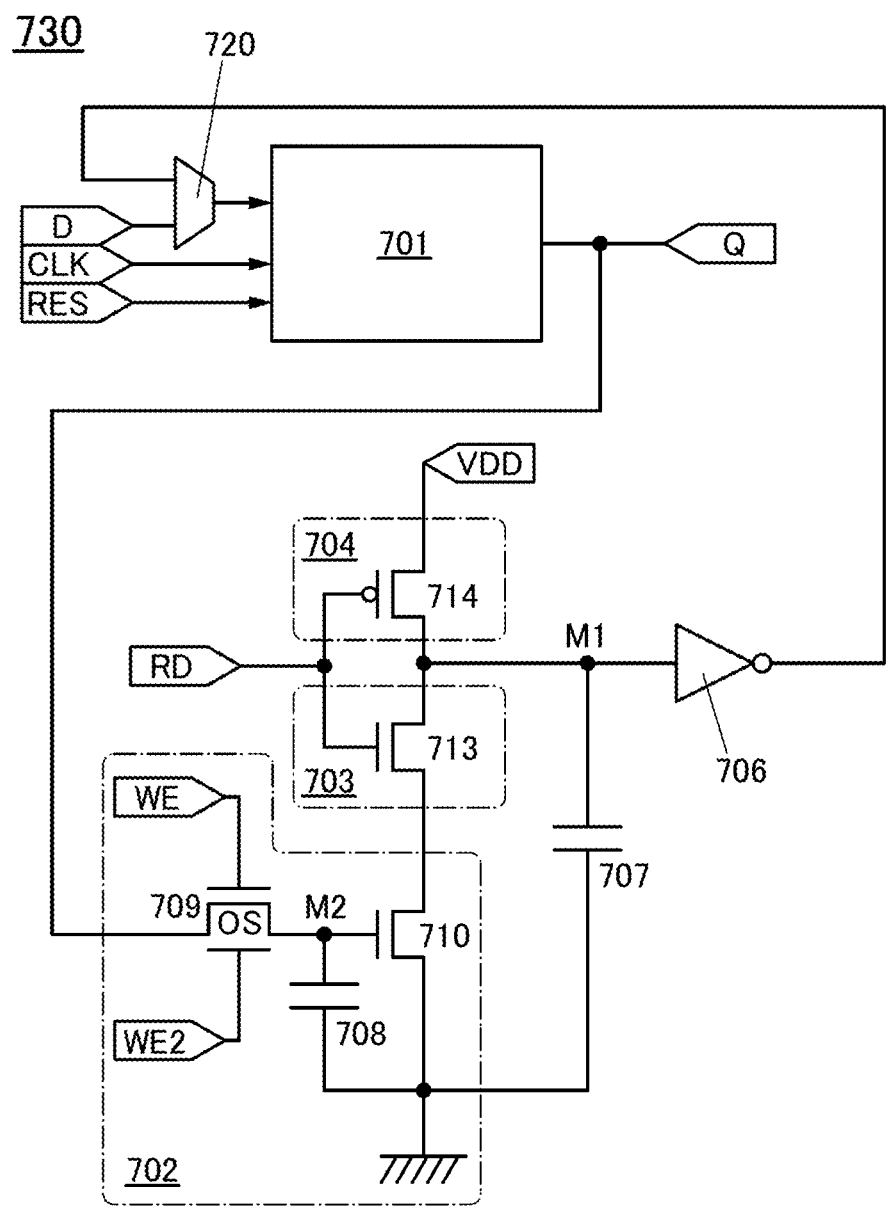
FIG. 29 is a circuit diagram illustrating an example of a memory element.

FIG. 29 is an example of a circuit diagram of a memory circuit that can be used as the register 1196. A memory element 730 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 730 may further include another element such as a diode, a resistor, or an inductor, as needed.

Here, the memory device described above can be used as the circuit 702. When supply of a power supply voltage to the memory element 730 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the conductivity type of the transistor 713 (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a wiring which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a wiring which can supply a power supply potential $V_{DD}$. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., $V_{DD}$). The other of the pair of electrodes of the capacitor 707 is electrically connected to the wiring which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., $V_{DD}$). The other of the pair of electrodes of the capacitor 708 is electrically connected to the wiring which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to a gate electrode of the transistor 709. As for each of the switch 703 and the switch 704, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data retained in the circuit 701 is input to the other of the source and the drain of the transistor 709. FIG. 29 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 29, a signal output from the second terminal of the switch 703 (the other of the source and the drain of the transistor 713) is input to the circuit 701 through the logic element 706 and the circuit 720; however, one embodiment of the present invention is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

As the transistor 709 in FIG. 29, the transistor 201, the transistor 211, or the like described in the above embodiment can be used. The control signal WE can be input to the gate electrode and a control signal WE2 can be input to the back gate electrode. The control signal WE2 is a signal having a constant potential. As the constant potential, for example, a ground potential GND or a potential lower than the source potential of the transistor 709 is selected. The control signal WE2 is a potential signal for controlling the threshold voltage of the transistor 709, and a drain current of the transistor 709 at a gate voltage of 0 V can be further reduced. Note that as the transistor 709, a transistor without a second gate may be used.

In FIG. 29, the transistors included in the memory element 730 except the transistor 709 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 730. Still alternatively, in the memory element 730, a transistor in which a channel is formed in an oxide semiconductor layer and a transistor in which a channel is formed in a layer formed using a semiconductor other than an oxide semiconductor or in the substrate 1190 can be used in combination as the transistors other than the transistor 709.

As the circuit 701 in FIG. 29, for example, a flip-flop circuit can be used. As the logic element 706, for example, an inverter or a clocked inverter can be used.

In a period during which the memory element 730 is not supplied with the power supply voltage, the semiconductor device of one embodiment of the present invention can retain data stored in the circuit 701 at the node M2 by the capacitor 708 which is provided in the circuit 702.

As described above, the off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 709, a signal retained by the capacitor 708 is retained for a long time also in a period during which the power supply voltage is not supplied to the memory element 730. The memory element 730 can accordingly retain the stored data also in a period during which the supply of the power supply voltage is stopped.

Since the switch 703 and the switch 704 are provided, the time required for the circuit 701 to retain original data again after the supply of the power supply voltage is restarted can be shortened.

In the circuit 702, a signal retained at the node M2 is input to the gate of the transistor 710. Therefore, after supply of the power supply voltage to the memory element 730 is restarted, the transistor 710 is turned on or off in accordance with the signal retained by the node M2 and the signal can be read from the circuit 702. Consequently, an original signal can be accurately read even when a potential corresponding to the signal retained at the node M2 varies to some degree.

By using the above-described memory element 730 for a memory device such as a register or a cache memory included in the CPU, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time at an increased frequency in the CPU or one or a plurality of logic circuits included in the CPU, resulting in lower power consumption.

Although the memory element 730 is used in a CPU in this embodiment, the memory element 730 can also be used in an LSI such as a digital signal processor (DSP), a custom LSI, or a programmable logic device (PLD), and a radio frequency identification (RF-ID).

[Imaging Device]

Figure 30A:
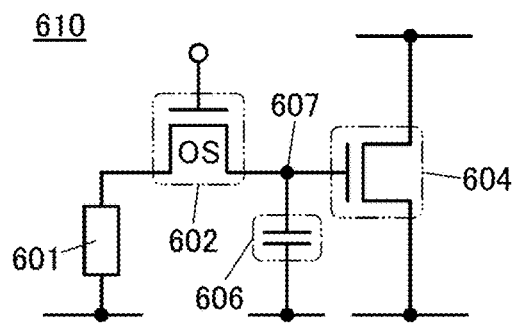
FIGS. 30A to 30C are each a circuit diagram illustrating an example of an imaging device.
Figure 30B:
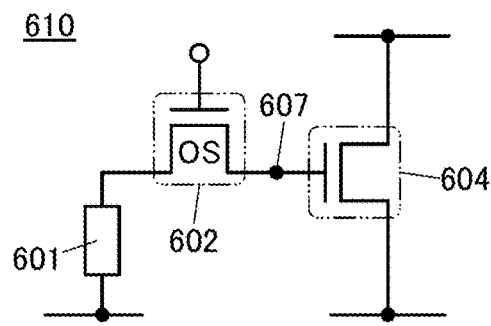
Figure 30C:
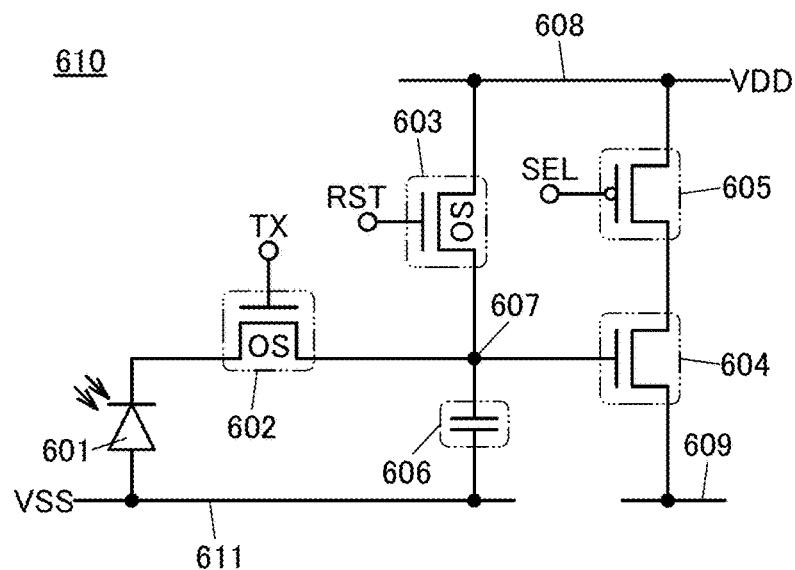

An imaging device may be provided in the circuit region 102. FIGS. 30A to 30C each illustrate an example of a circuit that can be used for an imaging device.

An imaging device 610 including the circuit illustrated in FIG. 30A includes a photoelectric conversion element 601, a transistor 602, a transistor 604, and a capacitor 606. One of a source and a drain of the transistor 602 is electrically connected to the photoelectric conversion element 601, and the other of the source and the drain of the transistor 602 is electrically connected to a gate of the transistor 604 through a node 607 (a charge accumulation portion).

An OS transistor is preferably used as the transistor 602. Since the off-state current of the OS transistor is extremely low, the capacitor 606 can be small. Alternatively, the capacitor 606 can be omitted as illustrated in FIG. 30B. Furthermore, when the transistor 602 is an OS transistor, the potential of the node 607 is less likely to be changed. Thus, an imaging device which is less likely to be affected by noise can be provided. Note that the transistor 604 may be an OS transistor.

A diode element formed using a silicon substrate with a PN junction or a PIN junction can be used as the photoelectric conversion element 601. Alternatively, a PIN diode element formed using an amorphous silicon film, a microcrystalline silicon film, or the like may be used. Alternatively, a diode-connected transistor may be used. Still alternatively, a variable resistor or the like utilizing a photoelectric effect may be formed using silicon, germanium, selenium, or the like.

The photoelectric conversion element may be formed using a material capable of generating charge by absorbing radiation. Examples of the material capable of generating charge by absorbing radiation include lead iodide, mercury iodide, gallium arsenide, CdTe, and CdZn.

In the imaging device 610 including the circuit illustrated in FIG. 30C, a photodiode is used as the photoelectric conversion element 601. The imaging device 610 illustrated in FIG. 30C includes the photoelectric conversion element 601, the transistor 602, a transistor 603, the transistor 604, a transistor 605, and the capacitor 606. One of the source and the drain of the transistor 602 is electrically connected to a cathode of the photoelectric conversion element 601. The other of the source and the drain of the transistor 602 is electrically connected to the node 607. An anode of the photoelectric conversion element 601 is electrically connected to a wiring 611. One of a source and a drain of the transistor 603 is electrically connected to the node 607. The other of the source and the drain of the transistor 603 is electrically connected to a wiring 608. The gate of the transistor 604 is electrically connected to the node 607. One of a source and a drain of the transistor 604 is electrically connected to a wiring 609. The other of the source and the drain of the transistor 604 is electrically connected to one of a source and a drain of the transistor 605. The other of the source and the drain of the transistor 605 is electrically connected to the wiring 608. One electrode of the capacitor 606 is electrically connected to the node 607. The other electrode of the capacitor 606 is electrically connected to the wiring 611.

The transistor 602 can function as a transfer transistor. A gate of the transistor 602 is supplied with a transfer signal TX. The transistor 603 can function as a reset transistor. A gate of the transistor 603 is supplied with a reset signal RST. The transistor 604 can function as an amplifier transistor. The transistor 605 can function as a selection transistor. A gate of the transistor 605 is supplied with a selection signal SEL. Moreover, $V_{DD}$ is supplied to the wiring 608 and $V_{SS}$ is supplied to the wiring 611.

Next, operations of the imaging device 610 including the circuit illustrated in FIG. 30C will be described. First, the transistor 603 is turned on so that $V_{DD}$ is supplied to the node 607 (reset operation). Then, the transistor 603 is turned off so that $V_{DD}$ is retained at the node 607. Next, the transistor 602 is turned on so that the potential of the node 607 is changed in accordance with the amount of light received by the photoelectric conversion element 601 (accumulation operation). After that, the transistor 602 is turned off so that the potential of the node 607 is retained. Next, the transistor 605 is turned on so that a potential corresponding to the potential of the node 607 is output to the wiring 609 (selection operation). Measuring the potential of the wiring 609 can determine the amount of light received by the photoelectric conversion element 601.

An OS transistor is preferably used as each of the transistors 602 and 603. Since the off-state current of the OS transistor is extremely low as described above, the capacitor 606 can be small or omitted. Furthermore, when the transistors 602 and 603 are OS transistors, the potential of the node 607 is less likely to be changed. Thus, an imaging device which is less likely to be affected by noise can be provided.

A high-resolution imaging device can be obtained when imaging devices 610 including any of the circuits illustrated in FIGS. 30A to 30C are arranged in a matrix.

For example, using the imaging devices 610 arranged in a 1920×1080 matrix, an imaging device can be obtained which can take an image with "full high definition" (also referred to as "2K resolution", "2K1K", "2K", and the like). Using the imaging devices 610 arranged in a 4096×2160 matrix, an imaging device can be obtained which can take an image with "ultra-high definition" (also referred to as "4K resolution", "4K2K", "4K", and the like). Using the imaging devices 610 arranged in a 8192×4320 matrix, an imaging device can be obtained which can take an image with "super high definition" (also referred to as "8K resolution", "8K4K", "8K", and the like). Using a larger number of imaging devices 610, an imaging device can be obtained which can take an image with 16K or 32K resolution.

This embodiment can be implemented in combination with the structures described in the other embodiments, as appropriate.

Embodiment 6

In this embodiment, examples in which the semiconductor device described in the above embodiment is used in an electronic component and examples of an electronic device including the electronic component will be described with reference to FIGS. 31A and 31B and FIGS. 32A and 32B. Note that the electronic component is also referred to as a semiconductor package or an IC package. The electronic component has a plurality of standards and names depending on a terminal extraction direction and a terminal shape. Thus, examples of the electronic component will be described in this embodiment.

The electronic component is completed when the semiconductor device described in any of the above embodiments is combined with components other than the semiconductor device in an assembly process (post-process).

Figure 31A:
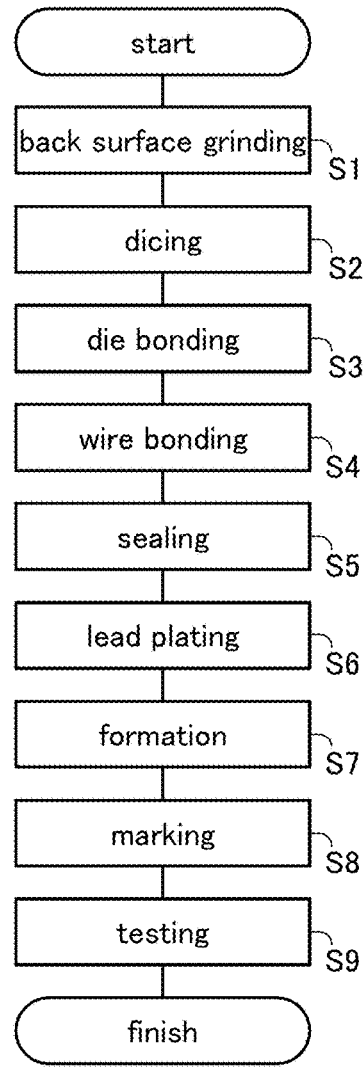
FIG. 31A is a flowchart showing a manufacturing process of an electronic component.

The post-process will be described with reference to a flow chart in FIG. 31A. After an element substrate including the semiconductor device described in any of the above embodiments is completed in a pre-process, a back surface grinding step in which a back surface (a surface where a semiconductor device and the like are not formed) of the element substrate is ground is performed (Step S1). When the element substrate is thinned by grinding, warpage or the like of the element substrate is reduced, so that the size of the electronic component can be reduced.

Next, the element substrate is divided into a plurality of chips (chips 105) in a dicing step (Step S2). Then, the separated chips are individually picked up to be bonded to a lead frame in a die bonding step (Step S3). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy-based resin or the like (Step S5). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating process prevents rust of the lead and facilitates soldering at the time of mounting the chip on a printed wiring board in a later step. Then, the lead is cut and processed in a formation step (Step S7).

Next, a printing (marking) step is performed on a surface of the package (Step S8). After a testing step (Step S9) for checking whether an external shape is good and whether there is malfunction, for example, the electronic component is completed.

The use of the chip 105 including the guard layer 103 and/or the guard layer 203 can prevent or reduce damage due to ESD even after the post-process of the electronic component.

Figure 31B:
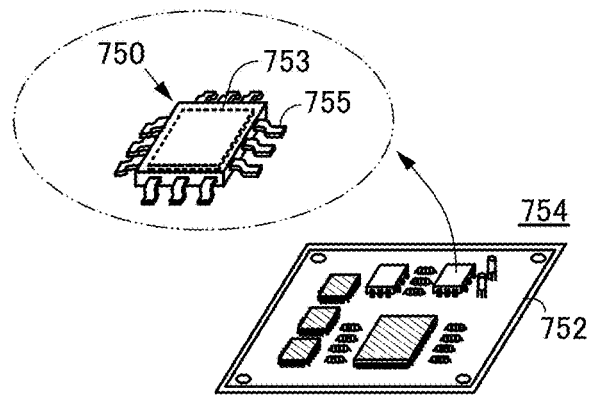
FIG. 31B is a schematic perspective view of the electronic component.

FIG. 31B is a perspective schematic diagram of a completed electronic component. FIG. 31B is a perspective schematic diagram illustrating a quad flat package (QFP) as an example of the electronic component. An electronic component 750 in FIG. 31B includes a lead 755 and a semiconductor device 753. As the semiconductor device 753, the semiconductor device described in any of the above embodiments can be used.

The electronic component 750 in FIG. 31B is mounted on a printed circuit board 752, for example. A plurality of electronic components 750 that are combined and electrically connected to each other over the printed circuit board 752; thus, a circuit board on which the electronic components are mounted (a circuit board 754) is completed. The completed circuit board 754 is provided in an electronic device or the like.

Next, application examples of the electronic components that are used for a driver circuit for driving an inverter, a motor, or the like, which is provided in a vehicle driven with power from a fixed power source (e.g., a bicycle), will be described with reference to FIGS. 32A and 32B.

Figure 32A:
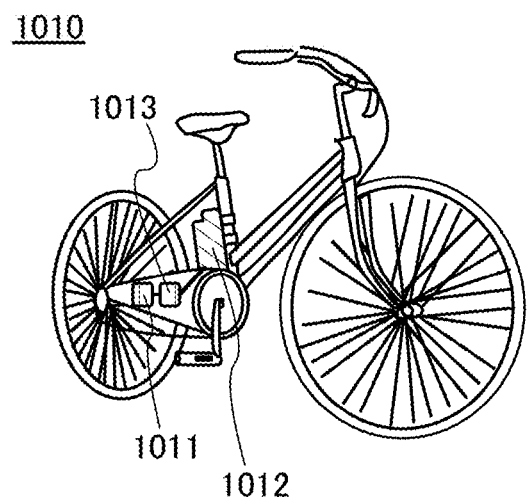
FIGS. 32A and 32B each illustrate one example of an electronic device.

FIG. 32A illustrates an electric bicycle 1010 as an application example. The electric bicycle 1010 obtains power when a current flows through a motor 1011. The electric bicycle 1010 includes a power storage device 1012 for supplying current to the motor 1011 and a driver circuit 1013 for driving the motor. Note that although a pedal is illustrated in FIG. 32A, the pedal is not necessarily provided.

A circuit board provided with an electronic component including the semiconductor device described in any of the above embodiments is incorporated in the driver circuit 1013. Thus, an electric bicycle including a smaller electronic component can be obtained. In addition, a low-power electric bicycle with a long cruising distance can be obtained. Moreover, a highly reliable electric bicycle can be obtained.

Figure 32B:
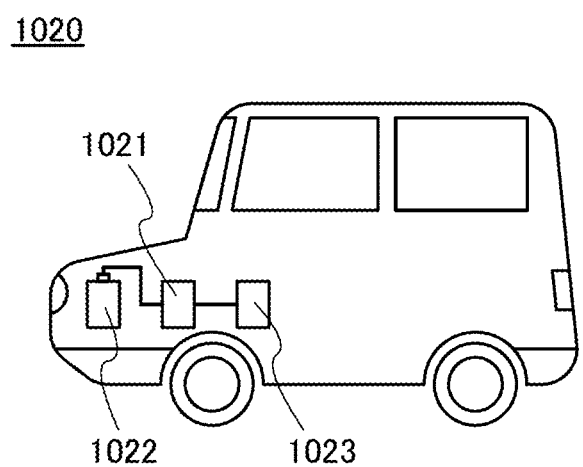

FIG. 32B illustrates an electric car 1020 as another application example. The electric car 1020 obtains power when a current flows through a motor 1021. The electric car 1020 includes a storage battery 1022 for supplying a current to the motor 1021 and a driver circuit 1023 for driving the motor.

A circuit board provided with an electronic component including the semiconductor device described in any of the above embodiments is incorporated in the driver circuit 1023. Thus, a low-power electric car with a long cruising distance can be obtained. Moreover, a highly reliable electric car can be obtained.

An electronic component including the semiconductor device described in any of the above embodiments can be used not only for electric vehicles (EV) but also for hybrid electric vehicles (HEV), plug-in hybrid electric vehicles (PHEV), and the like.

This embodiment can be implemented in combination with the structures described in the other embodiments, as appropriate.

Embodiment 7

Figure 33:
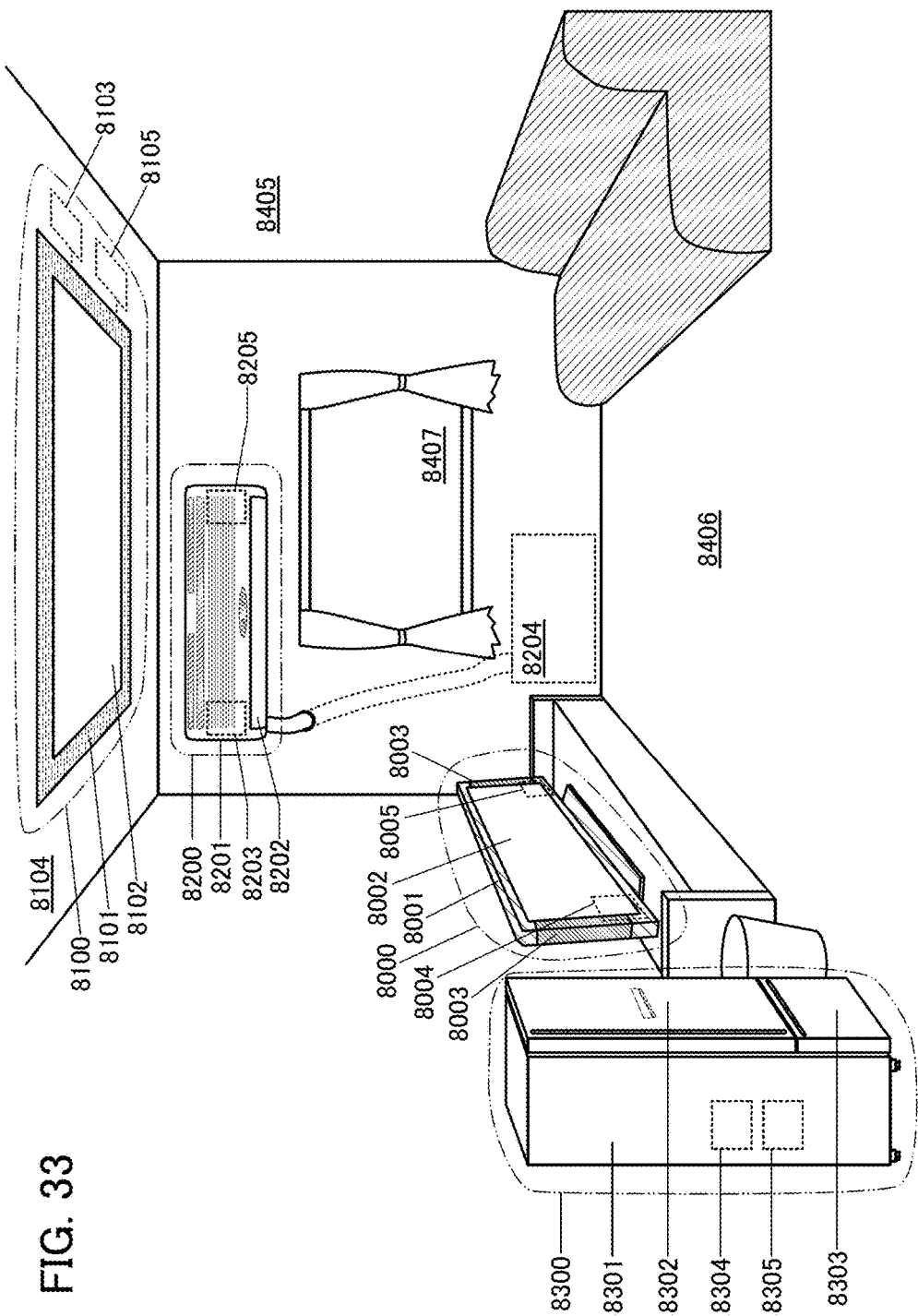
FIG. 33 illustrates examples of electronic devices.

One embodiment of the present invention can be used for a variety of electronic devices. FIG. 33 illustrates specific examples of electronic devices including the semiconductor device of one embodiment of the present invention.

Examples of electronic devices each utilizing the semiconductor device of one embodiment of the present invention are as follows: display devices of televisions, monitors, and the like, lighting devices, desktop personal computers and laptop personal computers, word processors, image reproduction devices which reproduce still images and moving images stored in recording media such as digital versatile discs (DVDs), portable CD players, portable radios, tape recorders, headphone stereos, stereos, table clocks, wall clocks, cordless phone handsets, transceivers, portable wireless devices, mobile phones, car phones, portable game machines, tablet terminals, large-sized game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as a chain saw, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given.

In addition, moving objects driven by electric motors using electric power from the power storage devices are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

FIG. 33 illustrates examples of electronic devices. In FIG. 33, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, and a power storage device 8005. The semiconductor device 8004 of one embodiment of the present invention is provided in the housing 8001. The semiconductor device 8004 can control driving of a cooling fan in the display device 8000, emission luminance adjustment, and the like. The display device 8000 can receive electric power from a commercial power supply. Alternatively, the display device 8000 can use electric power stored in the power storage device 8005.

A display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used for the display portion 8002.

Note that the display device includes, in its category, all of information display devices for personal computers, advertisement displays, and the like besides TV broadcast reception.

In FIG. 33, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 33 illustrates the case where the semiconductor device 8103 is provided in a ceiling 8104 on which the housing 8101 and the light source 8102 are installed, the semiconductor device 8103 may be provided in the housing 8101. The semiconductor device 8103 can control emission luminance or the like of the light source 8102. The lighting device 8100 can receive electric power from a commercial power supply. Alternatively, the lighting device 8100 can use electric power stored in the power storage device.

Note that although the installation lighting device 8100 provided in the ceiling 8104 is illustrated in FIG. 33 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source which emits light artificially by using electric power can be used. Specifically, an incandescent lamp, a discharge lamp such as a fluorescent lamp, and light-emitting elements such as an LED and an organic EL element are given as examples of the artificial light source.

In FIG. 33, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, and a power storage device

8205. Although FIG. 33 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can control operation of a motor used for a compressor in the air conditioner. The air conditioner can receive electric power from a commercial power supply. Alternatively, the air conditioner can use electric power stored in the power storage device 8205.

Note that although the split-type air conditioner including the indoor unit and the outdoor unit is illustrated in FIG. 33 as an example, the semiconductor device of one embodiment of the present invention can be used in an air conditioner in which the functions of an indoor unit and an outdoor unit are integrated in one housing.

In FIG. 33, an electric refrigerator-freezer 8300 is an example of an electronic device including a semiconductor device 8304 of one embodiment of the present invention. Specifically, the electric refrigerator-freezer 8300 includes a housing 8301, a door for a refrigerator 8302, a door for a freezer 8303, the semiconductor device 8304, a power storage device 8305, and the like. The semiconductor device 8304 is provided in the housing 8301 in FIG. 33. The semiconductor device 8304 provided in the housing 8301 can control operation of a motor used for a compressor in the electric refrigerator-freezer 8300. The electric refrigerator-freezer 8300 can receive electric power from a commercial power supply. Alternatively, the electric refrigerator-freezer 8300 can use electric power stored in the power storage device 8305.

Figure 34A:
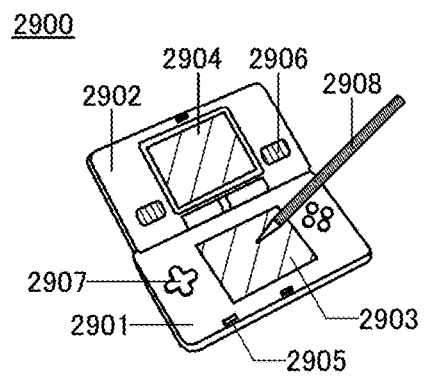
FIGS. 34A to 34H each illustrate an example of an electronic device.

A portable game machine 2900 illustrated in FIG. 34A includes a housing 2901, a housing 2902, a display portion 2903, a display portion 2904, a microphone 2905, a speaker 2906, an operation key 2907, and the like. Although the portable game machine in FIG. 34A has the two display portions 2903 and 2904, the number of display portions is not limited to this. The display portion 2903 is provided with a touch screen as an input device, which can be handled with a stylus 2908 or the like. In the housing 2901, a memory device, a CPU, and the like are provided.

Figure 34B:
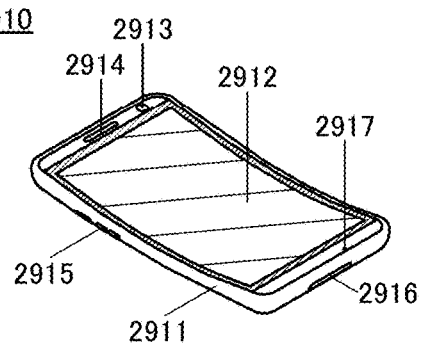

An information terminal 2910 illustrated in FIG. 34B includes a housing 2911, a display portion 2912, a microphone 2917, a speaker portion 2914, a camera 2913, an external connection portion 2916, an operation button 2915, and the like. A display panel and a touch screen that use a flexible substrate are provided in the display portion 2912. In the housing 2911, a memory device, a CPU, and the like are provided. The information terminal 2910 can be used as, for example, a smartphone, a mobile phone, a tablet information terminal, a tablet personal computer, or an e-book reader.

Figure 34C:
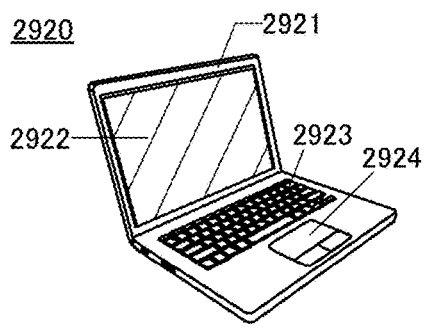

A notebook personal computer 2920 illustrated in FIG. 34C includes a housing 2921, a display portion 2922, a keyboard 2923, a pointing device 2924, and the like. In the housing 2921, a memory device, a CPU, and the like are provided.

Figure 34D:
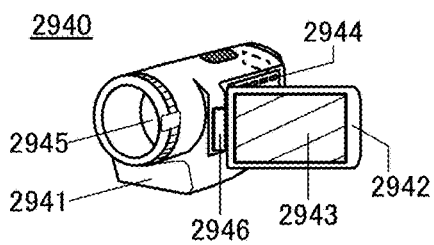

A video camera 2940 illustrated in FIG. 34D includes a housing 2941, a housing 2942, a display portion 2943, operation keys 2944, a lens 2945, a joint 2946, and the like. The operation keys 2944 and the lens 2945 are provided for the housing 2941, and the display portion 2943 is provided for the housing 2942. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942. In the housing 2941, a memory device, a CPU, and the like are provided.

Figure 34E:
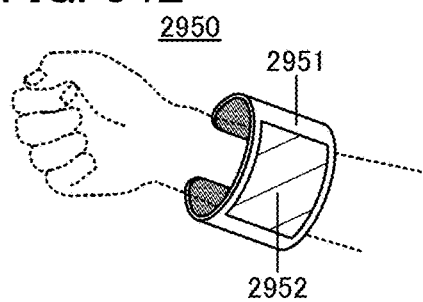

FIG. 34E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight. In the housing 2951, a memory device, a CPU, and the like are provided.

Figure 34F:
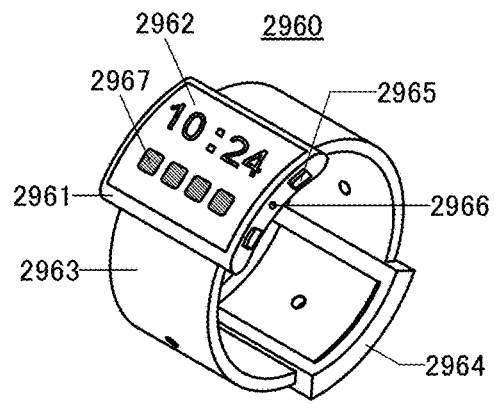

FIG. 34F illustrates an example of a watch-type information terminal. An information terminal 2960 includes a housing 2961, a display portion 2962, a band 2963, a buckle 2964, an operation button 2965, an input output terminal 2966, and the like. In the housing 2961, a memory device, a CPU, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation button 2965, a variety of functions such as time setting, power on/off, on/off of wireless communication, setting and cancellation of a silent mode, and setting and cancellation of a power saving mode can be performed. For example, the functions of the operation button 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input output terminal 2966, and data can be directly transmitted to and received from another information terminal via a connector. In addition, charging via the input output terminal 2966 is possible. Note that the charging operation may be performed by wireless power feeding without using the input output terminal 2966.

Figure 34G:
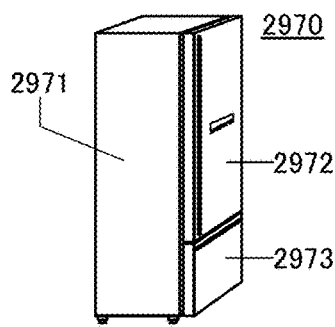

FIG. 34G illustrates an electric refrigerator-freezer as an example of a home electric device. An electric refrigerator-freezer 2970 includes a housing 2971, a refrigerator door 2972, a freezer door 2973, and the like.

Figure 34H:
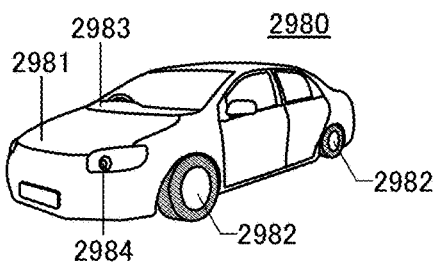

FIG. 34H is an external view illustrating an example of a car. A car 2980 includes a car body 2981, wheels 2982, a dashboard 2983, lights 2984, and the like.

The electronic devices described in this embodiment include any of the above-described transistors, semiconductor devices, or the like.

Decreases in performance and reliability of an electronic device using the semiconductor device of one embodiment due to ESD can be prevented or reduced. One embodiment of the present invention can provide an electronic device with high reliability.

This embodiment can be implemented in combination with the structures described in the other embodiments, as appropriate.

Embodiment 8

In this embodiment, the structure of an oxide semiconductor will be described.

<Structure of Oxide Semiconductor>

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 35A:
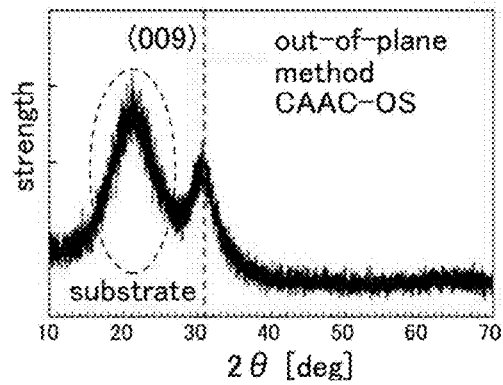
FIGS. 35A to 35E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified as the space group R-3m is analyzed by an out-of-plane method, a peak appears at a diffraction angle ($2\theta$) of around 31° as shown in FIG. 35A. This peak is derived from the (009) plane of the $InGaZnO_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure that is classified into the space group Fd-3m; thus, this peak is preferably not exhibited in a CAAC-OS.

Figure 35B:
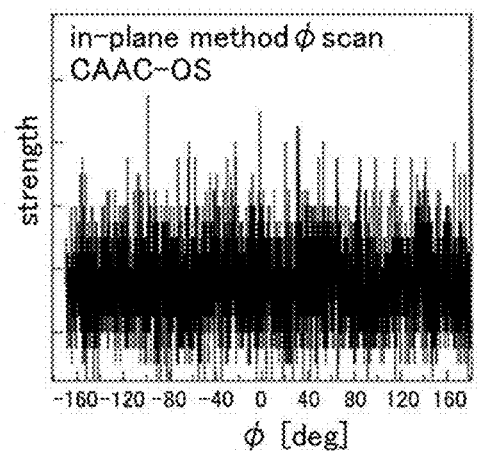
Figure 35C:
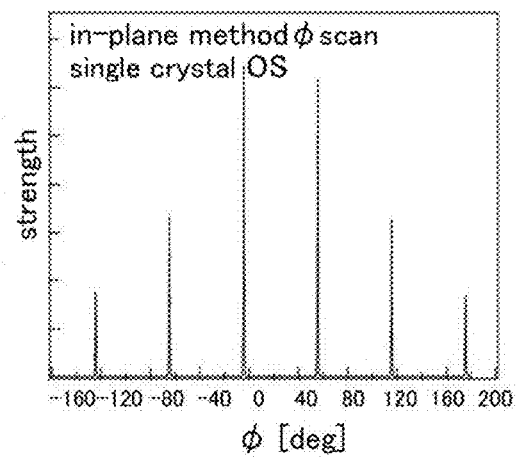

On the other hand, in structural analysis of the CAAC-OS by an in-plane method in which an X-ray is incident on the CAAC-OS in the direction parallel to the formation surface, a peak appears at a $2\theta$ of around 56°. This peak is attributed to the (110) plane of the $InGaZnO_4$ crystal. When analysis ($\phi$ scan) is performed with $2\theta$ fixed at around 56° and with the sample rotated using a normal vector to the sample surface as an axis (0 axis), a peak is not clearly observed as shown in FIG. 35B. In contrast, in the case where single crystal $InGaZnO_4$ is subjected to $\phi$ scan with $2\theta$ fixed at around 56°, six peaks which are derived from crystal planes equivalent to the (110) plane are observed as shown in FIG. 35C. Accordingly, the structural analysis using XRD shows that the directions of a-axes and b-axes are irregularly oriented in the CAAC-OS.

Figure 35D:
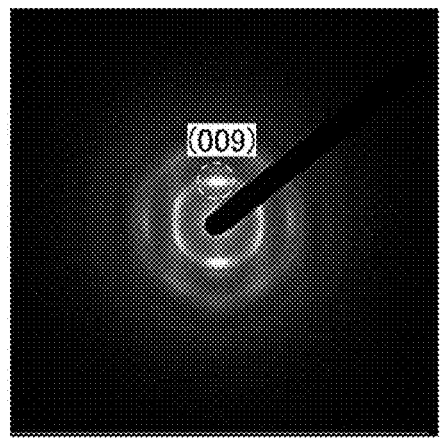
Figure 35E:
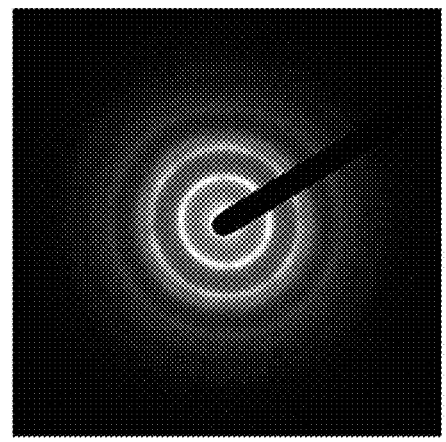

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, such a diffraction pattern (also referred to as a selected-area transmission electron diffraction pattern) as is shown in FIG. 35D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 35E shows a diffraction pattern obtained in such a manner that an electron beam with a probe diameter of 300 nm is incident on the same sample in the direction perpendicular to the sample surface. As shown in FIG. 35E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 35E is considered to be derived from the (010) plane, the (100) plane, and the like of the $InGaZnO_4$ crystal. The second ring in FIG. 35E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 36A:
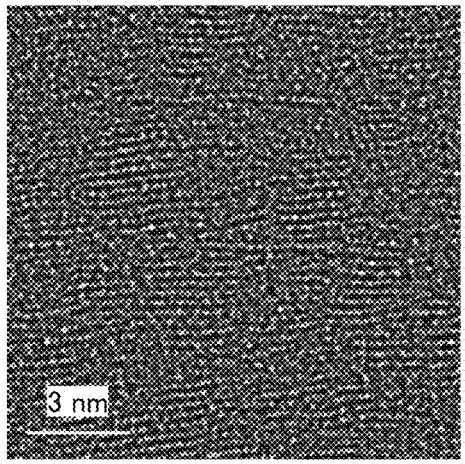
FIGS. 36A to 36E show a cross-sectional TEM image and plan-view TEM images of a CAAC-OS and images obtained through analysis thereof.

FIG. 36A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 36A shows pellets in which metal atoms are arranged in a layered manner. FIG. 36A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 36B:
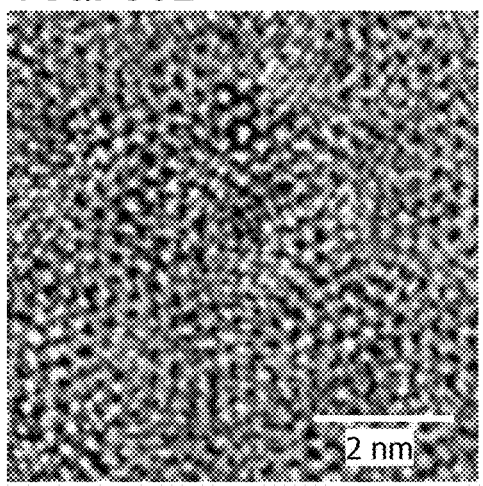
Figure 36C:
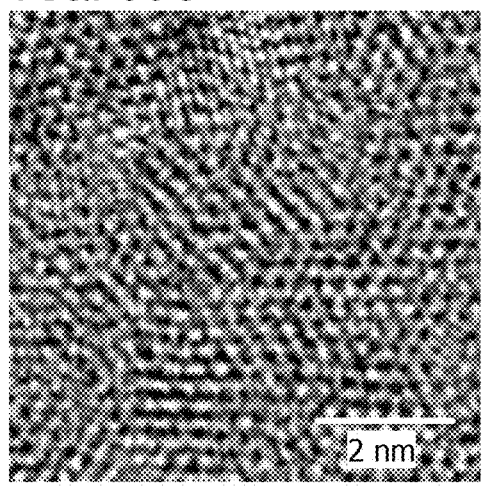
Figure 36D:
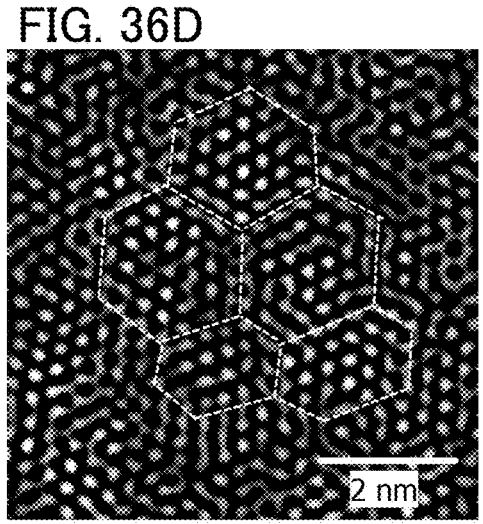
Figure 36E:
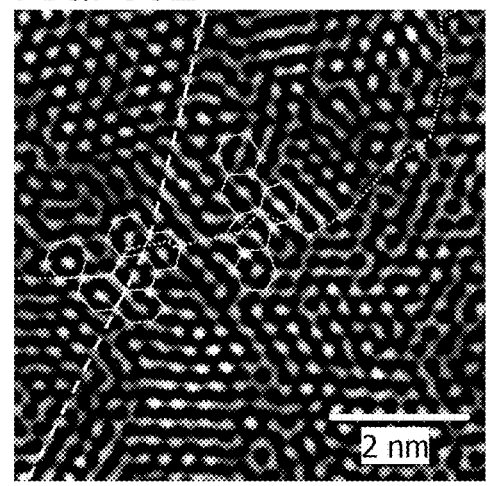

FIGS. 36B and 36C show Cs-corrected high-resolution TEM images of a plane of the CAAC-OS observed from the direction substantially perpendicular to the sample surface. FIGS. 36D and 36E are images obtained through image processing of FIGS. 36B and 36C. The method of image processing is as follows. The image in FIG. 36B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 36D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 36E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of atomic arrangement in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}$/cm$^3$, prefer- ably lower than $1 \times 10^{11}$/cm$^3$, more preferably lower than $1 \times 10^{10}$/cm$^3$, and is higher than or equal to $1 \times 10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 37A:
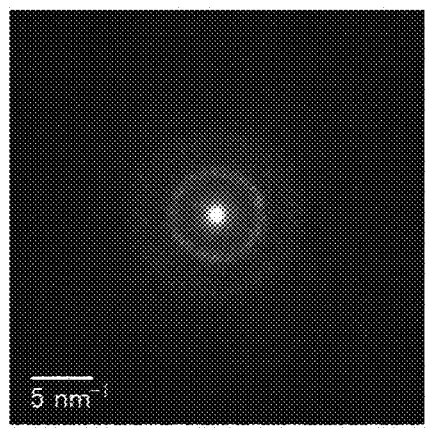
FIGS. 37A to 37D show electron diffraction patterns and a cross-sectional TEM image of an nc-OS.
Figure 37B:
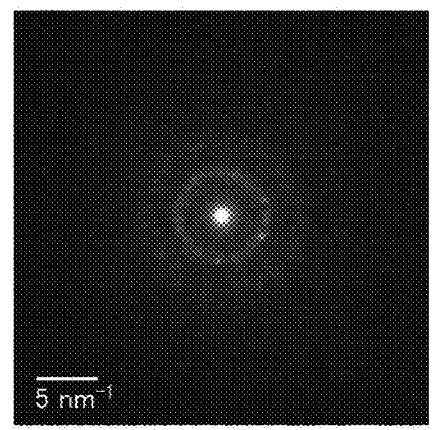

For example, when an electron beam with a probe diameter of 50 nm is incident on a 34-nm-thick region of thinned nc-OS including an InGaZnO$_4$ crystal in the direction parallel to the formation surface, a ring-shaped diffraction pattern (a nanobeam electron diffraction pattern) shown in FIG. 37A is observed. FIG. 37B shows a diffraction pattern obtained when an electron beam with a probe diameter of 1 nm is incident on the same sample. As shown in FIG. 37B, a plurality of spots are observed in a ring-like region. In other words, ordering in an nc-OS is not observed with an electron beam with a probe diameter of 50 nm but is observed with an electron beam with a probe diameter of 1 nm.

Figure 37C:
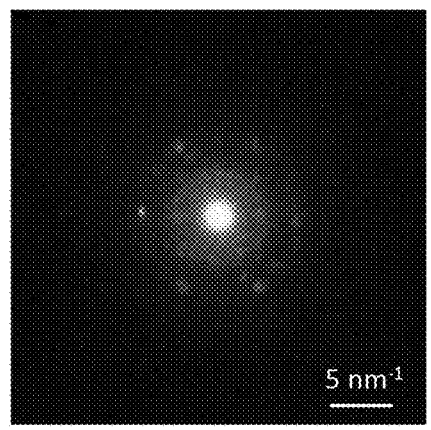

Furthermore, an electron diffraction pattern in which spots are arranged in an approximately regular hexagonal shape is observed in some cases as shown in FIG. 37C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 37D:
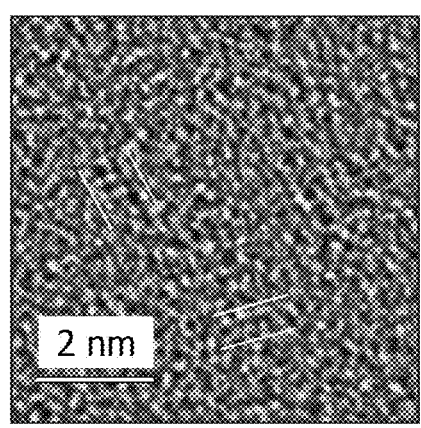

FIG. 37D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 37D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor (fine microcrystalline oxide semiconductor). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 38A:
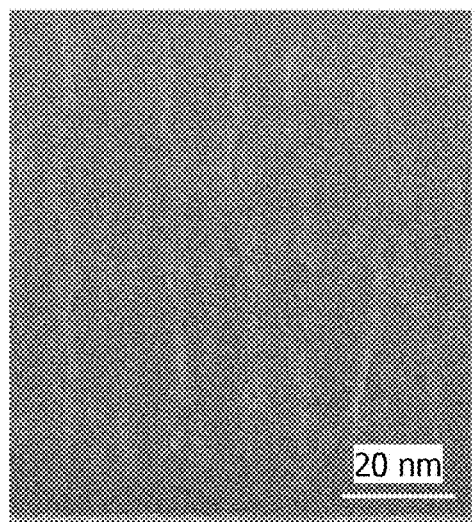
FIGS. 38A and 38B show cross-sectional TEM images of an a-like OS.
Figure 38B:
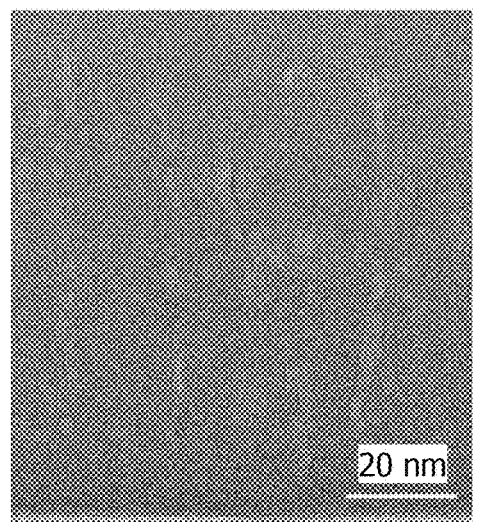

FIGS. 38A and 38B are high-resolution cross-sectional TEM images of an a-like OS. FIG. 38A is the high-resolution cross-sectional TEM image of the a-like OS at the start of the electron irradiation. FIG. 38B is the high-resolution cross-sectional TEM image of the a-like OS after the electron ($e^-$) irradiation at $4.3\times10^8$ $e^-/nm^2$. FIGS. 38A and 38B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 39:
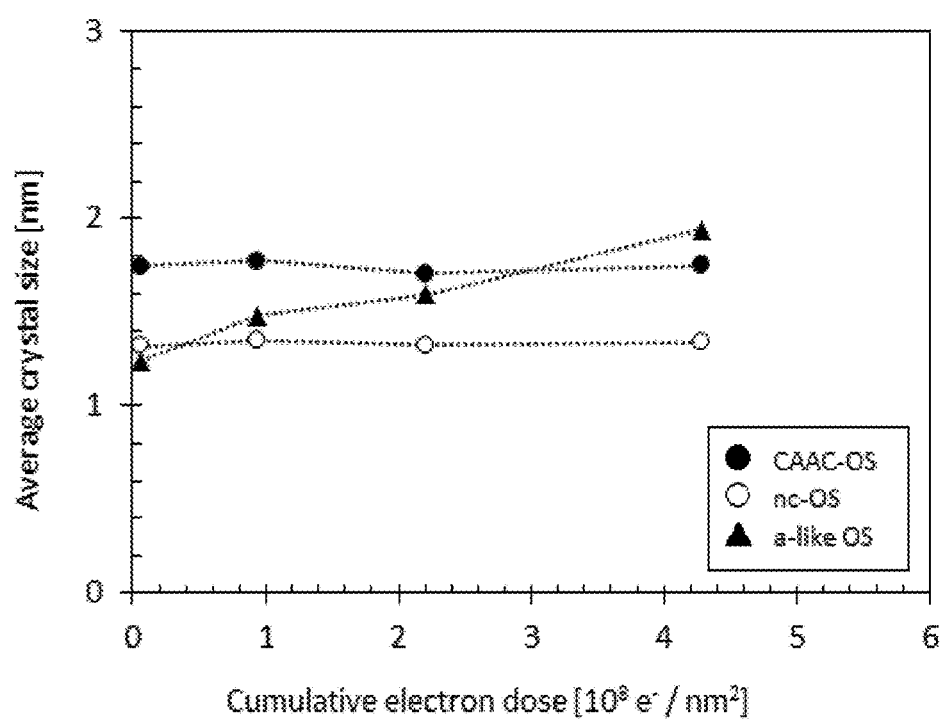
FIG. 39 is a graph showing changes in a crystal part of an In—Ga—Zn oxide induced by electron irradiation.

FIG. 39 shows change in the average size of crystal parts (at 22 points to 30 points) in each sample. Note that the crystal part size corresponds to the length of a lattice fringe. FIG. 39 indicates that the crystal part size in the a-like OS increases with an increase in the cumulative electron dose in obtaining TEM images, for example. As shown in FIG. 39, a crystal part of approximately 1.2 nm (also referred to as an initial nucleus) at the start of TEM observation grows to a size of approximately 1.9 nm at a cumulative electron (e) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 39, the average size of crystal parts in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is $6.7\times10^5$ $e^-/(nm^2 \cdot s)$; and the diameter of irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

This embodiment can be implemented in combination with any of the other embodiments as appropriate.

This application is based on Japanese Patent Application serial no. 2015-171051 filed with Japan Patent Office on Aug. 31, 2015 and Japanese Patent Application serial no. 2015-215828 filed with Japan Patent Office on Nov. 2, 2015, the entire contents of which are hereby incorporated by reference.

What is claimed is:
1. A semiconductor device comprising:
a circuit region; and
a first layer,
wherein the circuit region is surrounded by the first layer, and
wherein a band gap of the first layer is greater than or equal to 2.5 eV and less than or equal to 4.2 eV.

2. The semiconductor device according to claim 1, wherein the first layer comprises an oxide semiconductor.

3. The semiconductor device according to claim 1, wherein the circuit region includes a first transistor.

4. The semiconductor device according to claim 3, wherein the first layer and a semiconductor layer included in the first transistor are in contact with a second layer.

5. The semiconductor device according to claim 4, wherein the circuit region includes a second transistor, and
wherein a band gap of the semiconductor layer of the first transistor is different from a band gap of a semiconductor layer of the second transistor.

6. An electronic device comprising:
the semiconductor device according to claim 1; and
a display portion, a power storage device, an operation key, a microphone, or a speaker.

7. A semiconductor device comprising:
a transistor; and
a first layer,
wherein the transistor is surrounded by the first layer, and
wherein a band gap of the first layer is greater than or equal to 2.5 eV and less than or equal to 4.2 eV.

8. The semiconductor device according to claim 7, wherein the first layer comprises an oxide semiconductor.

9. The semiconductor device according to claim 7, wherein the first layer and a semiconductor layer included in the transistor are in contact with a second layer.

10. An electronic device comprising:
the semiconductor device according to claim 7; and
a display portion, a power storage device, an operation key, a microphone, or a speaker.

11. A semiconductor device comprising:
a circuit region; and
an oxide semiconductor layer,
wherein the circuit region is surrounded by the oxide semiconductor layer, and
wherein a band gap of the oxide semiconductor layer is greater than or equal to 2.5 eV and less than or equal to 4.2 eV.

12. The semiconductor device according to claim 11, wherein the circuit region includes a first transistor.

13. The semiconductor device according to claim 12, wherein the oxide semiconductor layer and a semiconductor layer included in the first transistor are in contact with a first layer.

14. The semiconductor device according to claim 13, wherein the circuit region includes a second transistor, and
wherein a band gap of the semiconductor layer of the first transistor is different from a band gap of a semiconductor layer of the second transistor.

15. An electronic device comprising:
the semiconductor device according to claim 11; and
a display portion, a power storage device, an operation key, a microphone, or a speaker.

* * * * *